United States Patent
Kambe et al.

(10) Patent No.: US 7,955,718 B2
(45) Date of Patent: Jun. 7, 2011

(54) ORGANIC EL ELEMENT AND PROCESS FOR MANUFACTURE OF ORGANIC EL ELEMENT

(75) Inventors: Emiko Kambe, Atsugi (JP); Tetsushi Inoue, Tokyo (JP)

(73) Assignee: TDK Corporation, Tokyo (JP)

( * ) Notice: Subject to any disclaimer, the term of this patent is extended or adjusted under 35 U.S.C. 154(b) by 443 days.

(21) Appl. No.: 11/288,153

(22) Filed: Nov. 29, 2005

(65) Prior Publication Data

US 2006/0115681 A1 Jun. 1, 2006

(30) Foreign Application Priority Data

Nov. 30, 2004 (JP) ................. P2004-347843

(51) Int. Cl.
*H01L 51/50* (2006.01)

(52) U.S. Cl. ........ 428/690; 428/917; 313/504; 313/506; 427/66

(58) Field of Classification Search ............... 313/504, 313/506

See application file for complete search history.

(56) References Cited

U.S. PATENT DOCUMENTS

| | | | |
|---|---|---|---|
| 5,853,905 A | | 12/1998 | So et al. |
| 6,248,457 B1 * | | 6/2001 | Chen et al. .................... 428/690 |
| 6,344,285 B1 * | | 2/2002 | Kwon et al. .................... 428/690 |
| 7,070,867 B2 * | | 7/2006 | Thompson et al. ........... 428/690 |
| 7,157,142 B2 * | | 1/2007 | Tateishi et al. ............ 428/411.1 |
| 7,229,704 B2 * | | 6/2007 | Seki et al. ...................... 428/690 |
| 2001/0051284 A1 * | | 12/2001 | Ueda et al. .................... 428/690 |
| 2005/0129979 A1 * | | 6/2005 | Kambe et al. ................. 428/690 |
| 2006/0040137 A1 * | | 2/2006 | Kambe et al. ................. 428/690 |

FOREIGN PATENT DOCUMENTS

JP      A 05-3080       1/1993
WO      WO 2005020642   * 3/2005

* cited by examiner

*Primary Examiner* — Dawn L Garrett
(74) *Attorney, Agent, or Firm* — Oliff & Berridge, PLC

(57) ABSTRACT

The organic EL element of the invention which achieves the aforementioned object is provided with a base, first and second electrode layers situated facing each other on one side of the base, and a luminescent layer situated between the electrode layers, wherein one of the first electrode layer and the second electrode layer is a hole injection electrode layer while the other is an electron injection electrode layer, an organic thin-film layer made of a vapor depositable polar organic compound with an energy gap of 3.5 eV or greater is provided between the luminescent layer and the electron injection electrode layer, and the organic thin-film layer has a thickness of 0.1 nm-4 nm.

13 Claims, 3 Drawing Sheets

ORGANIC EL ELEMENT AND PROCESS FOR MANUFACTURE OF ORGANIC EL ELEMENT

BACKGROUND OF THE INVENTION

1. Field of the Invention

The present invention relates to an organic EL (electroluminescence) element and to a process for manufacture of the organic EL element.

2. Related Background Art

The announcement by Kodak Corp. of a laminated organic EL element having an organic layer formed by vacuum vapor deposition using a low molecular compound eventually led to energetic development of organic EL displays, many of which are currently being implemented.

At the same time, further improvements are being researched for the characteristics of organic EL elements. Conventional organic EL elements are generally known which employ materials with electron transport capacity, such as aluminoquinolinol complexes, in the luminescent layers, electron transfer layers and electron injection layers. However, despite the high luminescent brightness of such organic EL elements, the luminescent efficiency has not been satisfactory in all cases. Insufficient luminescent efficiency requires an increased driving voltage for light emission, thus resulting in a reduced usable life of the organic EL element.

In order to provide organic EL elements which uniformly emit light at high efficiency, there have been proposed organic EL elements having an insulating metal oxide with an energy gap of 4.0 eV or greater inserted between the luminescent layer and negative electrode, for instance (for example, see Japanese Unexamined Patent Publication HEX No. 5-3080). For improved high efficiency and usable life, there have been proposed organic EL elements provided with an insulating layer between the luminescent layer and the positive and negative electrodes (for example, see U.S. Pat. No. 5,853,905).

SUMMARY OF THE INVENTION

Nevertheless, with the increasing levels of demand for the element characteristics of organic EL elements, even the aforementioned conventional organic EL elements leave much to be desired in terms of satisfying high levels of brightness, luminescent efficiency and usable life. In particular, conventional organic EL elements do not have sufficient usable life, and hence the element characteristics such as luminescent brightness and luminescent efficiency are impaired within a relatively short period of use.

The present invention has been accomplished in light of these problems of the prior art, and its object is to provide a long-usable-life organic EL element with sufficiently excellent luminescent brightness and luminescent efficiency, which can maintain a high level of such element characteristics for long periods, as well as a process for its manufacture.

As a result of much diligent research directed toward achieving the aforestated object, the present inventors have discovered that the aforementioned problems can be overcome by providing an organic thin-film layer composed of a specific organic compound to a specific thickness between the luminescent layer and electron injection electrode layer of an organic EL element, and have thereupon completed the present invention.

Specifically, the organic EL element of the invention is characterized by being an organic EL element provided with a base, first and second electrode layers sit facing each other on one side of the base, and a luminescent layer situated between the electrode layers, wherein one of the first electrode layer and the second electrode layer is a hole injection electrode layer while the other is an electron injection electrode layer, an organic thin-film layer made of a vapor depositable polar organic compound with an energy gap of 3.5 eV or greater is provided between the luminescent layer and the electron injection electrode layer, and the organic thin-film layer has a thickness of 0.1 nm-4 nm.

Here, "energy gap" is the value of the energy difference between the HOMO level and the LUMO level, or between the valence band and the conduction band. The "thickness of the organic thin-film layer" may be measured by a direct measurement method with a stylus profilometer, ellipsometer, cross-sectional TEM, AFM, STM or the like, or calculated from optical absorption or crystal resonator weight change, etc.

The organic EL element of the invention having this construction is capable of maintaining a high level of element characteristics such as luminescent brightness and luminescent efficiency for long periods, thereby allowing an organic EL element with a long usable life to be effectively realized. Although the reason for this effect by the organic EL element of the invention has not been fully elucidated, the present inventors have conjectured as follows.

It is believed that when an organic thin-film layer satisfying the conditions mentioned above is provided, the organic thin-film layer functions as a blocking layer against holes while simultaneously exhibiting an adequate electron injection property, thereby allowing an injection balance between electrons and holes. Furthermore, the probability of rebonding between holes and electrons in the luminescent layer is increased, so that an organic EL element with adequately high luminescent efficiency and usable life can be obtained.

Since the aforementioned organic thin-film layer of the organic EL element of the invention can be formed by vapor deposition, it is possible to prevent the corrosion of the luminescent layer and consequent loss of luminescence that occurs in coating film formation methods using solvents, thereby allowing a greater degree of freedom of the element design. In addition, it is possible to adequately inhibit deterioration of the element caused by residual solvent during coating.

Also, a layer composed of at least one type of metal or compound selected from the group consisting of alkali metals, alkaline earth metals, rare earth metals and compounds of these metals is preferably flier provided between the organic thin-film layer and the electron injection electrode layer in the organic EL element of the invention.

Providing such a layer will promote electron injection and allow further improvement in the luminescent brightness, luminescent efficiency and usable life.

In the organic EL element of the invention, the electron injection electrode layer preferably comprises a layer composed of at least one type of substance selected from the group consisting of alkali metals, alkaline earth metals, rare earth metals and compounds of these metals, formed on the side nearest the organic thin-film layer.

If the electron injection electrode layer has such a layer on the side nearest the organic thin-film layer, electron injection can be accelerated and the luminescent brightness, luminescent efficiency and usable life can be further improved.

In the organic EL element of the invention, the electron injection electrode layer also preferably comprises a first electron injection electrode layer formed on the side nearest the organic thin-film layer and a second electron injection electrode layer formed on the side furthest from the organic thin-film layer, wherein the first electron injection electrode layer is composed of at least one type of substance selected from the group consisting of alkali metals, alkaline earth metals, rare each metals and compounds of these metals, and the second electron injection electrode layer comprises Al, Ag, In, Ti, Cu, Au, Mo, W, Pt, Pd, Ni or an alloy of these metals.

In an organic EL element having this type of electron injection electrode layer, adjacency of the organic thin-film layer and the first electron injection electrode layer allows the organic thin-film layer to improve the adhesion of the first electron injection electrode layer, while the second electron injection electrode layer functions as a protective layer so that peeling and similar problems can be more reliably prevented even when the fist electron injection electrode layer thickness if further reduced, thereby permitting higher luminescent efficiency and a longer usable life to be achieved.

The film thickness of the first electron injection electrode layer is preferably 0.01 nm-2 nm. By thinly forming the first electron injection electrode layer in this thickness range, it is possible to enhance the electron injection capacity into the luminescent layer to a higher level, in order to allow reduced driving voltage and improved luminescent brightness. It is thereby possible to realize an organic EL element having even higher luminescent efficiency.

Also, the polar organic compound preferably includes a crown ether, cyclophane, triazine, calixarene, polyether or heterocyclic ring-containing compound. Providing such an organic thin-film layer will allow more reliable improvement in the luminescent brightness, luminescent efficiency and usable life of the organic EL element. The above reference to a crown ether, cyclophane, triazine, calixarene, polyether or heterocyclic ring-containing compound also includes their derivatives.

The polar organic compound also preferably includes one or more of the following organic compounds (a) to (c) having a molecular weight or weight-average molecular weight of no greater than 2000.

(a) Polymers or copolymers of compounds selected from the group consisting of vinylpyridine, (meth)acrylic acid, N-alkylacrylamide, N,N-dialkylacrylamide, hydroxy(meth)acrylate, vinyl acetate, styrene and N-vinylpyrrolidone, or compounds comprising them as skeletal units.

(b) Oxyalkylene polymers or copolymers with C2-4 alkyl groups, or compounds comprising them as skeletal units.

(c) Polyoxazoline, polyvinylbutyral or compounds comprising them as skeletal units.

Providing such an organic thin-film layer will allow more reliable improvement in the luminescent brightness, luminescent efficiency and usable life of the organic EL element. The molecular weight or weight-average molecular weight of the organic compound refers to the value obtained by mass spectrometry (MASS), gel permeation chromatography (GPC) or the like.

Furthermore, the energy gap of said polar organic compound is preferably 3.8 eV or greater. By providing an organic thin-film layer composed of such a polar organic compound with an energy gap of 3.8 eV or greater, it is possible to effectively realize a long-usable-life organic EL element which can reliably maintain a high level of element characteristics such as luminescent brightness and luminescent efficiency for long periods.

The process for manufacture of an organic EL element according to the invention is a process for manufacture of an organic EL element provided with a base, first and second electrode layers situated facing each other on one side of the base and a luminescent layer situated between the electrode layers, wherein one of the first electrode layer and the second electrode layer is a hole injection electrode layer while the other is an electron injection electrode layer, and an organic thin-film layer is provided between the luminescent layer and the electron injection electrode layer, the process comprising an organic thin-film layer-forming step in which the organic thin-film layer is formed by producing a film of a vapor depositable polar organic compound with an energy gap of 3.5 eV or greater to a film-thickness of 0.1 nm-4 nm.

The process for manufacture of an organic EL element according to the invention can easily and reliably yield an organic EL element of the invention as described above.

In the organic thin-film layer-forming step, the organic thin-film layer is preferably formed by vacuum vapor deposition of the polar organic compound on the luminescent layer or on the electron injection electrode layer. When the organic thin-film layer is formed by vacuum vapor deposition, more excellent control of the film thickness can be achieved and fewer impurities are included, thereby allowing easier and more reliable formation of a high-purity organic thin-film layer with a uniform film thickness. This can further improve the luminescent brightness, luminescent efficiency and usable life of the organic EL element of the invention. If the organic thin-film layer is formed on the luminescent layer, hole blocking can be accomplished more effectively, thus promoting electron injection into the luminescent layer and permitting easier and more reliable reduction of the driving voltage of the obtained organic EL element. If the organic thin-film layer is formed on the electron injection electrode layer, adhesion between the organic thin-film layer and the electron injection electrode layer can be further enhanced, thereby permitting the thickness of the electron injection electrode layer to be reduced. This will flier increase the efficiency and usable life of the resulting organic EL element.

According to the present invention it is possible to provide a long-usable-life organic EL element having sufficiently excellent luminescent brightness and luminescent efficiency and maintaining a high level of these element characteristics for a long period of time, as well as a process for its manufacture.

EXPLANATION OF SYMBOLS 1,2,3 Organic EL element 10 base, 12 first electrode layer, 16 organic thin-film layer, 18 second electrode layer, 20 luminescent layer, 20a first luminescent layer, 20b second luminescent layer, 22 electron transport layer, 24 hole injection layer, 26 hole transport layer, 28 first electron injection electrode layer, 30 second electron injection electrode layer.

DESCRIPTION OF THE PREFERRED EMBODIMENTS

Preferred embodiments of the invention will now be explained in detail with reference to the accompanying drawings as necessary.

First, a preferred embodiment of an organic EL element of the invention will be explained in detail with reference to FIG.

Figure 1:
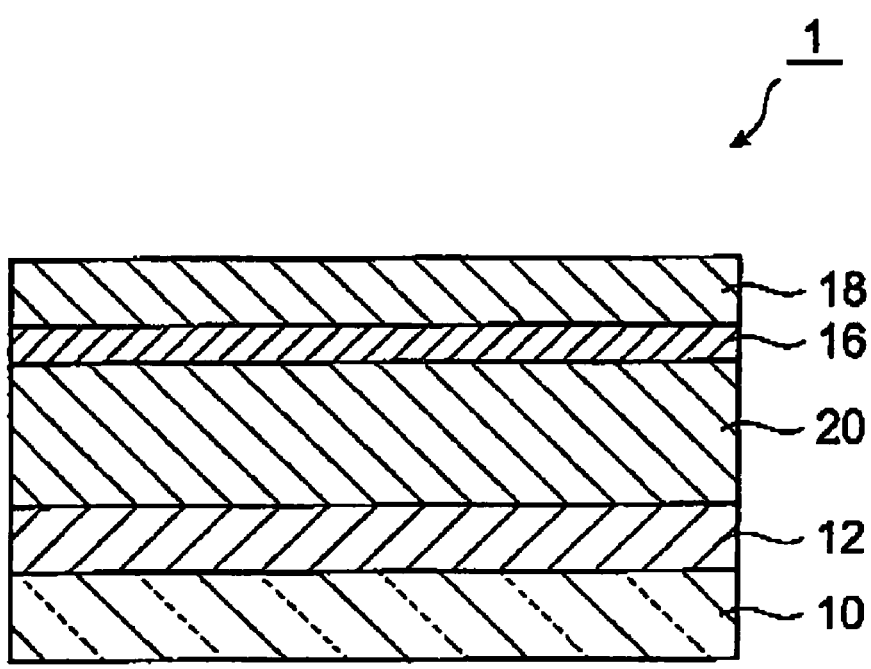
FIG. 1 is a schematic cross-sectional view showing a first embodiment of an organic EL element of the invention.

1. FIG. 1 is a schematic cross-sectional view showing a first embodiment of an organic EL element of the invention.

The organic EL element 1 of this embodiment is provided with a base 10, a first electrode layer 12 formed on one side of the base 10, a luminescent layer 20 formed on the first electrode layer 12, an organic thin-film layer 16 formed on the luminescent layer 20 and a second electrode layer 18 formed on the organic thin-film layer 16, wherein the first electrode layer 12 is a hole injection electrode layer and the second electrode layer 18 is an electron injection electrode layer.

The organic El element 1 of this embodiment having the construction described above has sufficiently excellent luminescent brightness and luminescent efficiency and can maintain a high level of these element characteristics for a long period of time. The present inventors believe that the reason for this effect of the organic EL element 1 is as follows. That is, it is thought that the organic thin-film layer 16 composed of the polar organic compound satisfying the aforementioned conditions functions as a blocking layer against holes while simultaneously exhibiting an adequate electron injection property, thereby allowing an injection balance to be achieved between electrons and holes. Furthermore, the probability of rebonding between holes and electrons in the luminescent layer is increased, so that an organic EL element with adequately high luminescent efficiency and usable life can be obtained.

In addition, in the organic EL element 1 having the organic thin-film layer 16 provided on the luminescent layer 20, hole blocking can be accomplished more effectively, thus promoting electron injection into the luminescent layer 20 and permitting easier and more reliable reduction of the driving voltage. Furthermore, since the organic thin-film layer 16 composed of a polar organic compound has excellent adhesion with the electron injection electrode layer, adhesion of the electron injection electrode layer to the organic EL element is adequately ensured and the thickness of the electron injection electrode layer can be reduced. This allows the organic EL element 1 to be designed with even higher efficiency and a longer usable life.

(Base)

The base 10 may be an amorphous base (for example, glass, quartz or the like) or a crystalline base (for example, Si, GaAs, ZnSe, ZnS, GaP, InP or the like), or it may be a crystalline base having a crystalline, amorphous or metal buffer layer formed thereon. As metal bases there may be used Mo, Al, Pt, Ir, Au, Pd or the like. Resin film bases (for example, polyethylene terephthalate) may also be used.

When the base 10 is on the light emitting side, it is preferred to use a transparent base such as glass or quartz, and an inexpensive glass transparent base is particularly preferred. The transparent base may also be provided with color filter film or a fluorescent substance-containing color-modifying film, or a dielectric reflecting film, for adjustment of colored light.

(Hole Injection Electrode Layer)

The material used for the hole injection electrode (positive electrode) layer 12 as the first electrode layer is preferably one which allows efficient injection of holes into the luminescent layer, and a substance with a work function of 4.5 eV-5.5 eV is preferred. Specifically, it is preferably a transparent conductive film composed mainly of tin-doped indium oxide (ITO), zinc-doped indium oxide (IZO), indium oxide ($In_2O_3$), tin oxide ($SnO_2$) or zinc oxide (ZnO).

These oxides may deviate somewhat from stoichiometric compositions. The mixing ratio for $SnO_2$ with respect to $In_2O_3$ in ITO is preferably 1-20 wt %, and more preferably 5-12 wt %. The mixing ratio of ZnO with respect to $In_2O_3$ in IZO is normally about 12-32 wt %. The hole injection electrode layer 12 may also contain silica ($SiO_2$) for adjustment of the work function. The $SiO_2$ content is preferably about 0.5-10 mole percent with respect to the ITO. Adding $SiO_2$ will tend to increase the work function.

The electrode layer on the light emitting side, not being limited to the hole injection electrode layer, preferably has a light transmittance at 400-700 nm as the luminescent wavelength region of an organic EL element, and in particular a light transmittance, at the wavelength of each RGB color, of 50% or greater, more preferably 80% or greater and even more preferably 90% or greater. If the light transmittance is less than 50%, the light emission itself from the luminescent layer will be attenuated, tending to complicate efforts to achieve the necessary brightness as a luminescent element.

The in thickness of the hole injection electrode layer 12 is preferably determined in consideration of the light transmittance mentioned above, since it is the electrode layer on the light emitting side. For example, when an oxide transparent conductive film is used, the film thickness is preferably 50-500 nm and more preferably 50-300 nm. If the film thickness of the hole injection electrode layer 12 is greater than 500 nm, the light transmittance will tend to be insufficient and the hole injection electrode layer 12 will tend to peel from the base 10. Although the light transmittance increases with reduced film thickness, a film thickness of less than 50 nm will tend to lower the hole injection efficiency into the luminescent layer 20, and also reduce the film strength.

(Electron Injection Electrode Layer)

The material used for the electron injection electrode (negative electrode) layer 18 as the second electrode layer is not particularly restricted because it does not require a relatively low work function due to the effect of the organic thin-film layer 16 described hereunder. Thus, it is possible to use metals which have relatively low work functions, including alkali metals such as Li, Na, K and Cs, alkaline earth metals such as Mg, Ca, Sr and Ba, alkali halides such as LiF and CsI, oxides such as $Li_2O$, and metals having properties similar to alkali metals or alkaline earth metals, such as La, Ce, Sn, Zn and Zr, as well as metals which have relatively high work functions, including Al, Ag, In, Ti Cu, Au, Mo, W, Pt, Pd and Ni, or alloys of these metals, or alloys of these metals with other metals. Any one of these, or a combination of two or more, may be used.

LiF is preferred among these compounds for use in the electron injection electrode layer 18, from the standpoint of effectively exhibiting the function of the organic thin-film layer 16 described hereunder. Using LiF for the electron injection electrode layer 18 will tend to achieve even more excellent luminescent brightness, luminescent efficiency and usable life.

The film thickness of the electron injection electrode layer 18 is not particularly restricted so long as it allows electron injection into the luminescent layer 20, and in the case of an alkali metal or alkaline earth metal, it is preferably 0.1 nm-100 nm and more preferably 1.0 nm-50 nm. The film thickness in the case of an alkali halide or an oxide such as $Li_2O$ is preferably as small as possible from the viewpoint of electron injection capacity into the luminescent layer 20, and specifically it is preferably no greater than 10 nm and more preferably no greater than 1 nm.

Also, the organic EL element of this embodiment preferably has a multilayer construction for the electron injection electrode layer 18 from the standpoint of further improving the luminescent brightness, luminescent efficiency and usable life. For example, when the electron injection electrode layer 18 has a bilayer structure, the layer on the side of the organic thin-film layer 16 may be the first electron injection electrode layer and the layer on the side opposite the organic thin-film layer 16 may be the second electron injection layer (hereinafter, sometimes the first electron injection electrode layer will be referred to as "electron injection electrode layer", and the second electron injection electrode layer as "protective electrode layer"). In this case, the material used for the first electron injection electrode layer is preferably at least one type of metal or compound selected from the group consisting of the aforementioned alkali metals, the aforementioned alkaline earth metals, rare earth metals such as Yb, La, Er, Sm or Ce, and compounds of these metals. As metal compounds there may be mentioned alkali metal halides such as LiF and CsI, alkali metal oxides such as $Li_2O$, and alkaline earth metal halides and oxides such as MgO, $MgF_2$, CaO, $CaF_2$ and BaO. According to this embodiment, it is preferred to use LiF or $Li_2O$ as the constituent material of the first electron injection electrode layer from the standpoint of achieving higher levels of luminescent brightness, luminescent efficiency and usable life. The material used for the second electron injection electrode layer (protective electrode layer) is preferably Al Ag, In, Ti, Cu, Au, Mo, W, Pt, Pd and Ni, or alloys of these metals, or alloys of these metals with other metals.

In the embodiment described above, the organic thin-film layer composed of a polar organic compound improves adhesion of the first electron injection electrode layer as the inorganic compound thin-film layer, while the second electron injection electrode layer functions as a protective layer to adequately prevent problems such as peeling even when the thickness of the first electron injection electrode layer is further reduced, thereby making it possible to obtain an organic EL element having higher luminescent efficiency and a longer usable life.

The film thickness of the first electron injection electrode layer is preferably 0.01 nm-10 nm, and more preferably 0.01 nm-5 nm and most preferably 0.01 nm-1 nm. Also, the total thickness of the organic thin-film layer and the first electron injection electrode layer is preferably no greater than 5 nm. The film thickness of the second electron injection electrode layer is preferably 5 nm-1000 nm, and more preferably 50 nm-1000 nm.

(Luminescent Layer)

The luminescent material used for the luminescent layer 20 may be, for example, a low molecular luminescent material such as an organic metal chelate or fluorescent pigment (luminous low molecular compound), or a high molecular luminescent material such as a π-conjugated high molecular compound or molecular dispersion high molecular compound (a high molecular compound having a structure with a fluorescent pigment dispersed in a non-conjugated high molecular compound) (luminous high molecular compound). Alternatively, a combination of two or more luminescent materials may be used, such as a luminescent material having a relatively low luminescence as the host material and a luminescent material having a relatively high luminescence as the dopant material (guest material).

As preferred low molecular compounds for the luminescent layer 20 there may be mentioned naphthalene derivatives, phenanthrene derivatives, anthracene derivatives, naphthacene derivatives, pyrene derivatives, perylene derivatives, coronene derivatives, indene derivatives, fluorene derivatives, fluoranthene derivatives, stilbene derivatives, pentadiene derivatives, oxazole derivatives, oxadiazole derivatives, thiazole derivatives, imidazole derivatives, indole derivatives, triazole derivatives, pyridine derivatives, pyrazine derivatives, pyrrole derivatives, thiophene derivatives, quinoline derivatives, quinoxaline derivatives, carbazole derivatives, triphenylamine derivatives, diaminobiphenyl derivatives, styrylamine derivatives, pyran derivatives, coumarin, quinacridone derivatives, or organic metal chelate compounds having Al, Zn, Be, Ir, Pt or a rare earth metal as the central metal. These may be used alone or in combinations of two or more.

According to this embodiment, the luminescent layer 20 is preferably composed of a host material and a dopant material. The host material is preferably a styryl derivative, an arylene derivative or an aromatic amine. A styryl derivative is most preferably at least one type selected from among distyryl derivatives, tristyryl derivatives, tetrastyryl derivatives and styrylamine derivatives. An arylene derivative is most preferably an anthracene derivative and most preferably a compound containing an arylanthracene skeleton. An aromatic amine is preferably an aromatic substituted compound with 2-4 nitrogen atoms, and most preferably an aromatic substituted compound with 2-4 nitrogen atoms and with at least one alkenyl group.

As examples of styryl derivatives and anthracene derivatives there may be mentioned the compounds represented by the following general formulas (A-1) to (A-6), and as examples of aromatic amines there may be mentioned the compounds represented by the following general formulas (A-7) to (A-8).

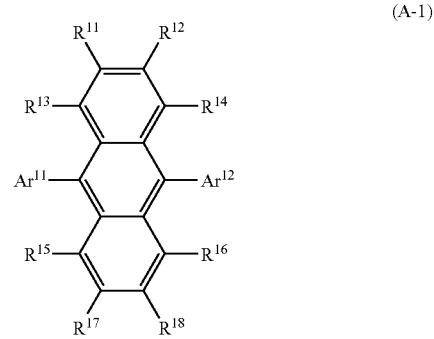

(A-1)

[wherein $R^{11}$-$R^{18}$ each independently represent hydrogen, a halogen, cyano, nitro, substituted or unsubstituted C1-20 alkyl, substituted or unsubstituted C1-20 alkoxy, substituted or unsubstituted C6-30 aryloxy, substituted or unsubstituted C1-20 alkylthio, substituted or unsubstituted C6-30 arylthio, substituted or unsubstituted C7-30 arylalkyl, a substituted or unsubstituted C5-30 monocyclic group, a substituted or unsubstituted C10-30 fused polycyclic group or a substituted or unsubstituted C5-30 heterocyclic group. $Ar^{11}$ and $Ar^{12}$ each independently represent substituted or unsubstituted C6-30 aryl or substituted or unsubstituted alkenyl, wherein the substituents are substituted or unsubstituted C1-20 alkyl, substituted or unsubstituted C1-20 alkoxy, substituted or unsubstituted C6-30 aryloxy, substituted or unsubstituted C1-20 alkylthio, substituted or unsubstituted C6-30 arylthio, substituted or unsubstituted C6-30 arylalkyl, a substituted or unsubstituted C5-30 monocyclic group, a substituted or unsubstituted C10-30 fused polycyclic group or a substituted or unsubstituted C5-30 heterocyclic group.]

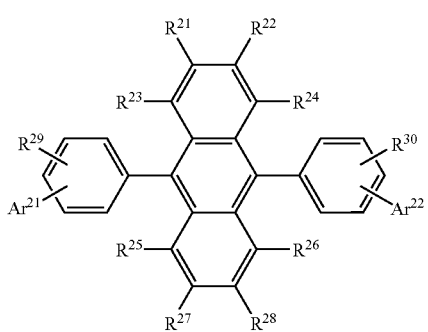

(A-2)

[wherein $R^{21}$-$R^{30}$ each independently represent hydrogen, a halogen, cyano, nitro, substituted or unsubstituted C1-20 alkyl, substituted or unsubstituted C1-20 alkoxy, substituted or unsubstituted C6-30 aryloxy, substituted or unsubstituted C1-20 alkylthio, substituted or unsubstituted C6-30 arylthio, substituted or unsubstituted C7-30 arylalkyl, a substituted or unsubstituted C5-30 monocyclic group, a substituted or unsubstituted C10-30 fused polycyclic group or a substituted or unsubstituted C5-30 heterocyclic group. $Ar^{21}$ and $Ar^{22}$ each independently represent substituted or unsubstituted C6-30 aryl or substituted or unsubstituted alkenyl, wherein the substituents are substituted or unsubstituted C1-20 alkyl, substituted or unsubstituted C1-20 alkoxy, substituted or unsubstituted C6-30 aryloxy, substituted or unsubstituted C1-20 alkylthio, substituted or unsubstituted C6-30 arylthio, substituted or unsubstituted C6-30 arylalkyl, a substituted or unsubstituted C5-30 monocyclic group, a substituted or unsubstituted C10-30 fused polycyclic group or a substituted or unsubstituted C5-30 heterocyclic group.]

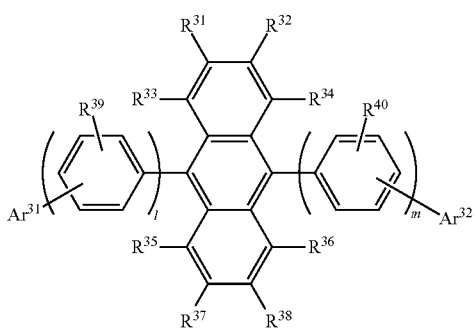

(A-3)

[wherein $R^{31}$-$R^{40}$ each independently represent hydrogen, a halogen, cyano, nitro, substituted or unsubstituted C1-20 alkyl, substituted or unsubstituted C1-20 alkoxy, substituted or unsubstituted C6-30 aryloxy, substituted or unsubstituted C1-20 alkylthio, substituted or unsubstituted C6-30 arylthio, substituted or unsubstituted C7-30 arylalkyl, a substituted or unsubstituted C5-30 monocyclic group, a substituted or unsubstituted C10-30 fused polycyclic group or a substituted or unsubstituted C5-30 heterocyclic group. $Ar^{31}$ and $Ar^{32}$ each independently represent substituted or unsubstituted C6-30 aryl or substituted or unsubstituted alkenyl, wherein the substituents are substituted or unsubstituted C1-20 alkyl, substituted or unsubstituted C1-20 alkoxy, substituted or unsubstituted C6-30 aryloxy, substituted or unsubstituted C1-20 alkylthio, substituted or unsubstituted C6-30 arylthio, substituted or unsubstituted C6-30 arylalkyl, a substituted or unsubstituted C5-30 monocyclic group, a substituted or unsubstituted C10-30 fused polycyclic group, a substituted or unsubstituted C5-30 heterocyclic group or a substituted or unsubstituted C4-40 alkenyl group. The letter l represents 1-3, m represents 1-3 and l+m≧2.]

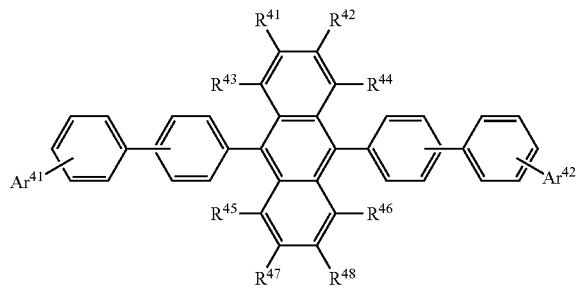

(A-4)

[wherein $R^{41}$-$R^{48}$ each independently represent hydrogen, a halogen, cyano, nitro, substituted or unsubstituted C1-20 alkyl, substituted or unsubstituted C1-20 alkoxy, substituted or unsubstituted C6-30 aryloxy, substituted or unsubstituted C1-20 alkylthio, substituted or unsubstituted C6-30 arylthio, substituted or unsubstituted C7-30 arylalkyl, a substituted or unsubstituted C5-30 monocyclic group, a substituted or unsubstituted C10-30 fused polycyclic group or a substituted or unsubstituted C5-30 heterocyclic group. $Ar^{41}$ and $Ar^{42}$ each independently represent substituted or unsubstituted C6-30 aryl or substituted or unsubstituted alkenyl, wherein the substituents are substituted or unsubstituted C1-20 alkyl, substituted or unsubstituted C1-20 alkoxy, substituted or unsubstituted C6-30 aryloxy, substituted or unsubstituted C1-20 alkylthio, substituted or unsubstituted C6-30 arylthio, substituted or unsubstituted C6-30 arylalkyl, a substituted or unsubstituted C5-30 monocyclic group, a substituted or unsubstituted C10-30 fused polycyclic group, a substituted or unsubstituted C5-30 heterocyclic group or a substituted or unsubstituted C4-40 alkenyl group.]

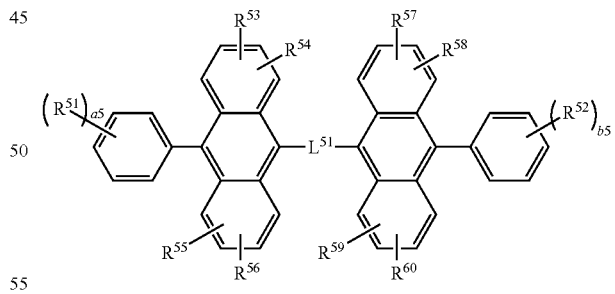

(A-5)

[wherein $R^{51}$-$R^{60}$ each independently represent hydrogen, alkenyl, alkyl, cycloalkyl, aryl, alkoxy, aryloxy, alkylamino, arylamino or an optionally substituted heterocyclic group, and a5 and b5 each represent an integer of 1-5, with the proviso that when they are 2 or greater, the $R^{51}$ groups or $R^{52}$ groups may be the same or different and the $R^{51}$ groups or $R^{52}$ groups may bond together to form rings, and $R^{53}$ and $R^{54}$, $R^{55}$ and $R^{56}$, $R^{57}$ and $R^{58}$ and $R^{59}$ and $R^{60}$ may also bond together to form rings. $L^{51}$ represents a single bond or —O—, —S—, —N(R)— (where R is alkyl or optionally substituted aryl) or arylene.]

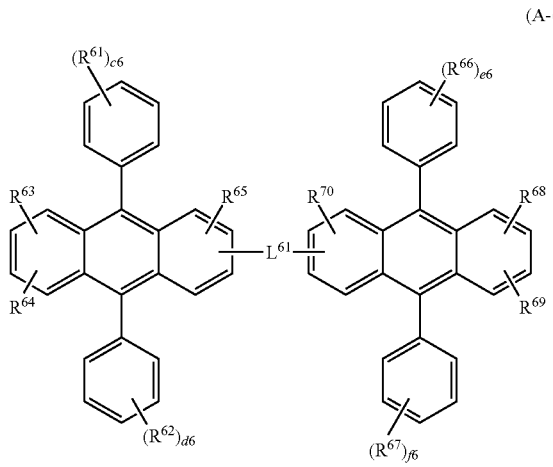

(A-6)

[wherein $R^{61}$-$R^{70}$ each independently represent hydrogen, alkenyl, alkyl, cycloalkyl, aryl, alkoxy, aryloxy, alkylamino, arylamino or an optionally substituted heterocyclic group, and c6, d6, e6 and f6 each represent an integer of 1-5, with the proviso that when they are 2 or greater, the $R^{61}$ groups, $R^{62}$ groups, $R^{66}$ groups and $R^{67}$ groups may be the same or different and the $R^{61}$ groups, $R^{62}$ groups, $R^{66}$ groups and $R^{67}$ groups may bond together to form rings, and $R^{63}$ and $R^{64}$ and $R^{68}$ and $R^{69}$ may also bond together to form rings. $L^{61}$ represents a single bond or —O—, —S—, —N(R)— (where R is alkyl or optionally substituted aryl) or arylene.]

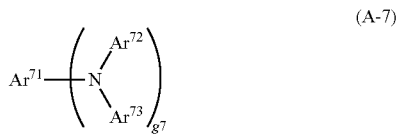

(A-7)

[wherein $Ar^{71}$, $Ar^{72}$ and $Ar^{73}$ each independently represent a C6-40 substituted or unsubstituted monovalent aromatic group or styryl group, and g7 represents an integer of 1-4.]

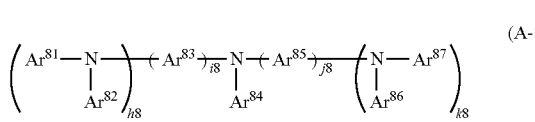

(A-8)

[wherein $Ar^{81}$, $Ar^{82}$, $Ar^{84}$, $Ar^{86}$ and $Ar^{87}$ each independently represent a C6-40 substituted or unsubstituted monovalent aromatic group or styryl group, $Ar^{83}$ and $Ar^{85}$ each independently represent a C6-40 substituted or unsubstituted divalent aromatic group or styrylene group, h8 and k8 each represent an integer of 0-2 and i8 and j8 each represent an integer of 0-3.]

A blue dopant used for this embodiment is preferably styrylamine, an amine-substituted styryl compound or a fused aromatic ring-containing compound. The blue dopant may also be composed of a plurality of different compounds. As examples of styrylamines and amine-substituted styryl compounds there may be mentioned compounds represented by the following general formulas (A-9) and (A-10), and as examples of fused aromatic ring-containing compounds there may be mentioned compounds represented by the following general formula (A-11).

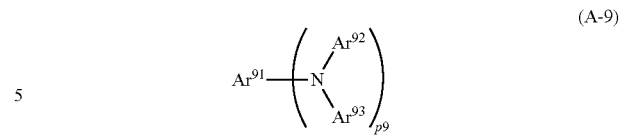

(A-9)

[wherein $Ar^{91}$, $Ar^{92}$ and $Ar^{93}$ each independently represent a C6-40 substituted or unsubstituted aromatic or styryl group, and p9 represents an integer of 1-3.]

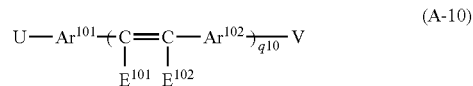

(A-10)

[wherein $Ar^{101}$ and $Ar^{102}$ each independently represent C6-30 arylene, $E^{101}$ and $E^{102}$ each independently represent C6-30 aryl or alkyl, hydrogen or cyano, and q10 represents an integer of 1-3. U and/or V is an no group-containing substituent. The amino group is preferably arylamino.]

(A-11)

[wherein A represents C1-16 alkyl or alkoxy, C6-30 substituted or unsubstituted aryl C6-30 substituted or unsubstituted alkylamino or C6-30 substituted or unsubstituted arylamino, B represents a C10-40 fused aromatic cyclic group, and r11 represents an integer of 1-4.1

A blue luminescent layer may also be a luminescent layer containing a phosphorescent dopant. In this case, the host material is preferably a compound containing a carbazole ring. As specific examples there may be mentioned compounds represented by the following formulas (B-1) to (13-6).

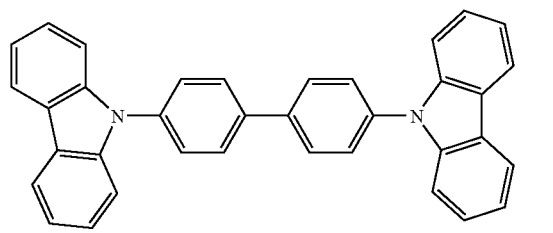

(B-1)

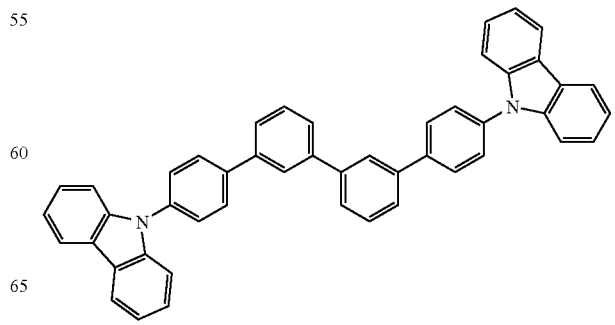

(B-2)

-continued

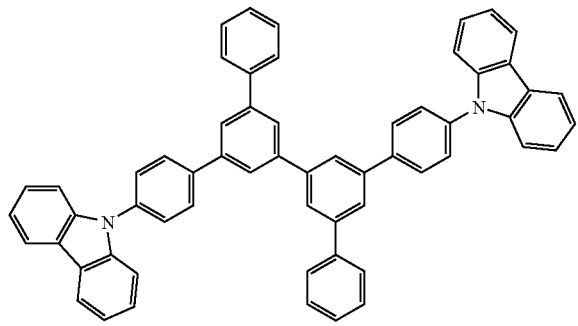
(B-3)

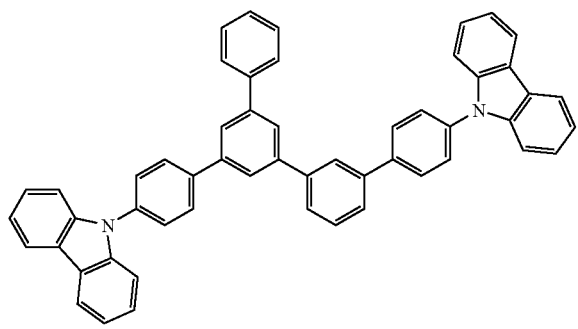
(B-4)

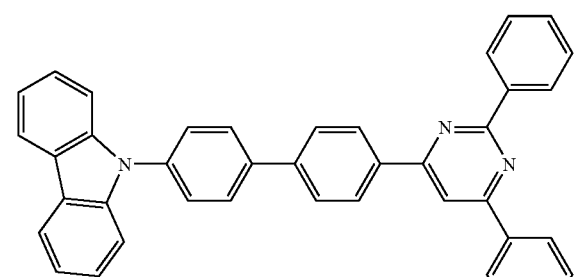
(B-5)

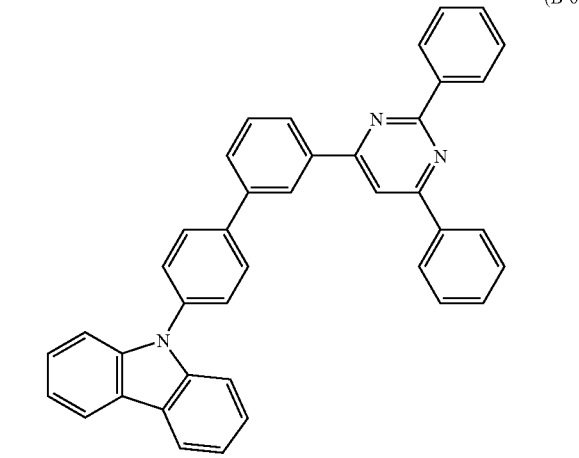
(B-6)

As additional specific examples of host compounds there may be mentioned triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidene-based compounds, porphyrin-based compounds, anthraquinodimethane derivatives, anthrone derivatives, diphenylquinone derivatives, thiopyranodioxide derivatives, carbodiimide derivatives, fluorenylidenemethane derivatives, distyrylpyrazine derivatives, heterocyclic tetracarboxylic anhydrides such as naphthaleneperylene, phthalocyanine derivatives, various metal chelates typical of which are metal chelates of 8-quinolinol derivatives, metalphthalocyanine and metal chelates having benzooxazole or benzothiazole as ligands. These host compounds may be used alone or in combinations of two or more.

A phosphorescent dopant is a compound capable of emitting light from a triplet exciton. The type is not particularly restricted so long as it emits light from a triplet exciton, and specifically there are preferred metal chelates containing Ir, Ru, Pd, Pt, Os or Re atoms, among which porphyrin metal chelates and orthometallated metal chelates are preferred. As porphyrin metal chelates there are preferred porphyrin-platinum chelate. Several ligands form orthometallated metal chelates, and preferred ligands include 2-phenylpyridine derivatives, 7,8-benzoquinoline derivatives, 2-(2-thienyl)pyridine derivatives, 2-(1-naphthyl)pyridine derivatives and 2-phenylquinoline derivatives. These derivatives may also have substituents if necessary. Particularly preferred as blue dopants are fluorinated compounds and trifluoromethyl group-introduced compounds. Auxiliary ligands such as acetylacetonate and picric acid may also be present in addition to the ligands mentioned above. A single phosphorescent dopant may be used alone, or two or more may be used in combination.

The content of the phosphorescent dopant in the blue luminescent layer is not particularly restricted and may be appropriately selected for the intended purpose, but it is preferably 0.1-70 wt % and more preferably 1-30 wt %. If the phosphorescent dopant content is less than 0.1 wt % the effect of addition may not be adequately exhibited, and if it is greater than 70 wt % the element performance may be reduced by a phenomenon known as "concentration quenching".

A green luminescent layer is preferably also a combination of a host and a dopant. The host material is preferably a styryl derivative, an anthracene derivative, an aromatic amine or a metal chelate of 8-hydroxyquinoline or its derivative. Specific examples of styryl derivatives, anthracene derivatives and aromatic amines include the same host materials used for a blue luminescent layer.

As dopants there may be mentioned the naphthacene-based materials described in Japanese Unexamined Patent Publication No. 2000-268964 and Japanese Unexamined Patent Publication No. 2000-268963, and the coumarin-based materials described in Japanese Unexamined Patent Publication HEI No. 6-9952.

A yellow-red luminescent layer is preferably composed of a host material and a yellow-red dopant. The host material is preferably a styryl derivative, an anthracene derivative, an aromatic amine or a metal chelate of 8-hydroxyquinoline or its derivative. Specific examples of styryl derivatives, anthracene derivatives and aromatic amines to be used in a yellow-red luminescent layer include the same host materials used for the blue luminescent layer. As specific examples of metal chelates of 8-hydroxyquinoline or its derivatives there may be used metal chelate oxinoid compounds including chelates of oxines (generally 8-quinolinol or 8-hydroxyquinoline), and tris(8-quinolinol)aluminum. When an anthracene derivative is used as the host material, the host materials used for the blue luminescent layer and the yellow-red luminescent layer may be the same or different. When a positive hole transport compound such as a styryl derivative or aromatic amine is used as the host material, the host materials used for the blue luminescent layer and yellow-red luminescent layer are preferably different.

The yellow-red dopant used may be a fluorescent compound having at least one fluoranthene skeleton or perylene skeleton, and as is examples there may be mentioned compounds represented by the following general formulas (Y-1) to (Y-17).

(Y-1)

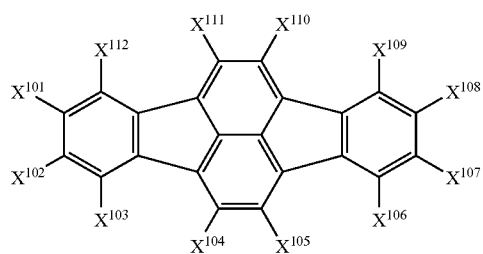

(Y-2)

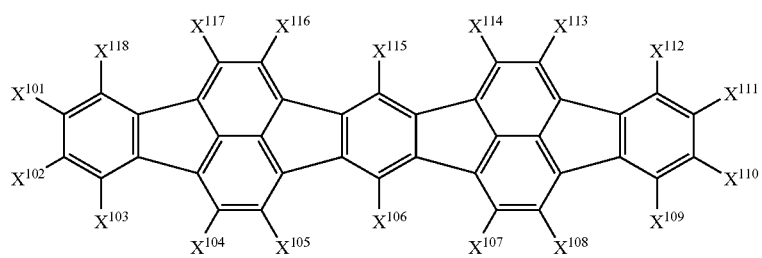

(Y-3)

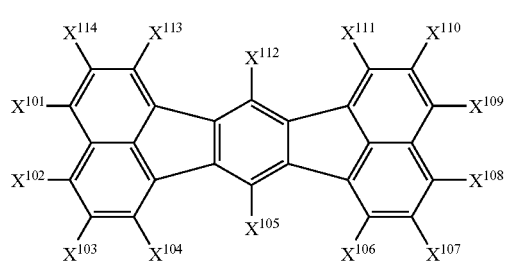

(Y-4)

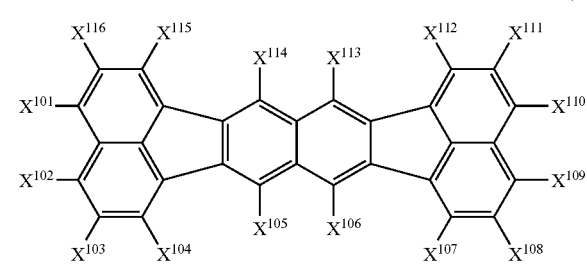

(Y-5)

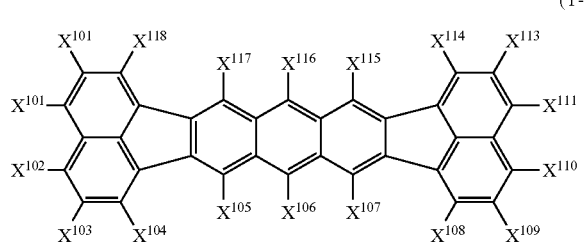

(Y-6)

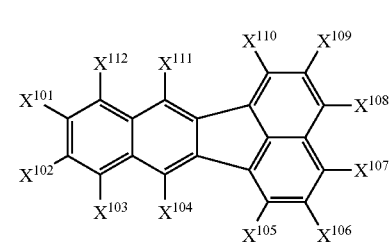

(Y-7)

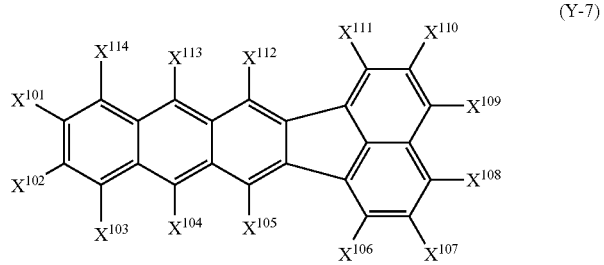

(Y-8)

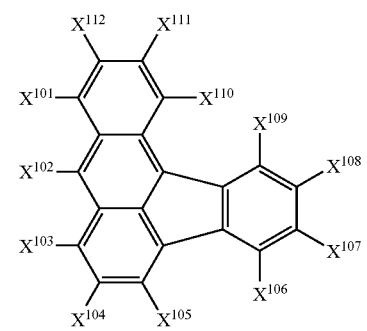

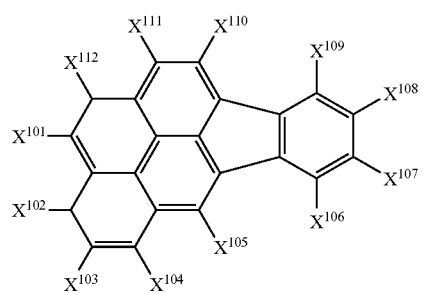
(Y-9)
(Y-10)
(Y-11)
(Y-12)
(Y-13)
(Y-14)

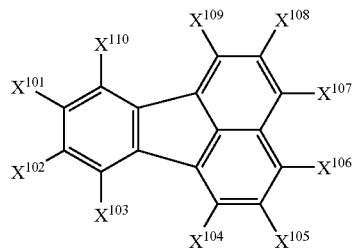
(Y-15)

[wherein in formulas (Y-1) to (Y-15), $X^{101}$—$X^{120}$ each independently represent hydrogen, straight-chain branched or cyclic C1-20 allyl, straight-chain, branched or cyclic C1-20 alkoxy, substituted or unsubstituted C6-30 aryl, substituted or unsubstituted C6-30 aryloxy, substituted or unsubstituted C6-30 arylamino, substituted or unsubstituted C1-30 alkylamino, substituted or unsubstituted C7-30 arylalkylamino or substituted or unsubstituted C8-30 alkenyl, with adjacent substituents of $X^{101}$—$X^{120}$ optionally bonding together to form cyclic structures. When the adjacent substituents are aryl groups, the substituents may be the same.)

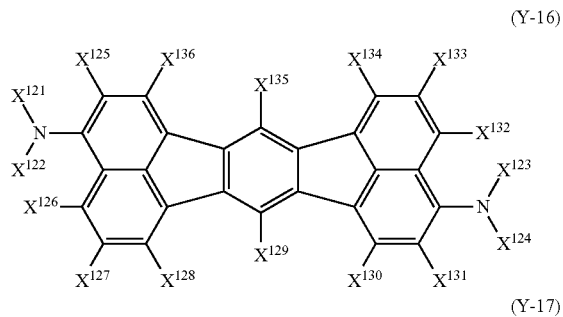
(Y-16)

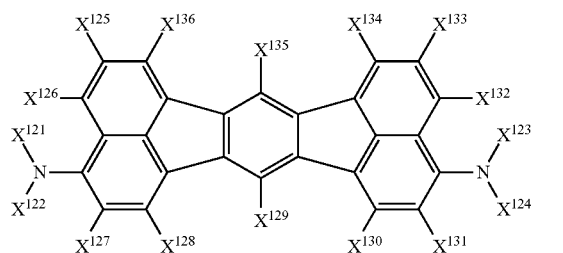
(Y-17)

[wherein in formulas (Y-16) and (Y-17), $X^{121}$—$X^{124}$ each independently represent C1-20 alkyl or substituted or unsubstituted C6-30 aryl, and $X^{121}$ and $X^{122}$ and/or $X^{123}$ and $X^{124}$ are optionally bonded by a carbon-carbon bond, —O— or —S—. $X^{125}$—$X^{136}$ represent hydrogen, straight-chain, branched or cyclic C1-20 alkyl, straight-chain, branched or cyclic C1-20 alkoxy, substituted or unsubstituted C6-30 aryl, substituted or unsubstituted C6-30 aryloxy, substituted or unsubstituted C6-30 arylamino, substituted or unsubstituted C1-30 alkylamino, substituted or unsubstituted C7-30 arylalkylamino or substituted or unsubstituted C8-30 alkenyl with adjacent substituents of $X^{125}$—$X^{136}$ optionally bonding together to form cyclic structures.]

The compounds of formulas (Y-1) to (Y-15) preferably contain amino groups or alkenyl groups.

The compounds of formulas (Y-16) and (Y-17) preferably contain amino or alkenyl groups in at least one of $X^{125}$-$X^{136}$.

Also, the fluorescent compound having a fluoranthene skeleton preferably contains an electron donor group in order to achieve high efficiency and a long usable life. Preferred electron donor groups include substituted and unsubstituted arylamino groups. The fluorescent compound having a fluoranthene skeleton also has preferably 5 or more and most preferably 6 or more fused rings.

According to this embodiment, there may be used a red fluorescent layer composed of an indenoperylene-based dopant material and a diphenylnaphthacene-based host material as described in Japanese Unexamined Patent Publication No. 2002-8867.

A luminescent layer containing an added phosphorescent dopant may also be used as a yellow-red luminescent layer. The host material in this case is preferably a compound containing a carbazole ring, and it may be a compound used for the blue luminescent layer.

The phosphorescent dopant added in this case is a compound capable of emitting light from a triplet exciton, and is not particularly restricted so long as it emits light from a triplet exciton. It is preferably a metal chelate containing an Ir, Ru, Pd, Pt, Os or Re atom, among which porphyrin metal chelates and orthometallated metal chelates are preferred. Several ligands form orthometallated metal chelates, and preferred ligands include 2-phenylpyridine derivatives, 7,8-benzoquinoline derivatives, 2-1-naphthyl)pyridine derivatives and 2-phenylquinoline derivatives. These derivatives may also have substituents if necessary. Particularly preferred as yellow-red dopants are 2-phenylquinoline derivatives and 2-(2-thienyl)pyridine derivatives. Auxiliary ligands such as acetylacetonate and picric acid may also be present in addition to the ligands mentioned above.

The content of the phosphorescent dopant in the yellow-red luminescent layer may be appropriately selected for the intended purpose. It is preferably 0.1-70 wt % and more preferably 1-30 wt %. If the phosphorescent dopant content is less than 0.1 wt % the effect of addition may not be adequately exhibited. If it is greater than 70 wt %, the element performance may be reduced by a notable degree of the phenomenon known as "concentration quenching".

The film thickness of the yellow-red luminescent layer is preferably 10-50 nm, more preferably 20-50 nm and most preferably 30-50 nm. At less than 10 nm the luminescent efficiency may be reduced, and at greater than 50 nm the driving voltage may be increased.

According to this embodiment, each of the aforementioned luminescent layers may be laminated or composited for a combination of the different luminescent colors, to allow formation of various color shades such as white/cyan/yellow-white.

As examples of preferred high molecular luminescent materials to compose the luminescent layer 20 there may be mentioned compounds which have been high-molecularized by introduction of luminescent materials, and specifically there may be mentioned polyvinyl compounds obtained by high molecularization of monomers having a vinyl group introduced either directly or via a linkage bond, into a fused polycyclic compound such as carbazole, anthracene, naphthacene, pyrene, tetracene, coronene, perylene, phthaloperylene or naphthaloperylene.

From the standpoint of luminescent efficiency, heat resistance and usable life, a molecular dispersion high molecular compound is preferably used from among high molecular luminescent materials for the luminescent material of the luminescent layer 20, and it is more preferred to use at least one type of high molecular compound selected from the group consisting of vinyl-based high molecular compounds obtained by polymerization of polymerizable monomers, including vinyl monomers derived from compounds having structures represented by the following general formulas (1)-(4), vinyl-based high molecular compounds obtained by polymerization of polymerizable monomers including compounds represented by the following general formulas (5)-(10), and high molecular compounds having repeating units represented by the following formulas (11)-(13), from the viewpoint of carrier transport properties, heat resistance and stability of luminescent efficiency. Also, from the same standpoint, vinyl monomers derived from compounds having the structures represented by the following general formulas (1)-(4) are preferably vinyl monomers derived from compounds having the structures represented by the following general formulas (14)-(16) and (18), respectively, while compounds represented by the following general formulas (5), (9) and (10) are more preferably compounds represented by the following general formulas (21)-(23), respectively.

From the same viewpoint as above, the vinyl monomer derived from a compound having the structure represented by general formula (16) is more preferably a vinyl monomer derived from a compound having the structure represented by general formula (17) below, where at least one from among $X^{61}$ to $X^{73}$ in general formula (17) is most preferably an alkyl group-containing substituent having a total of 3-20 carbon atoms. The vinyl monomer derived from a compound having the structure represented by general formula (18) is more preferably a vinyl monomer derived from a compound having the structure represented by general formula (19) below, and more preferably it is a vinyl monomer derived from a compound having the structure represented by general formula (20) below.

From the same viewpoint as above, the compound represented by general formula (23) is preferably a compound represented by the following general formula (24) or (25).

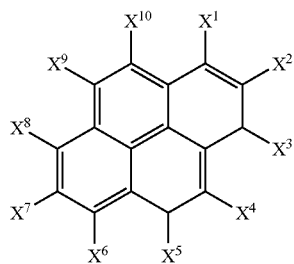

(1)

In formula (1), $X^1$—$X^{10}$ may be the same or different and each represents hydrogen, alkyl, alkoxy, aryl, aryloxy, a heterocyclic group, amino, cyano or a halogen. The substituents bonded to the carbon atoms composing the pyrene ring of formula (1) may also be bonded together to form rings.

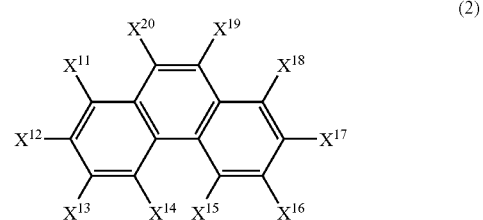

(2)

In formula (2), $X^{11}$-$X^{20}$ may be the same or different and each represents hydrogen, alkyl, alkoxy, aryl, aryloxy, a heterocyclic group, amino, cyano or a halogen. The substituents bonded to the carbon atoms composing the phenanthrene ring of formula (2) may also be bonded together to form rings.

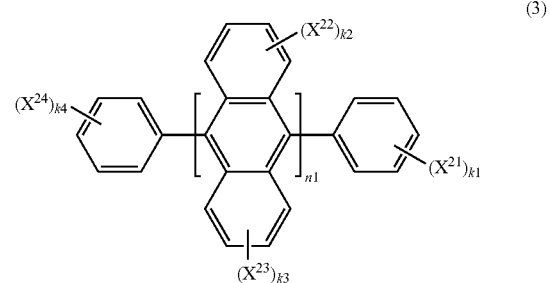

(3)

In formula (3), $X^{21}$—$X^{24}$ may be the same or different and each represents a substituent, n1 represents an integer of 1-3, k1 and k4 each represent an integer of 0-5 and k2 and k3 each represent an integer of 0-4.

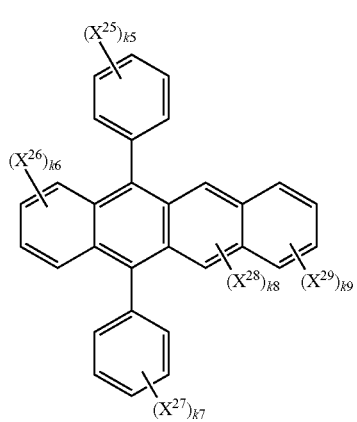

(4)

In formula (4), $X^{25}$—$X^{29}$ may be the same or different and each represents, alkyl, alkoxy, aryl, aryloxy, a heterocyclic group, amino, a halogen or cyano. k5-k9 represent the numbers of substituents on the corresponding benzene rings, where k5 and k7 each represent an integer of 0-5, k6 and k9 each represent an integer of 0-4 and k8 represents an integer of 0-2. The substituents bonded to the carbon atoms composing the diphenylnaphthacene ring of formula (4) may also be bonded together to form rings.

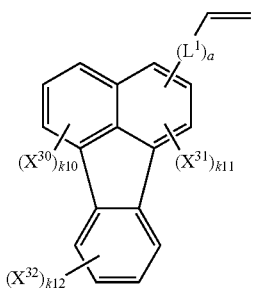

(5)

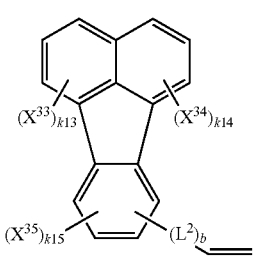

(6)

In formulas (5) and (6), $L^1$ and $L^2$ each represent a divalent group, $X^{30}$—$X^{35}$ may be the same or different and each represents alkyl, alkoxy, aryl, aryloxy, a heterocyclic group, amino, a halogen or cyano, a and b each represent 0 or 1, k10, k13, k14 and k15 each represent an integer of 0-3, k11 represents an integer of 0-2, and k12 represents an integer of 0-4. Also, the substituents bonded to the carbon atoms composing the fluoranthene ring may also be bonded together to form rings.

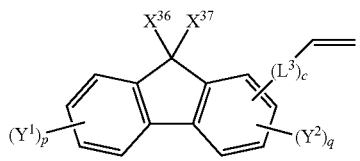

(7)

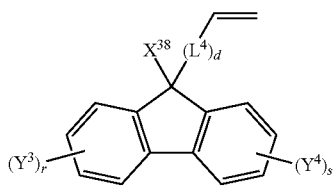

(8)

In formulas (7) and (8), $L^3$ and $L^4$ each represent a divalent group, $X^{36}$—$X^{38}$ may be the same or different and each represents hydrogen or a substituent, $Y^1$—$Y^4$ may be the same or different and each represents an substituent, c and d each represent 0 or 1, p, r and s each represent an integer of 0-4, q represents an integer of 0-3, and the substituents bonded to the carbon atoms composing the fluorene ring may also be bonded together to form rings.

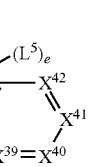

(9)

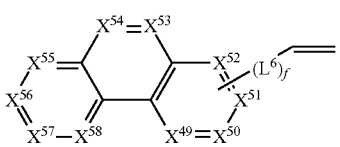

(10)

In formulas (9) and (10), $L^5$ and $L^6$ each represent a divalent group, $X^{39}$—$X^{58}$ may be the same or different and each represents a carbon atom or nitrogen atom, e and f each represent 0 or 1, one of $X^{39}$—$X^8$ is a carbon atom to which a group represented by $L^5$ or a vinyl group is bonded, and substituents are optionally bonded to the other carbon atoms, where those substituents may be bonded together to form rings, while one of $X^{49}$—$X^{58}$ is a carbon atom to which a group represented by $L^6$ or a vinyl group is bonded, and substituents are optionally bonded to the other carbon atoms, where those substituents may be bonded together to form rings

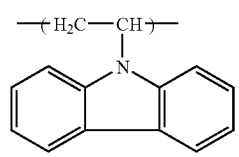

(11)

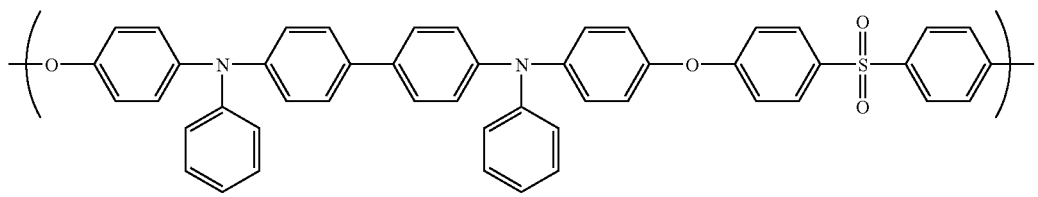
(12)

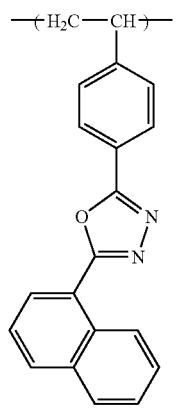
(13)

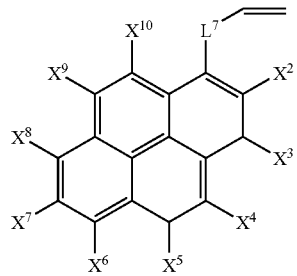
(14)

In formula (14), $L^7$ represents a single bond or a divalent group such as alkylene or arylene, which may be substituted or unsubstituted, and $X^2$—$X^{10}$ may be the same or different and each represents hydrogen, alkyl, alkoxy, aryl, aryloxy, a heterocyclic group, amino, cyano or a halogen. The substituents bonded to the carbon atoms composing the pyrene ring of formula (14) may also be bonded together to form rings.

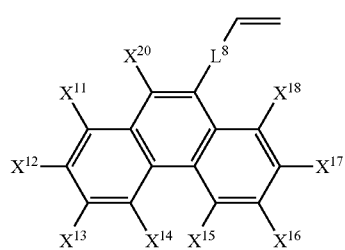
(15)

In formula (15), $L^8$ represents a single bond or a divalent group such as alkylene or arylene, which divalent group may be substituted or unsubstituted, and $X^{11}$—$X^{20}$ may be the same or different and each represents hydrogen, alkyl, alkoxy, aryl, aryloxy, a heterocyclic group, amino, cyano or a halogen. The substituents bonded to the carbon atoms composing the phenanthrene ring of formula (15) may also be bonded together to form rings.

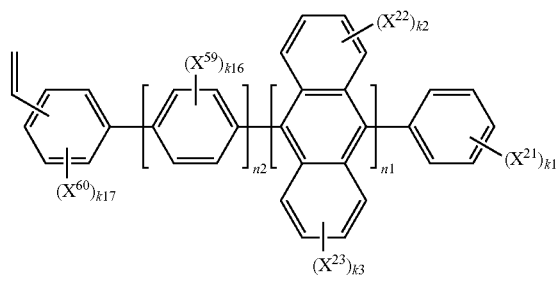
(16)

In formula (16), $X^{21}$—$X^{23}$ and $X^{59}$—$X^{60}$ may be the same or different and each represents alkyl, alkoxy, aryl, aryloxy, a heterocyclic group, a halogen, cyano, hydroxyl or amino. n1 represents an integer of 1-3, n2 represents 0 or 1, k1 represents an integer of 0-5 and k2, k3, k16 and k17 each represent an integer of 0-4.

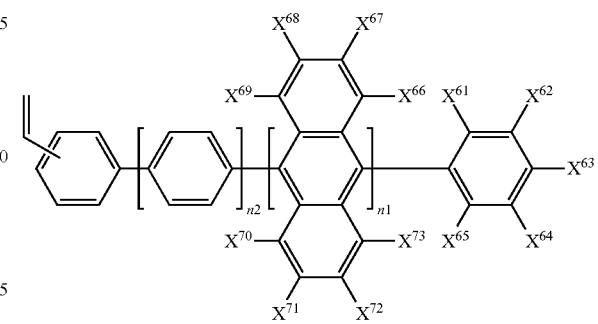
(17)

In formula (17), $X^{61}$—$X^{73}$ may be the same or different and each represents hydrogen, alkyl, alkoxy or aryl. n1 represents an integer of 1-3 and n2 represents 0 or 1.

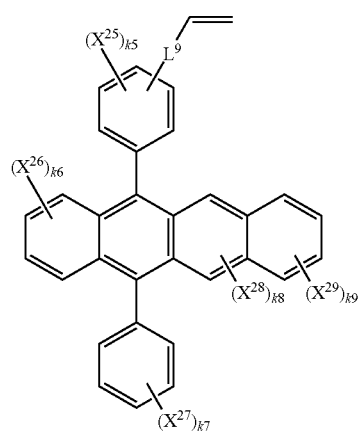
(18)

In formula (18), $L^9$ represents a single bond, alkylene or arylene, which may be substituted or unsubstituted, and $X^{25}$—$X^{29}$ may be the same or different and each represents alkyl, alkoxy, aryl, aryloxy, a heterocyclic group, amino, a halogen or cyano. k5-k9 represent the numbers of substituents on the corresponding benzene rings, where k5, k6 and k9 each represent an integer of 0-4, k7 represents an integer of 0-5 and k8 represents an integer of 0-2. The substituents bonded to the carbon atoms composing the diphenylnaphthacene ring of formula (18) may also be bonded together to form rings.

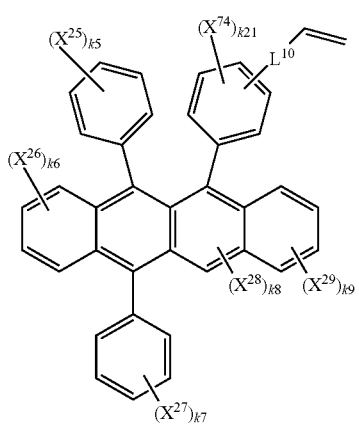

(19)

In formula (19), $L^{10}$ represents a single bond, alkylene or arylene, which may be substituted or unsubstituted, and $X^{25}$—$X^{29}$ and $X^{74}$ may be the same or different and each represents alkyl, alkoxy, aryl, aryloxy, a heterocyclic group, amino, a halogen or cyano. k5-k9 and k21 represent the numbers of substituents on the corresponding benzene rings, where k5 and k7 each represent an integer of 0-5, k6, k9 and k21 each represent an integer of 0-4 and k8 represents 0 or 1. The substituents bonded to the carbon atoms composing the diphenylnaphthacene ring of formula (19) may also be bonded together to form rings.

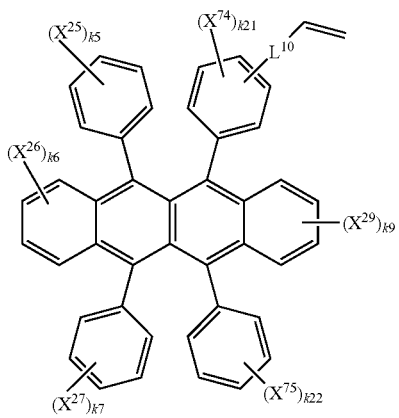

(20)

In formula (20), $L^{10}$ represents a single bond, alkylene or arylene, which may be substituted or unsubstituted, and $X^{25}$—$X^{27}$, $X^{29}$, $X^{74}$ and $X^{75}$ may be the same or different and each represents alkyl, alkoxy, aryl, aryloxy, a heterocyclic group, amino, a halogen or cyano. k5-k7, k9, k21 and k22 represent the numbers of substituents on the corresponding benzene rings, where k5, k7 and k22 each represent an integer of 0-5, and k6, k9 and k21 each represent an integer of 0-4. The substituents bonded to the carbon atoms composing the diphenylnaphthacene ring of formula (20) may also be bonded together to form rings.

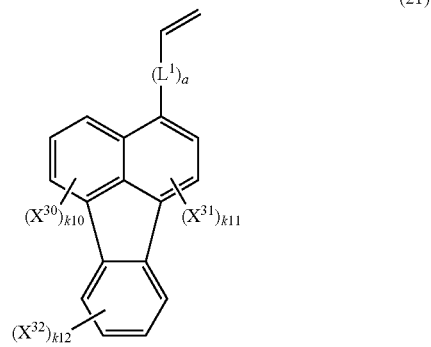

(21)

In formula (21), $L^1$ represents a divalent groups $X^{30}$—$X^{32}$ may be the same or different and each represents alkyl, alkoxy, aryl, aryloxy, a heterocyclic group, amino, a halogen or cyano, a represents 0 or 1, k10 represents an integer of 0-3, k11 represents an integer of 0-2, and k12 represents al integer of 0-4. Also, the substituents bonded to the carbon atoms composing the fluoranthene ring of formula (21) may also be bonded together to form rings.

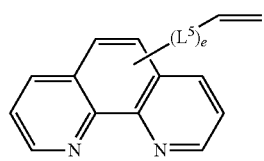

(22)

In formula (22), $L^5$ represents a divalent group, and e represents 0 or 1. Also, substituents may be bonded to carbon atoms among the carbon atoms composing the phenanthroline ring of formula (22), other than the atom to which the group represented by $L^5$ or a vinyl group is bonded, and the substituents may bond together to form rings.

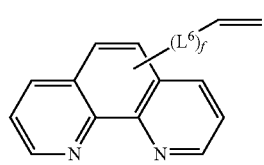

(22)

In formula (23), $L^6$ represents a divalent group and f represents 0 or 1. Also, substituents may be bonded to carbon atoms among the carbon atoms composing the phenanthroline ring of formula (23), other than the atom to which the group represented by $L^6$ or a vinyl group is bonded, and the substituents may bond together to form rings.

(24)

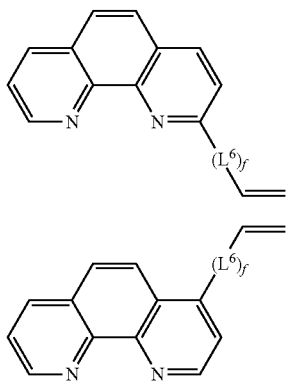

(25)

(29)

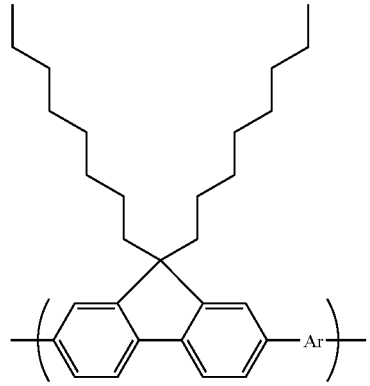

In formulas (24) and (25), $L^6$ represents a divalent group, $f$ represents 0 or 1, and substituents may be bonded to carbon atoms among the carbon atoms composing the phenanthroline ring, other than the atom to which the group represented by $L^6$ or a vinyl group is bonded, and the substituents may bond together to form rings.

Also, when a π-conjugated high molecular compound is used, it is preferably a high molecular compound having a repeating unit represented by any of the following general formulas (26) to (29).

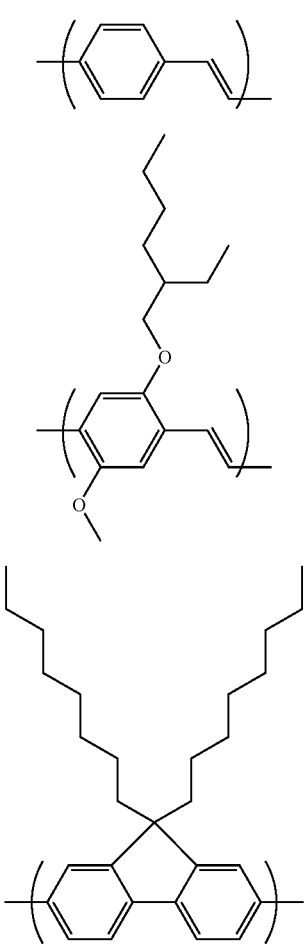

(26)

(27)

(28)

Substituents $L^1$-$L^{10}$ on each of the aforementioned high molecular compounds are substituted or unsubstituted phenyl groups, and this is particularly preferred when a-f are 1, from the same viewpoint explained above.

Also, the luminescent material used may be a copolymer obtained by copolymerizing repeating units of two or more of the high molecular compounds used as luminescent materials for the luminescent layer 20, or the luminescent material used may be a copolymer of one or more of the repeating units of the aforementioned high molecular compounds and a repeating unit of a high molecular compound not referred to here.

If necessary, the luminescent layer 20 may also comprise, in addition to the luminescent material, a carrier transport material such as a conventionally known hole transport material and/or electron transport material.

As hole transport materials there may be mentioned pyrazoline derivatives, arylamine derivatives, stilbene derivatives and triphenyldiamine derivatives.

As specific examples of hole transport materials there may be mentioned those used as materials to form the hole injection layer or hole transport layer provided in the other embodiment of the organic EL element of the invention described hereunder.

As electron transport materials there may be mentioned organic metal chelates of oxadiazole derivatives, anthraquinodimethane or its derivatives, benzoquinone or its derivatives, naphthoquinone or its derivatives, anthraquinone or its derivatives, tetracyanoanthraquinodimethane or its derivatives, fluorene or its derivatives, diphenyldicyanoethylene or its derivatives, diphenoquinone derivatives, and 8-hydroxyquinoline or its derivatives.

Of the electron transport materials mentioned above there may be suitably used organic metal chelates of 8-hydroxyquinoline or its derivatives, specific examples of which include those used as materials to form the electron transport layer in the other embodiment of the organic EL element of the invention described hereunder.

The amount of carrier transport material used will differ depending on the type of compound used, and therefore the optimum amount of addition may be determined within a range which does not impair sufficient film formability and luminescent characteristics. Normally, it will be 1-40 wt % and more preferably 2-30 wt % with respect to the luminescent material.

The film thickness of the luminescent layer 20 is not particularly restricted and will differ depending on the forming method, but from the standpoint of further improving the luminescent efficiency it is preferably 20 nm-150 nm.

(Organic Thin-Film Layer)

The organic thin-film layer 16 is made of a vapor-depositable polar organic compound with an energy gap of 3.5 eV or greater, and its film thickness must be 0.1 nm-4 nm.

As vapor-depositable polar organic compounds with an energy gap of 3.5 eV or greater there may be mentioned the following compounds (a) to (e).

(a) Polymers or copolymers of compounds selected from the group consisting of vinylpyridine, (meth)acrylic acid, N-alkylacrylamide, N,N-dialkylacrylamide, hydroxy(meth) acrylate, vinyl acetate, styrene and N-vinylpyrrolidone, or compounds comprising them as skeletal units.

(b) Oxyalkylene polymers or copolymers with C2-4 alkyl groups, or compounds comprising them as skeletal units.

(c) Polyoxazoline, polyvinylbutyral or compounds comprising them as skeletal units.

(d) Crown ethers, cyclophanes, triazines, calixarenes, or their derivatives.

(e) Polyethers, Polyether derivatives, or heterocyclic ring-containing compounds.

The compounds of (a) to (e) above may optionally have substituents.

Since the compounds of (a) to (e) above must satisfy all of the conditions, i.e. an energy gap of 3.5 eV or greater, vapor depositability and polarity, for example, simple styrene polymers having no substituents and which are non-polar are excluded from the polymers or copolymers of (a) above. Polymethyl methacrylate is also excluded because it decomposes during vapor deposition making it difficult to form an organic thin-film layer, or in other words, it is not considered a vapor-depositable compound. Also, the cyclophanes selected among the compounds of (d) must be polar with a polar group or hetero atom in the molecule.

The compounds of (a) to (c) above preferably have a weight-average molecular weight (Mw) of no greater than 2000. The compounds of (d) and (e) above preferably have a molecular weight of no greater than 2000. When the compounds of (d) and (e) are polymers, the weight-average molecular weight (Mw) is preferably no greater than 2000.

As compounds of (a) above there are more preferred polyvinylpyridine oligomers with established structures, represented by the following general formulas (a-1a) to (a-1c).

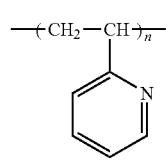

(a-1a)

n = 4-20

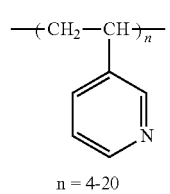

(a-1b)

n = 4-20

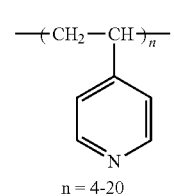

(a-1c)

n = 4-20

Here, n represents the polymerization degree, and the polyvinylpyridine oligomers represented by general formulas (a-1a) to (a-1c) above are compounds wherein n is any number between 4-20.

The polyvinylpyridine oligomer used for this embodiment may consist of a mixture of oligomers with different polymerization degrees, or in other words, it may have a molecular weight distribution.

As compounds represented by (b) above there may be mentioned compounds represented by the following general formula (b-1).

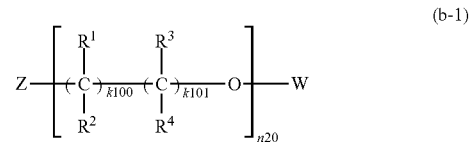

(b-1)

In formula (b-1), $R^1$, $R^2$, $R^3$, $R^4$, Z and W each independently represent hydrogen, optionally substituted alkyl optionally substituted alkoxy, optionally substituted aryl optionally substituted aryloxy, an optionally substituted heterocyclic group, optionally substituted amino, optionally substituted cyano or a halogen. $R^1$, $R^2$, $R^3$ and $R^4$ may also be bonded together to form a ring. In formula (b-1), k100 and k101 each independently represent an integer of 1-4, and n20 represents an integer of 2-45.

As examples of compounds represented by (b-1) above there may be mentioned compounds represented by the following general formulas (b-1a) to (b-1d).

(b-1a)

n = 10-50

(b-1b)

n = 10-30

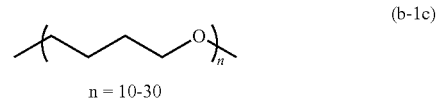

(b-1c)

n = 10-30

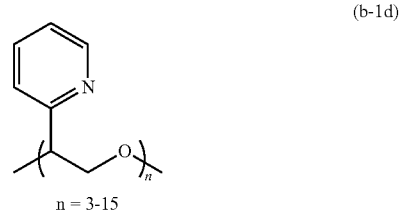

(b-1d)

n = 3-15

Here, n represents the polymerization degree, and the heterocycle-containing compounds represented by general formulas (b-1a), (b-1b), (b-1c) and (b-1d) above are compounds wherein n is any number between 10-50, 10-30, 10-30 and 3-15, respectively.

As examples of the aforementioned crown ethers there may be mentioned compounds having the structure represented by the following general formula (d-1).

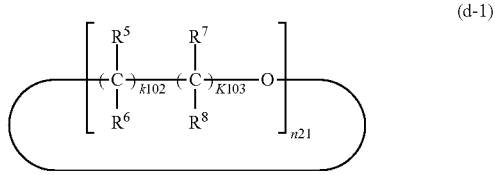
(d-1)

In formula (d-1), $R^5$, $R^6$, $R^7$ and $R^8$ each independently represent hydrogen, optionally substituted alkyl, optionally substituted alkoxy, optionally substituted aryl, optionally substituted aryloxy, an optionally substituted heterocyclic group, optionally substituted amino, optionally substituted cyano or a halogen. $R^5$, $R^6$, $R^7$ and $R^8$ may also be bonded together to form a ring. In formula (d-1), k102 and k103 each independently represent an integer of 1-4, and n21 represents an integer of 2-45.

As examples of compounds having the structure represented by general formula (d-1) above there may be mentioned compounds represented by the following general formulas (d-1a) to (d-1b).

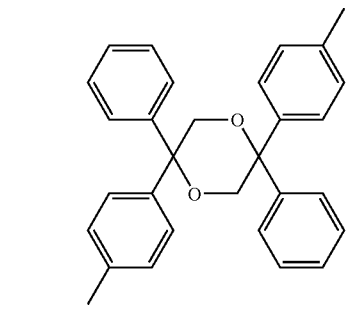
(d-1a)

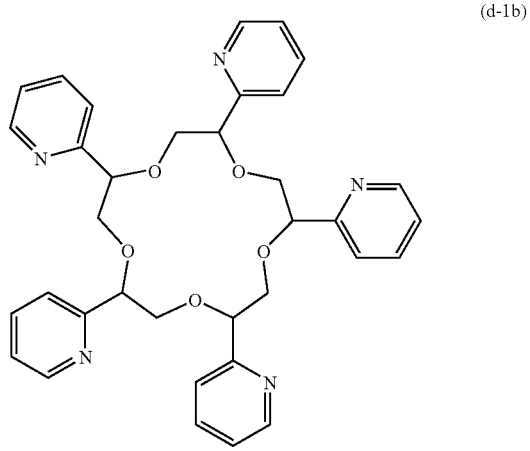
(d-1b)

As crown ethers to be used for this embodiment there may be mentioned compounds represented by the following general formulas (d-1c) to (d-1g).

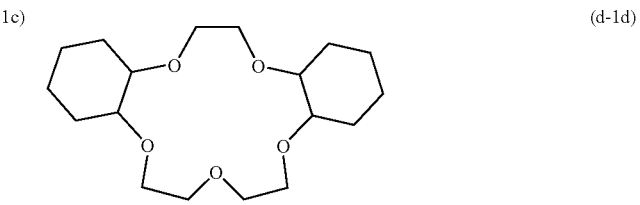
(d-1c) (d-1d)

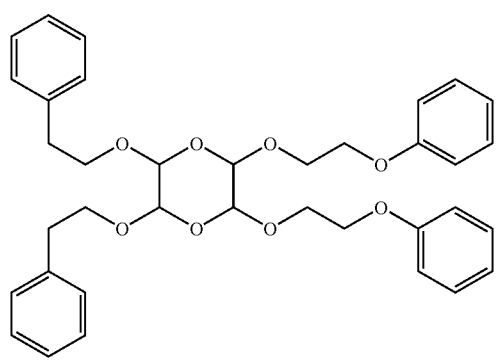

(d-1e)

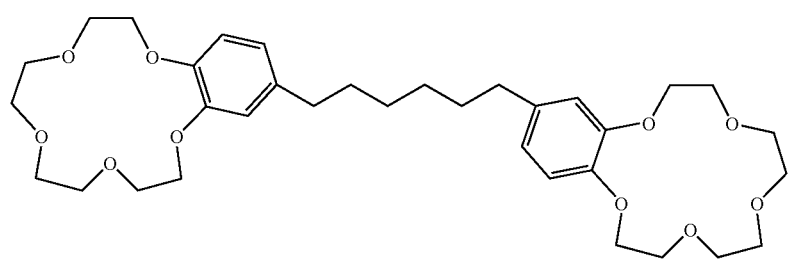

(d-1f)

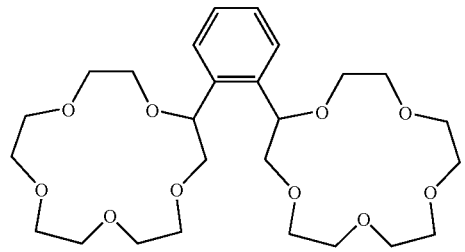

(d-1g)

Also, as preferred examples of crown ethers there may be mentioned compounds having the structures represented by the following general formulas (d-2) and (d-3).

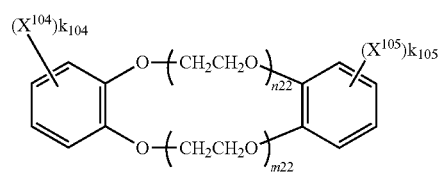

(d-2)

Here, n22 and m22 each independently represent an integer of 1-50. $X^{104}$ and $X^{105}$ may be the same or different and each represents alkyl, alkoxy, aryl, aryloxy, a heterocyclic group, a halogen, cyano, hydroxyl or amino. Also, k104 and k105 represent the numbers of substituents on the corresponding benzene rings, where k104 and k105 each represent an integer of 0-4.

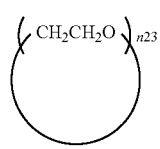

(d-3)

Here, n23 represents an integer of 2-50.

Of the crown ethers represented by general formula (d-2), it is more preferred to use a compound having one of the structures represented by the following general formulas (d-2a) to (d-2c) from the standpoint of a long usable life and high luminescent efficiency.

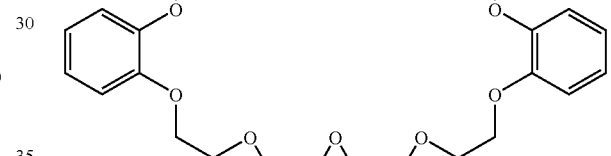

(d-2a)

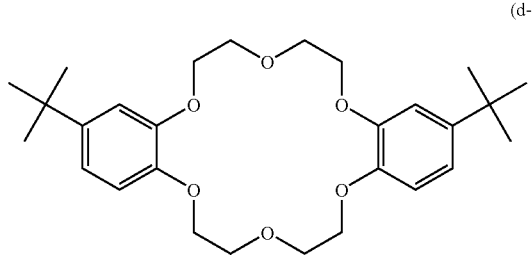

(d-2b)

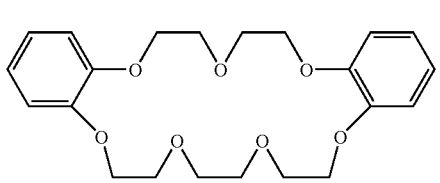

(d-2c)

Of the crown ethers represented by general formula (d-3), it is more preferred to use a compound having the structure represented by the following general formula (d-3a) from the standpoint of a long usable life and high luminescent efficiency.

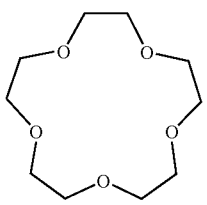
(d-3a)

As an example of a cyclophane there may be mentioned cyclophane derivatives such as 1,6,20,25-tetraazo[6,1,6,1]paracyclophane.

As an example of a triazine there may be mentioned triazine derivatives such as tri(2-pyridyl)-1,3,5-triazine.

As an example of a calixarene there may be mentioned calixarene derivatives such as 4-tert-butylcalixarene.

As polyethers, other than the compounds of (b) above and crown ethers, there may be mentioned compounds having more than one OAr structure. Here, Ar is optionally substituted aryl or an optionally substituted heterocyclic group. For this embodiment, a compound having 2-20 OAr structures is preferred.

As examples of such compounds having more than one OAr structure there may be mentioned compounds represented by the following formulas (e-1a) to (e-1c).

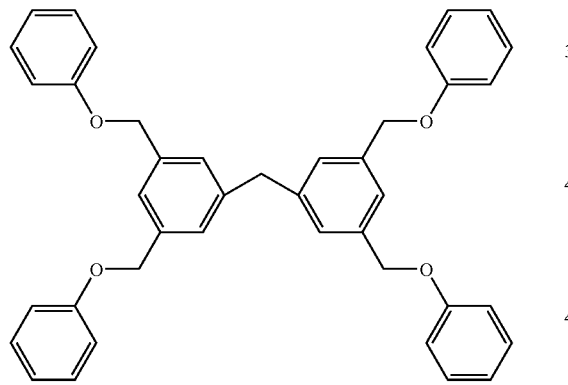
(e-1a)

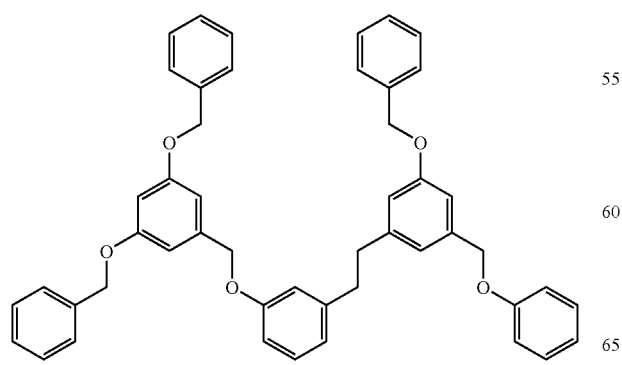
(e-1b)

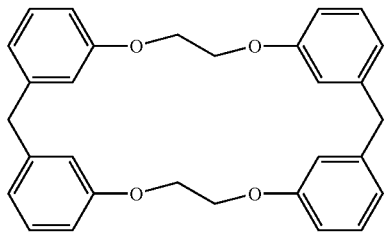
(e-1c)

As examples of such heterocyclic ring-containing compounds there may be mentioned compounds represented by the following general formulas (e-2) to (e-220).

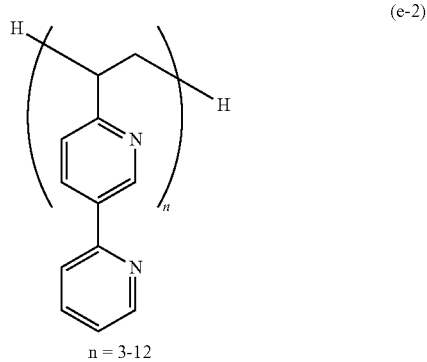
(e-2)

n = 3-12

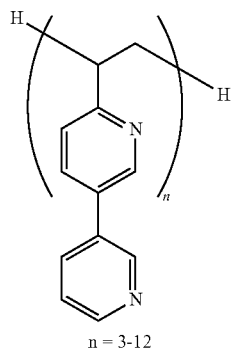
(e-3)

n = 3-12

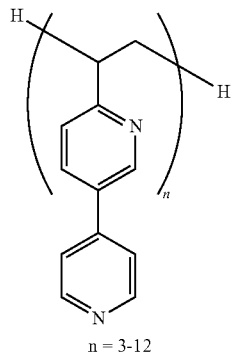
(e-4)

n = 3-12

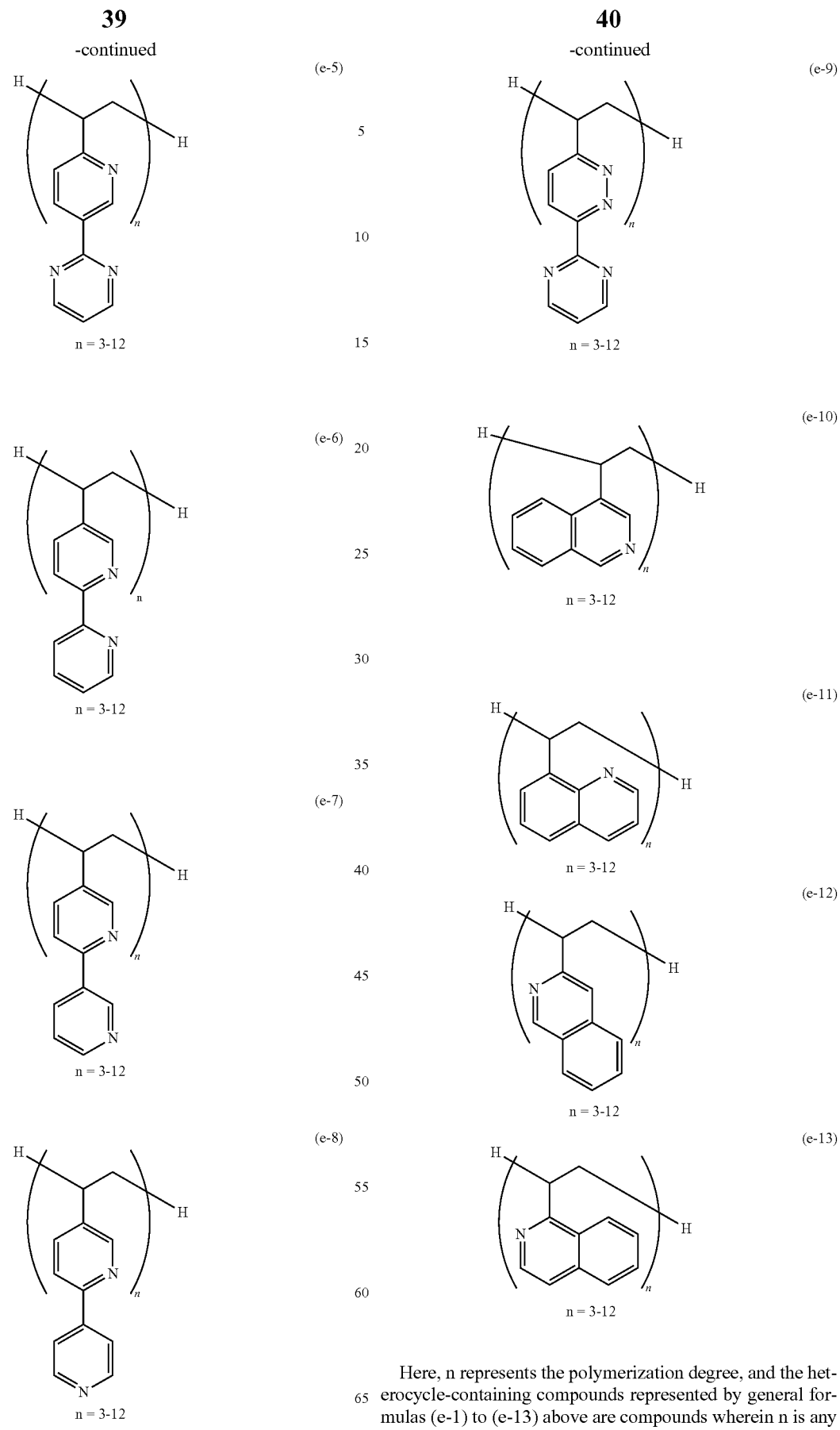
Here, n represents the polymerization degree, and the heterocycle-containing compounds represented by general formulas (e-1) to (e-13) above are compounds wherein n is any number between 3-12.

(e-14)
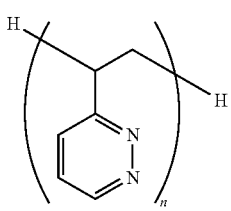
(e-15)
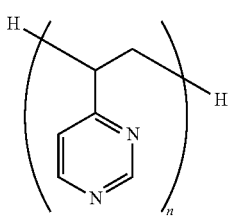
n = 4-20
(e-16)
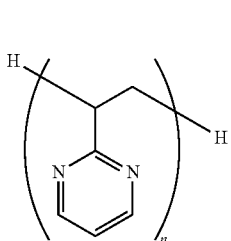
n = 4-20
(e-17)
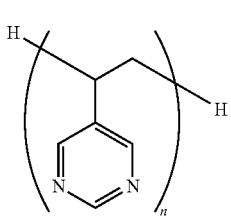
n = 4-20
(e-18)
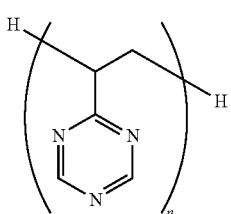
n = 4-20
(e-19)
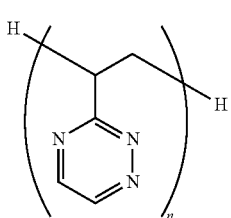
n = 4-20
(e-20)
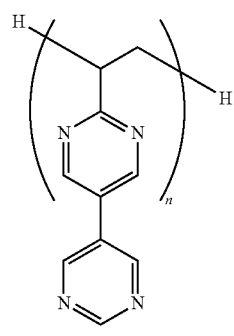
n = 3-10
(e-21)
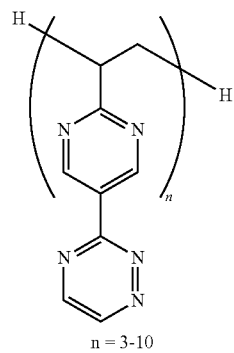
n = 3-10
(e-22)
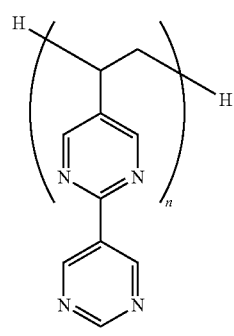
n = 3-10
Here, n represents the polymerization degree, and the heterocycle-containing compounds represented by general formulas (e-14) to (e-19) above are compounds wherein n is any number between 4-20, while the heterocycle-containing compounds represented by general formulas (e-20) to (e-22) above are compounds wherein n is any number between 3-10.
(e-23)
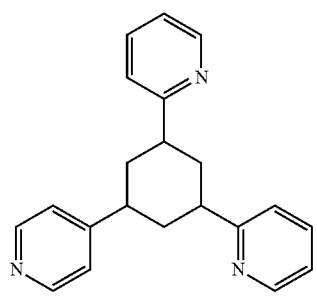

(e-24)
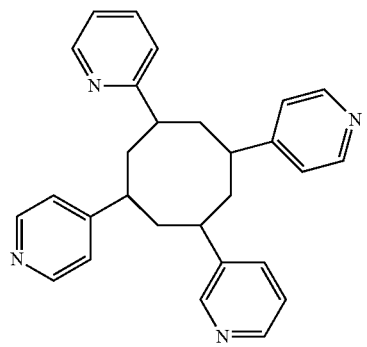
(e-25)
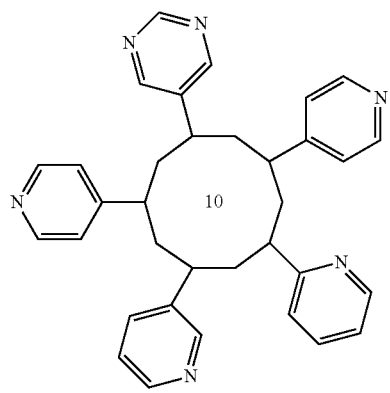
(e-26)
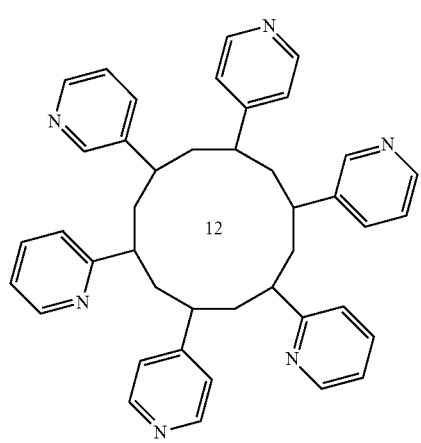
(e-27)
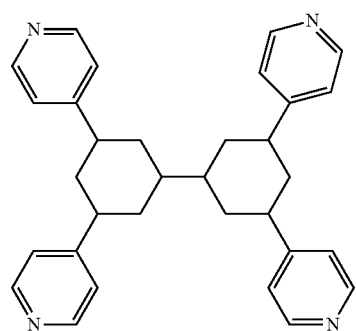
(e-28)
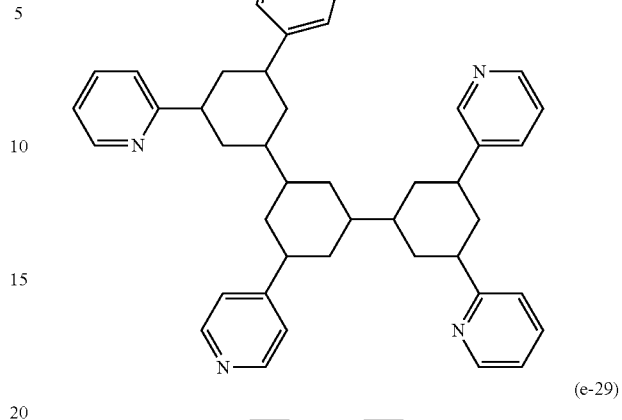
(e-29)
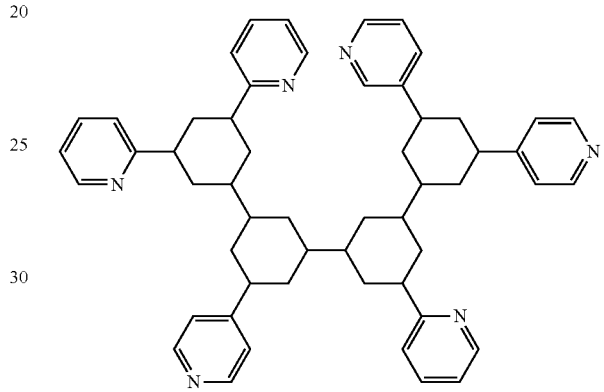
(e-30)
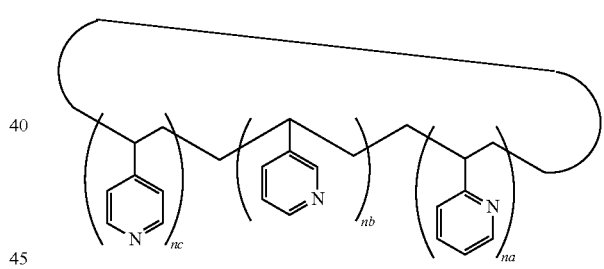
nc + nb + na = 5-20
Here, n represents the polymerization degree, and the heterocycle-containing compound represented by general formula (e-30) above is a compound wherein nc+nb+na is any number between 5-20.
(e-31)
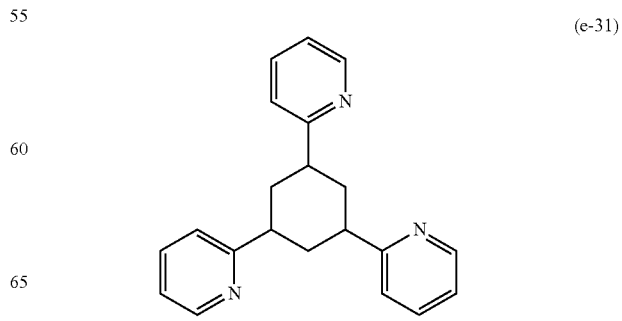

(e-32)
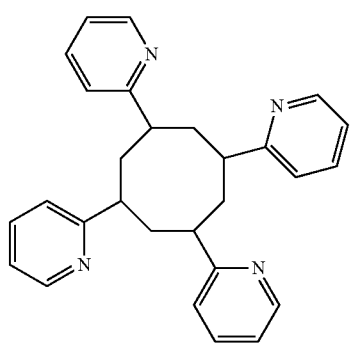
(e-33)
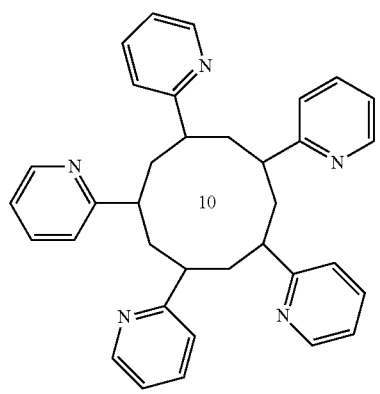
(e-34)
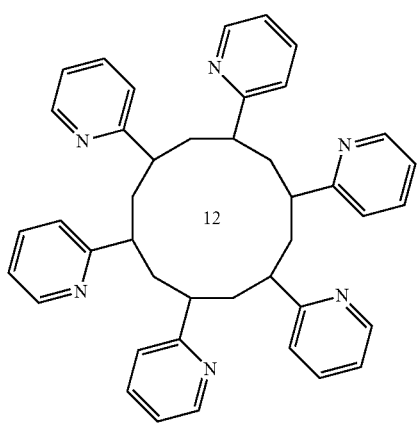
(e-35)
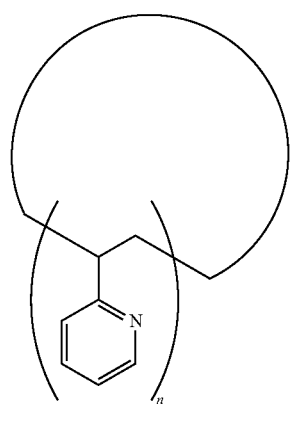
n = 7-20
(e-36)
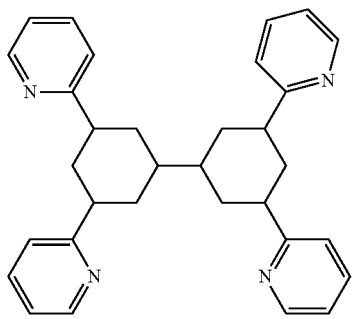
(e-37)
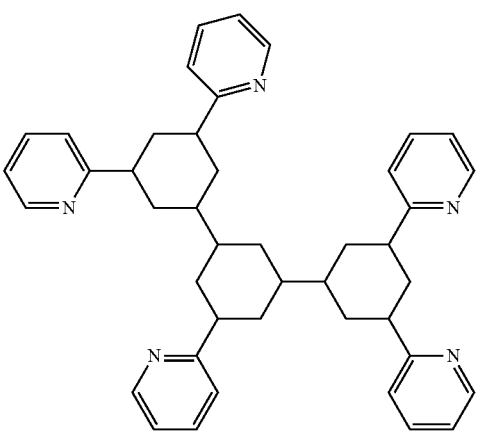
(e-38)
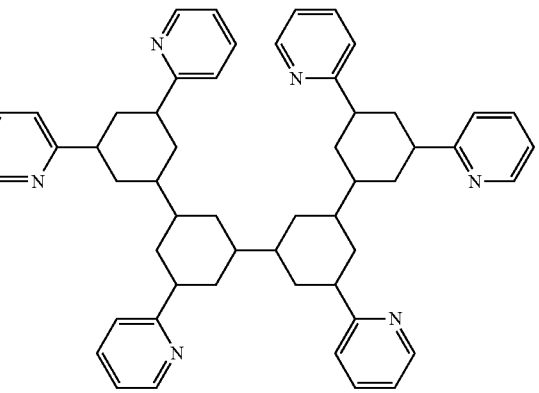
Here, n represents the polymerization degree, and the heterocycle-containing compound represented by general formula (e-35) above is a compound wherein n is any number between 7-20.
(e-39)
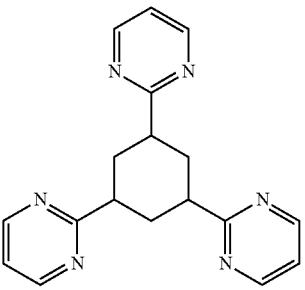

(e-40)
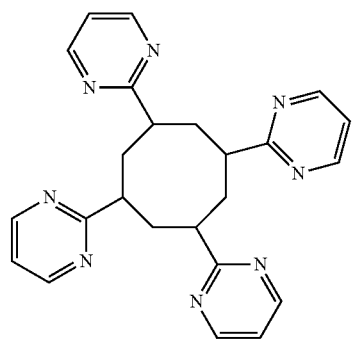
(e-41)
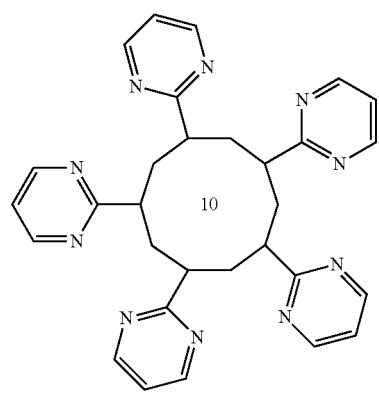
(e-42)
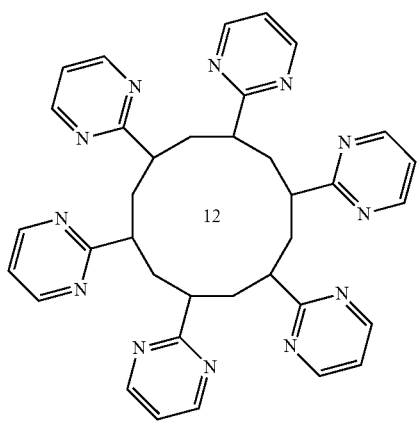
(e-43)
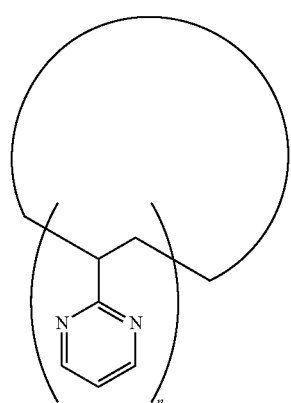
n = 7-20
(e-44)
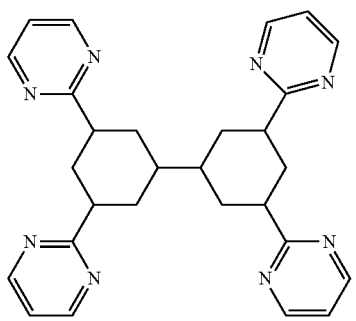
(e-45)
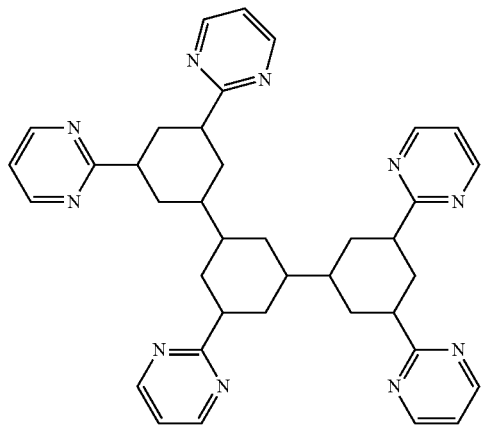
(e-46)
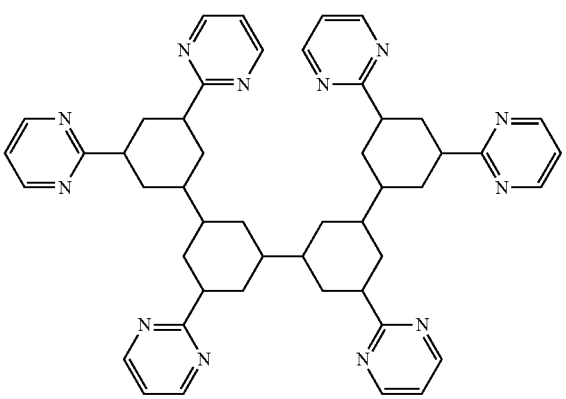
Here, n represents the polymerization degree, and the heterocycle-containing compound represented by general formula (e-43) above is a compound wherein n is any number between 7-20.
(e-47)
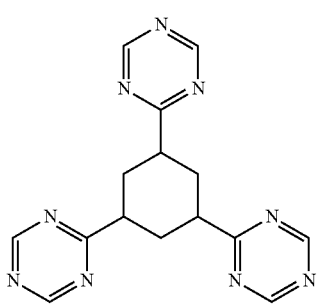

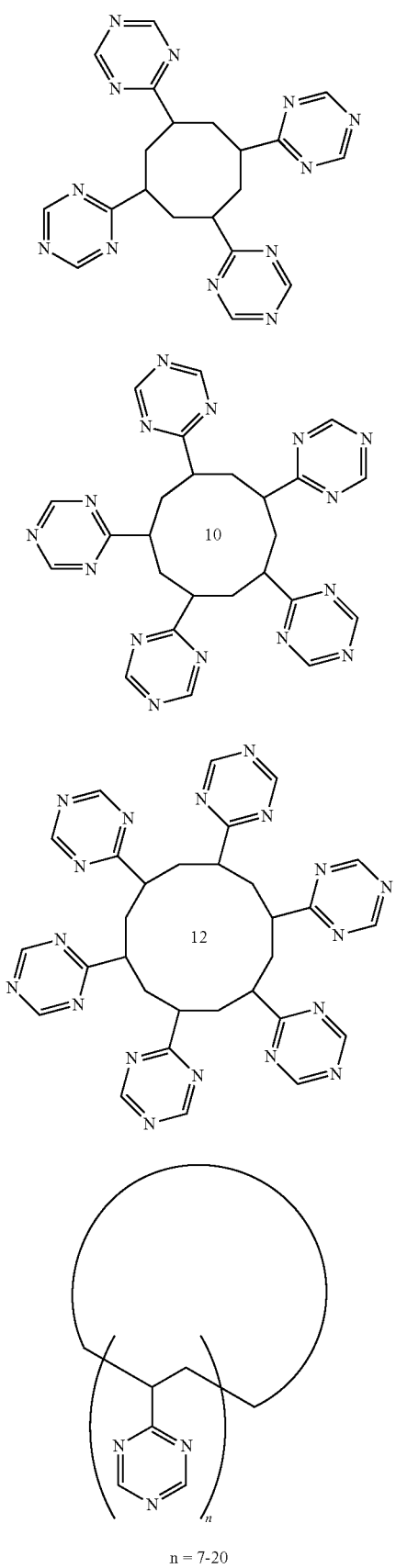
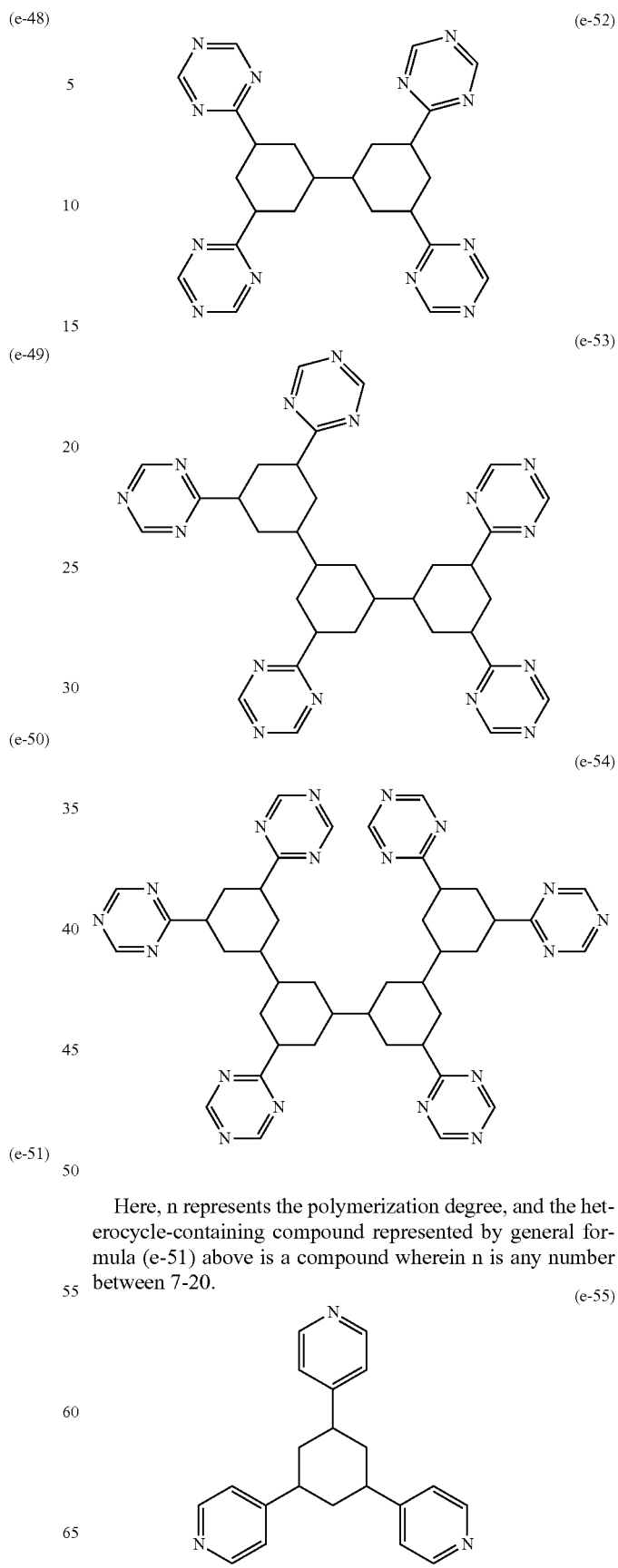
Here, n represents the polymerization degree, and the heterocycle-containing compound represented by general formula (e-51) above is a compound wherein n is any number between 7-20.

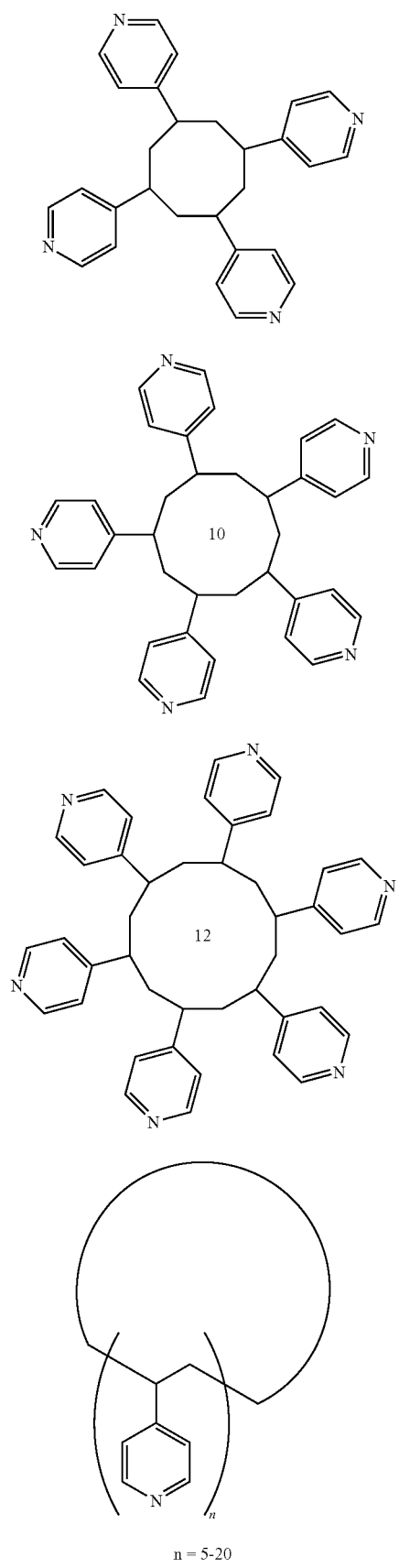
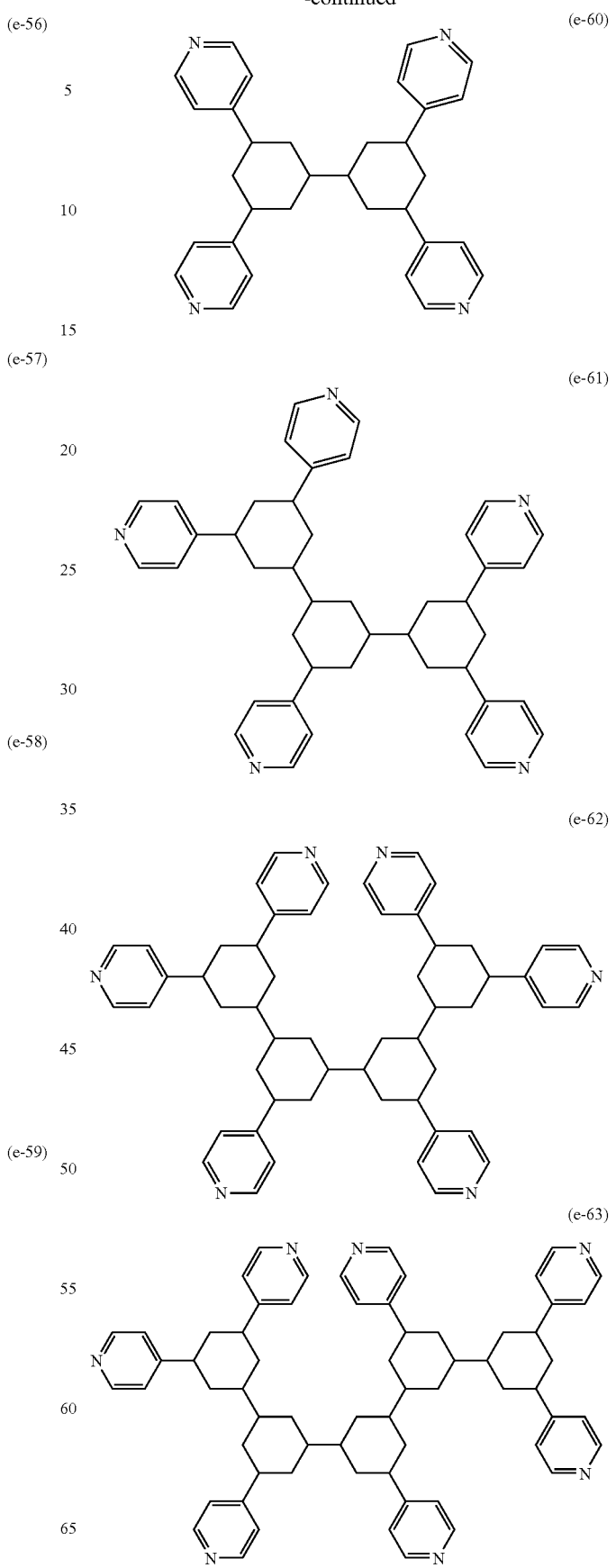

Here, n represents the polymerization degree, and the heterocycle-containing compound represented by general formula (e-59) above is a compound wherein n is any number between 5-20.
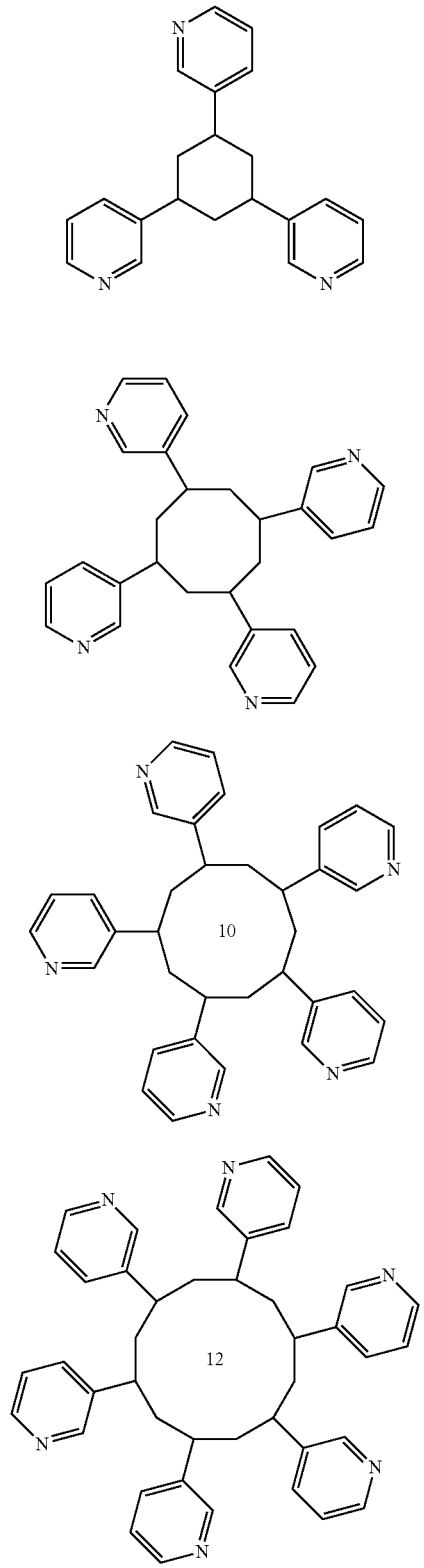
(e-64)
(e-65)
(e-66)
(e-67)
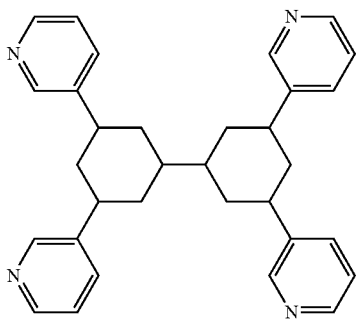
(e-68)
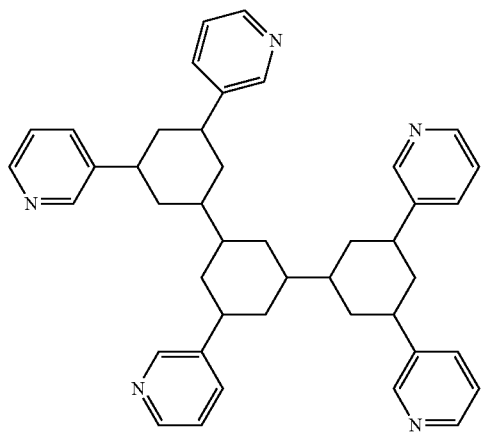
(e-69)
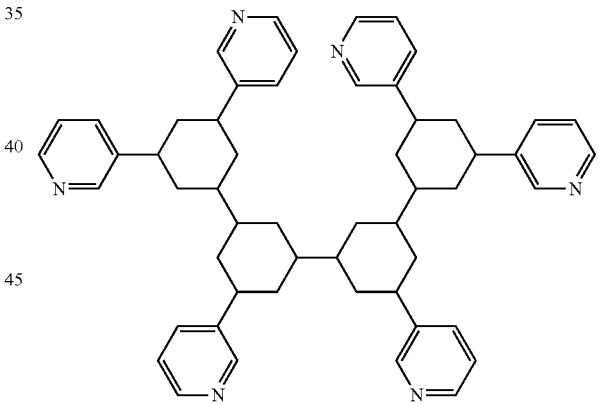
(e-70)
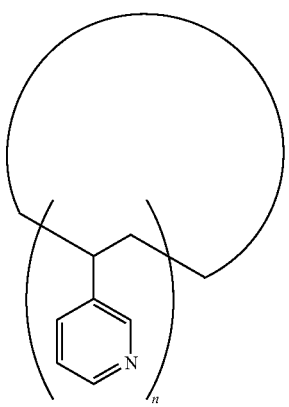
(e-71)
n = 5-20

Here, n represents the polymerization degree, and the heterocycle-containing compound represented by general formula (e-71) above is a compound wherein n is any number between 5-20.
(e-72)
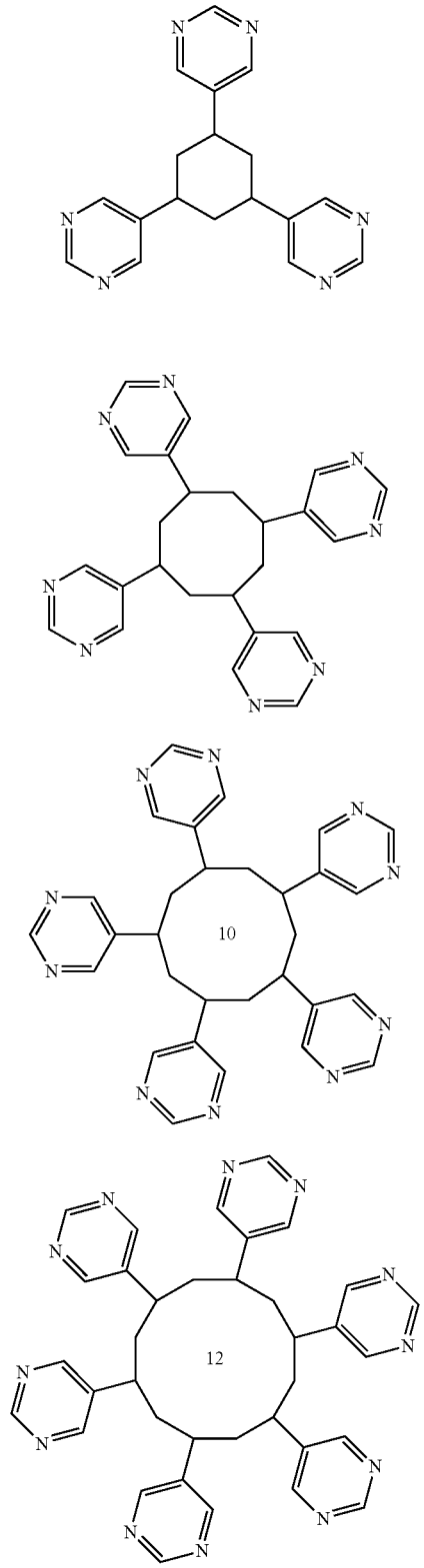
(e-73)
(e-74)
(e-75)
(e-76)
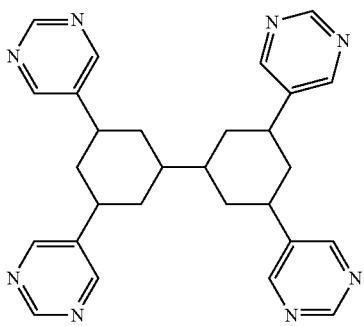
(e-77)
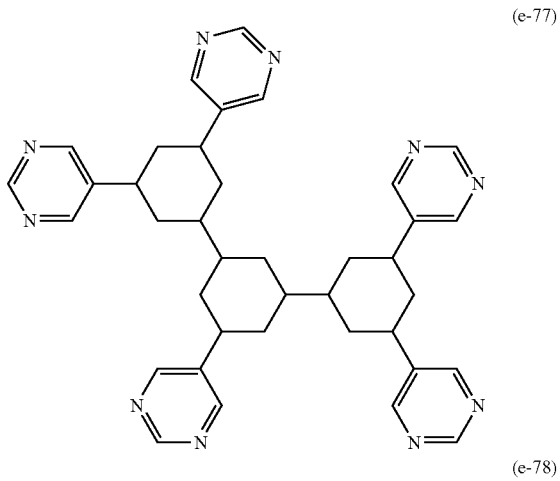
(e-78)
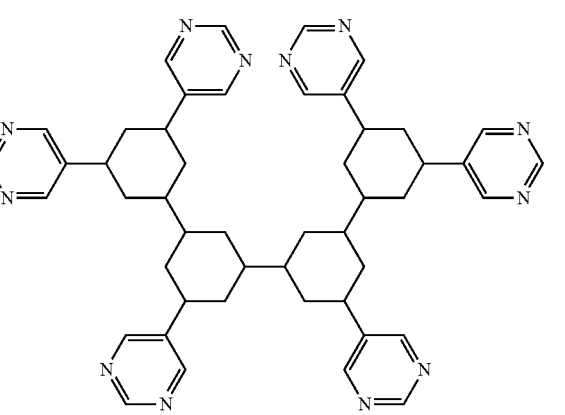
(e-79)
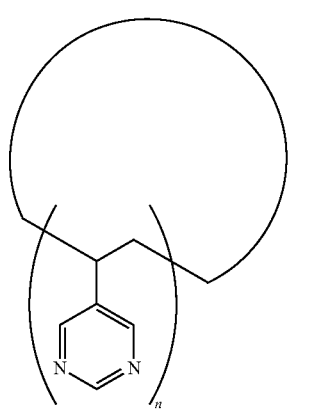
n = 5-20

Here, n represents the polymerization degree, and the heterocycle-containing compound represented by general formula (e-79) above is a compound wherein n is any number between 5-20.
(e-80)
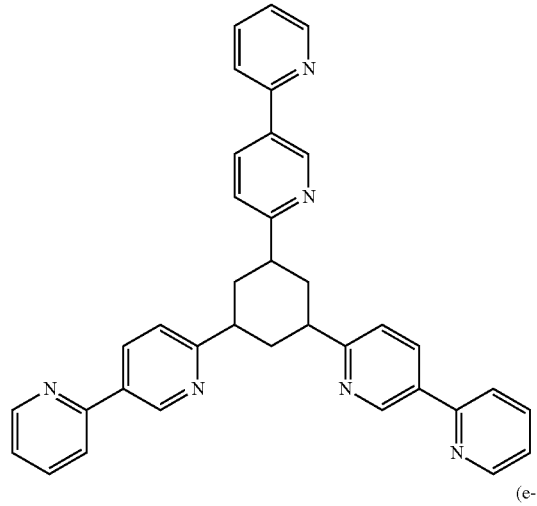
(e-81)
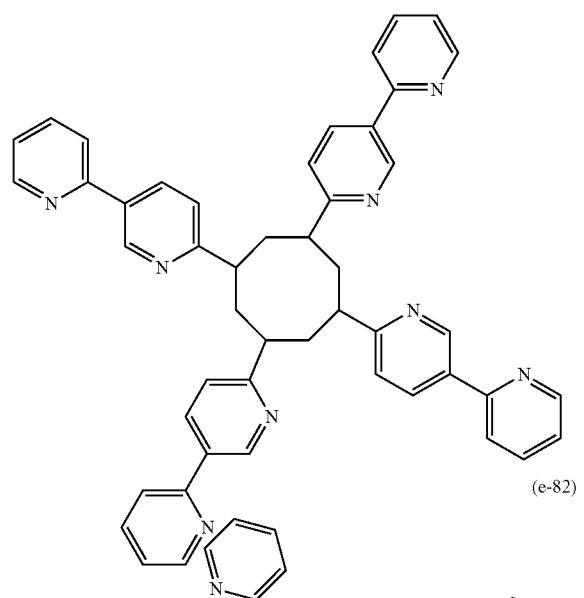
(e-82)
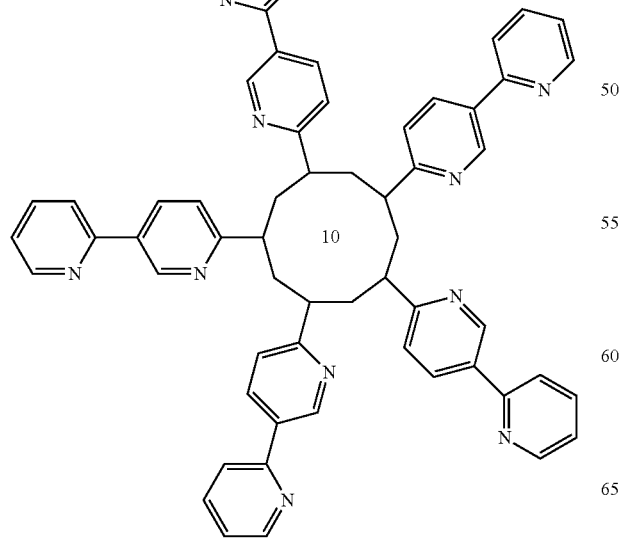
(e-83)
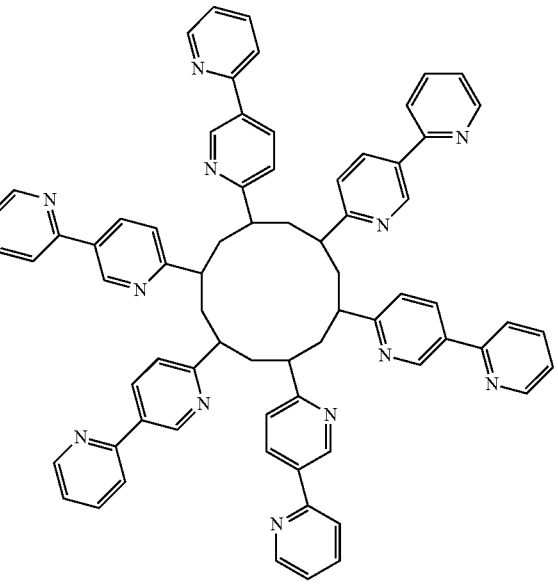
(e-84)
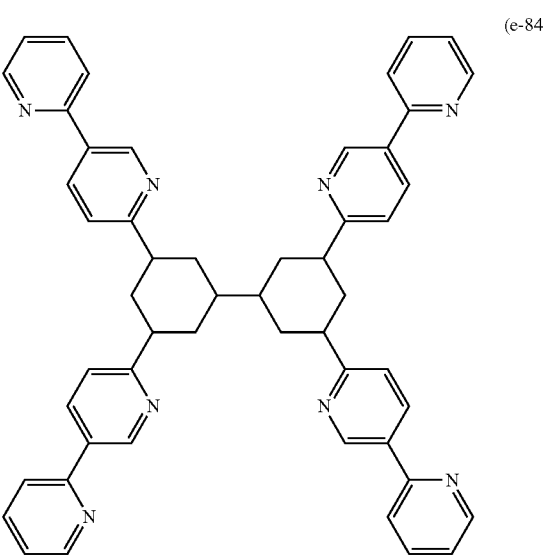
(e-85)
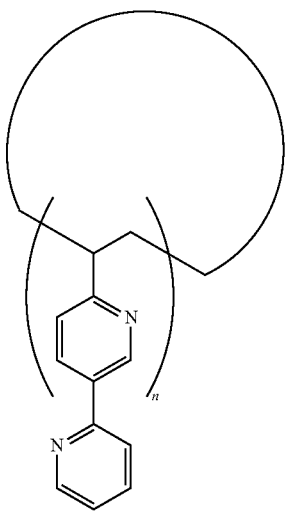
n = 4-20

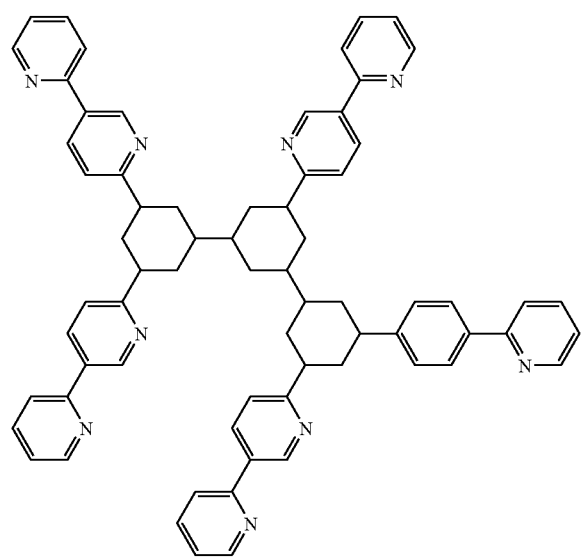
(e-86)
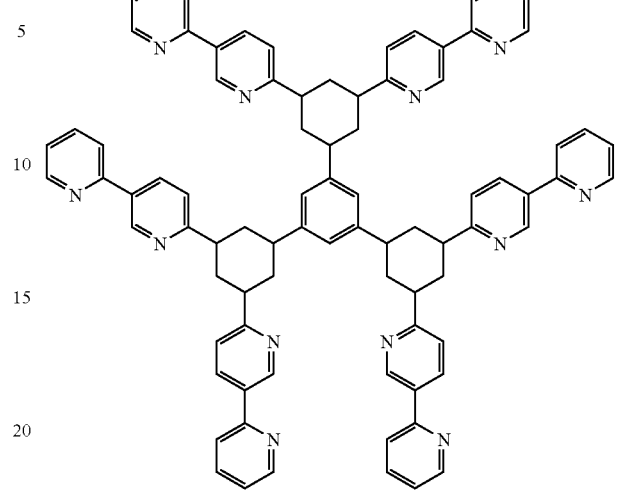
(e-88)
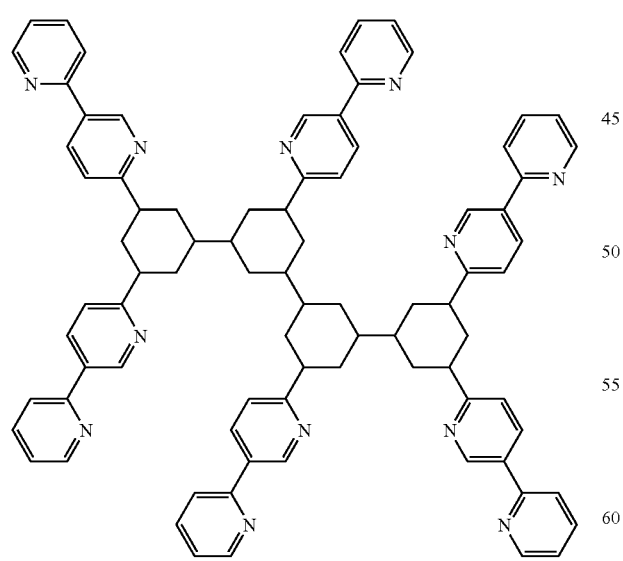
(e-87)
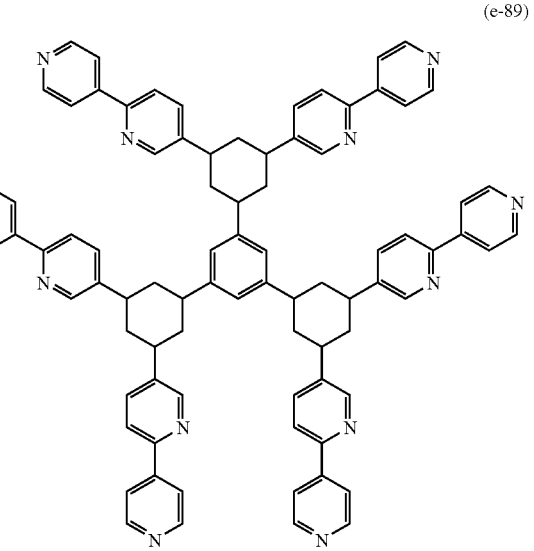
(e-89)
Here, n represents the polymerization degree, and the heterocycle containing compound represented by general formula (e-85) above is a compound wherein n is any number between 4-20.

(e-90)
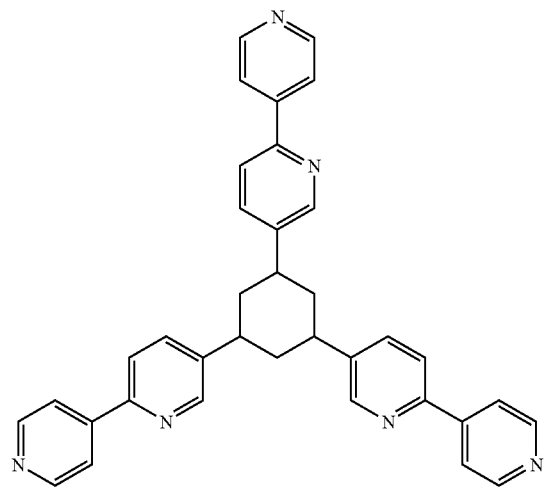
(e-92)
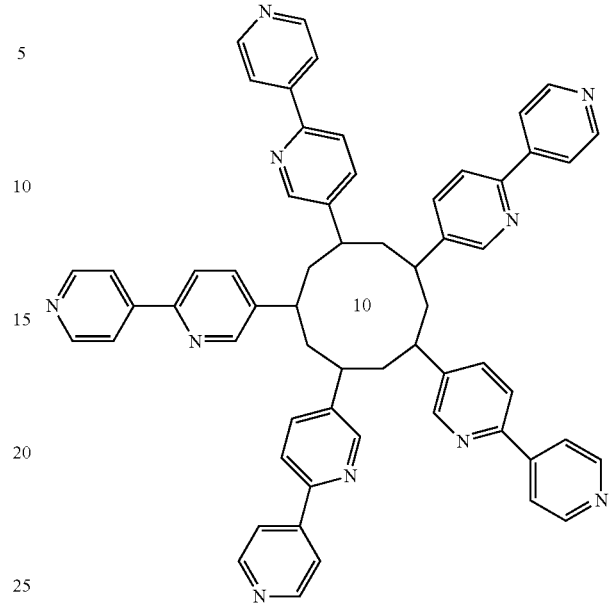
(e-91)
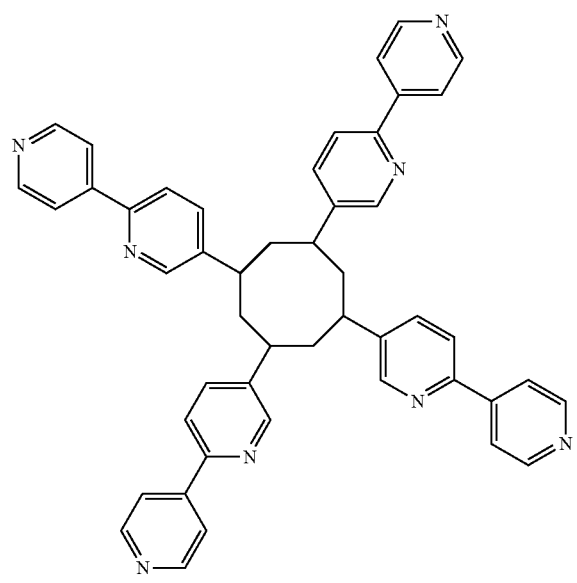
(e-93)
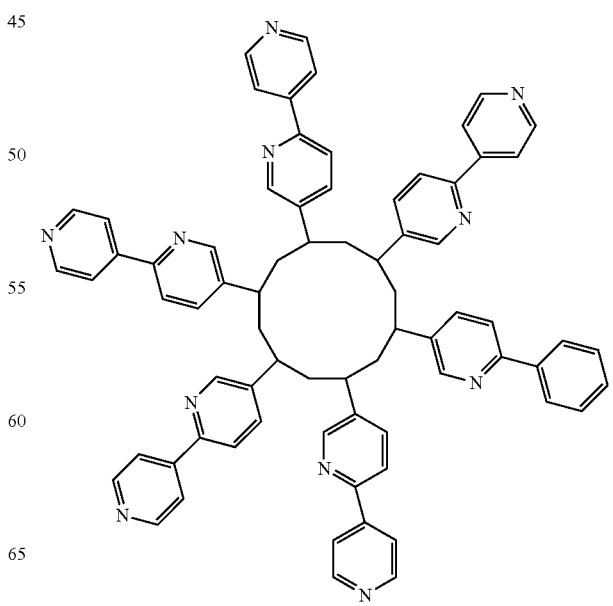

(e-94)
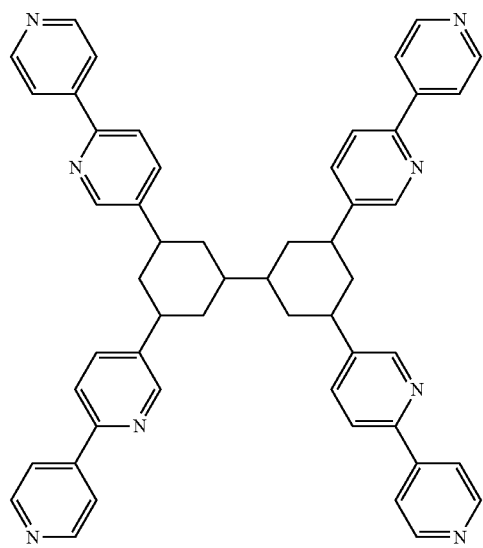
(e-96)
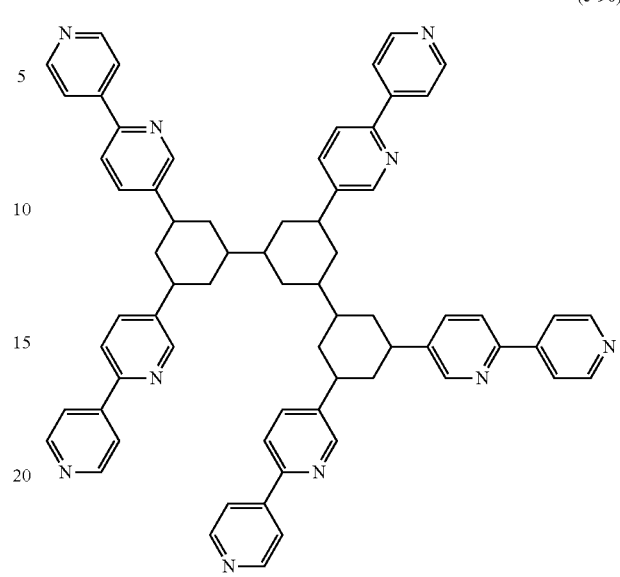
(e-95)
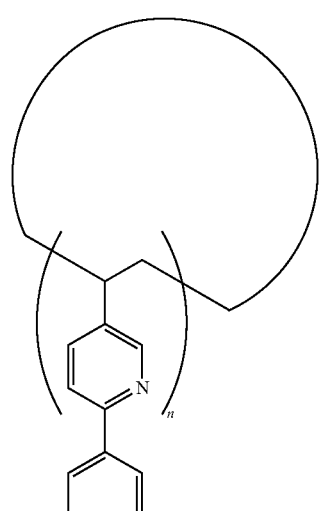
n = 4-20
(e-97)
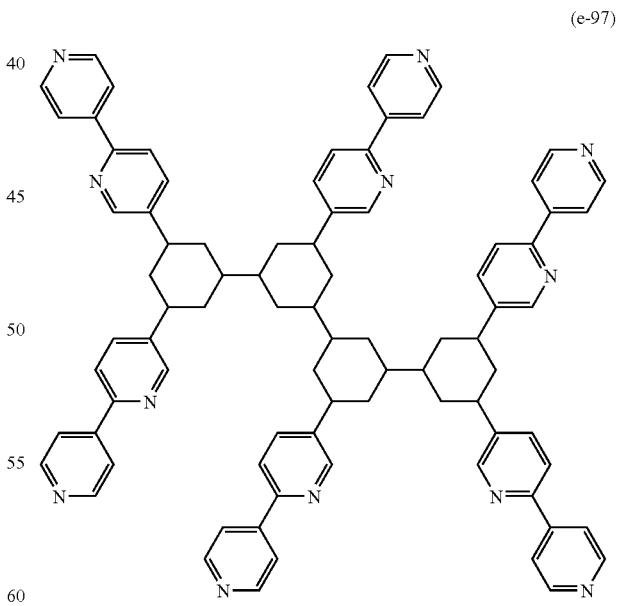
Here, n represents the polymerization degree, and the heterocycle-containing compound represented by general formula (e-95) above is a compound wherein n is any number between 4-20.

(e-98)
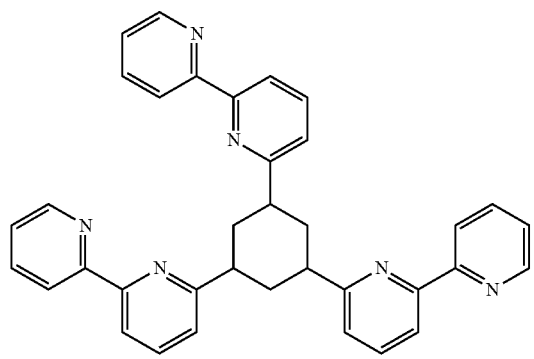
(e-99)
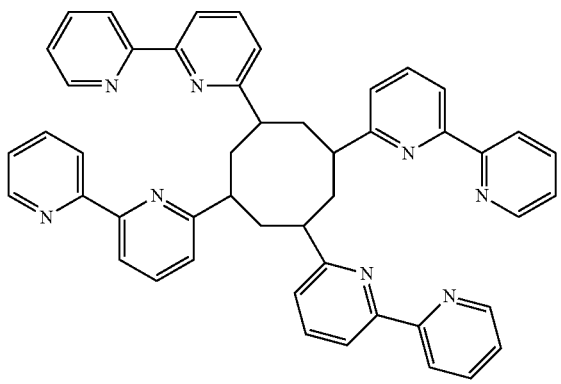
(e-100)
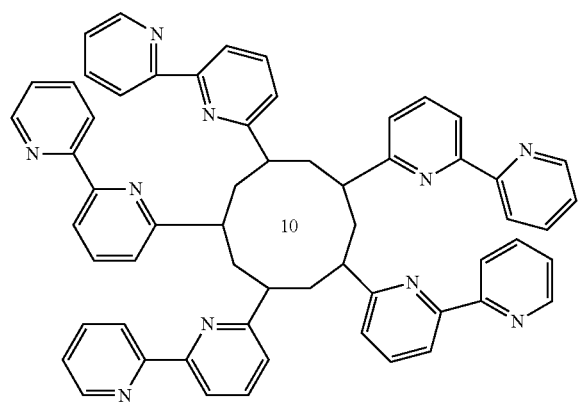
(e-101)
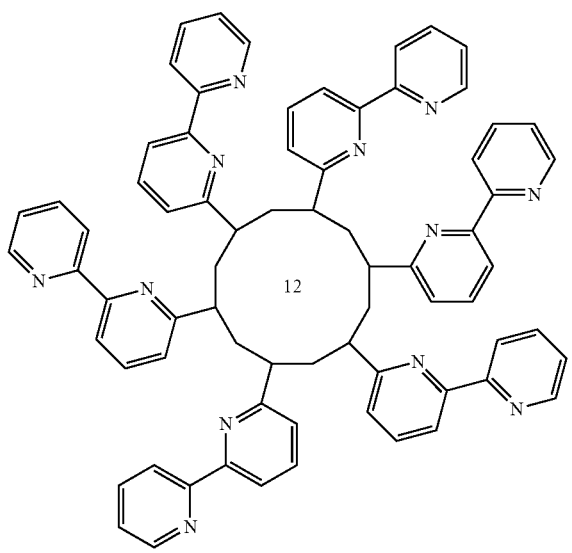
(e-102)
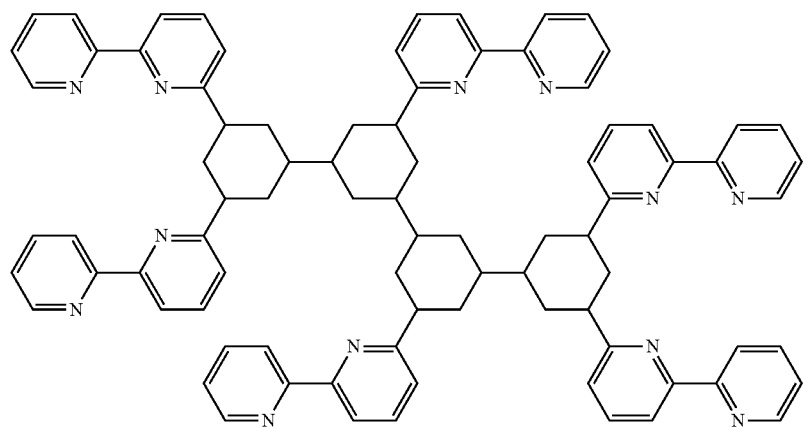

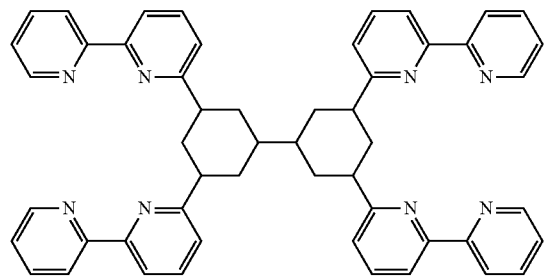
(e-103)
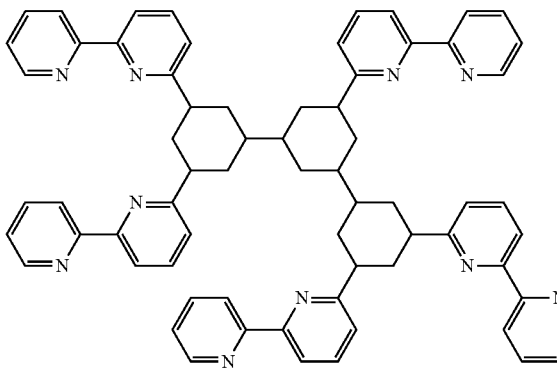
(e-104)
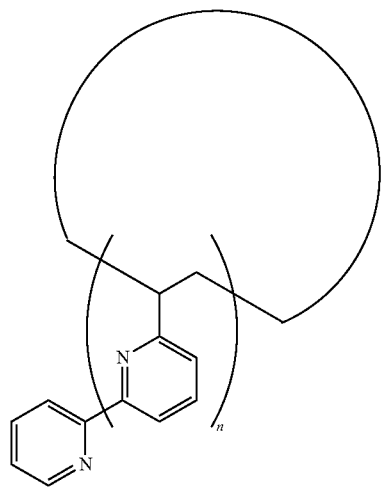
(e-105)
n = 7-20
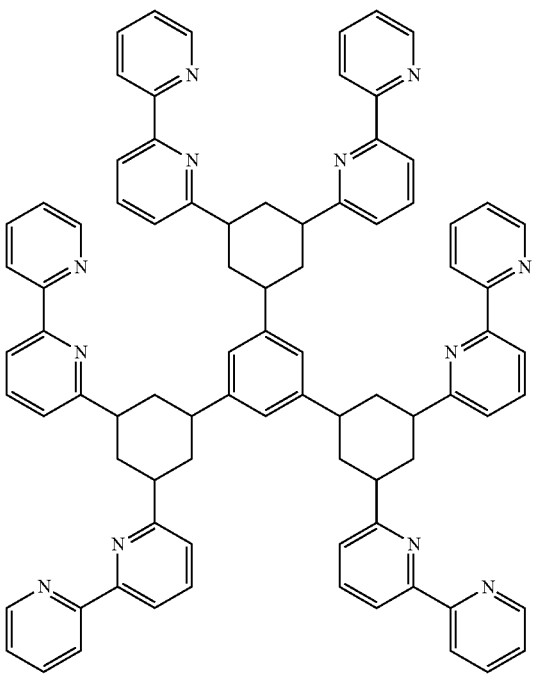
(e-106)
Here, n represents the polymerization degree, and the heterocycle-containing compound represented by general formula (e-105) above is a compound wherein n is any number between 7-20.
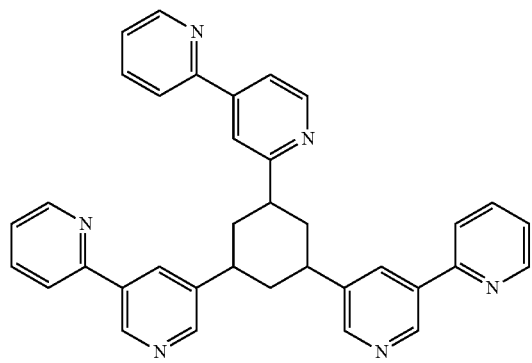
(e-107)
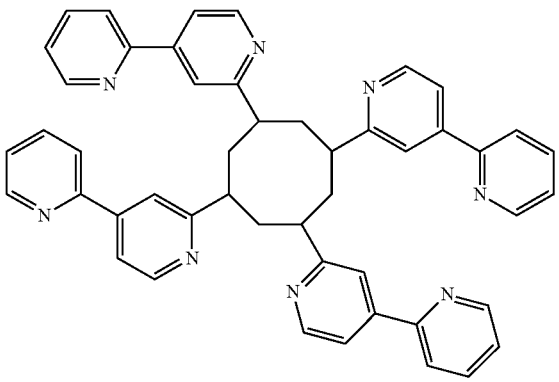
(e-108)

(e-109)
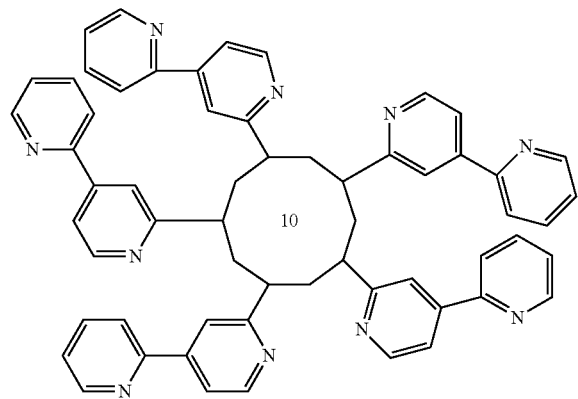
(e-110)
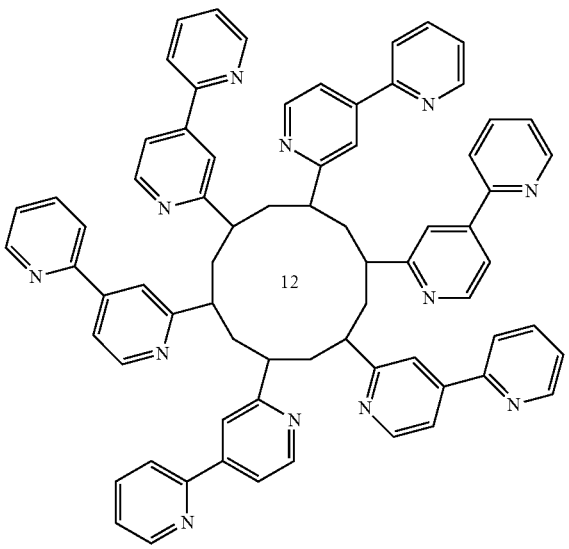
(e-111)
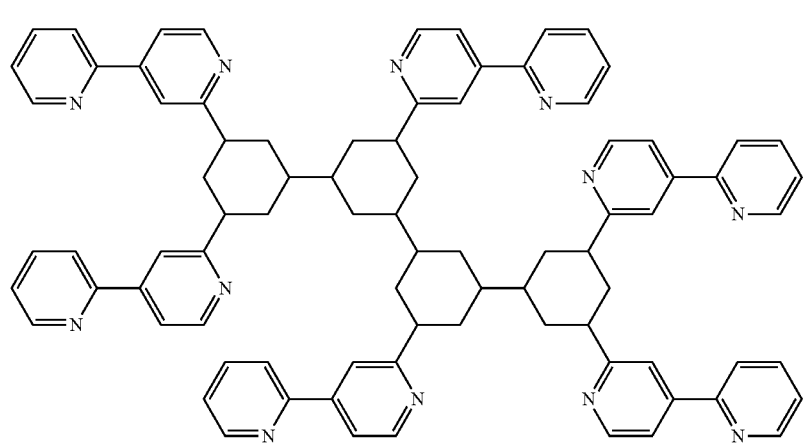
(e-112)
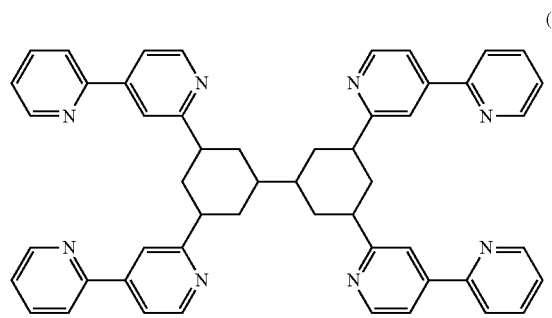
(e-113)
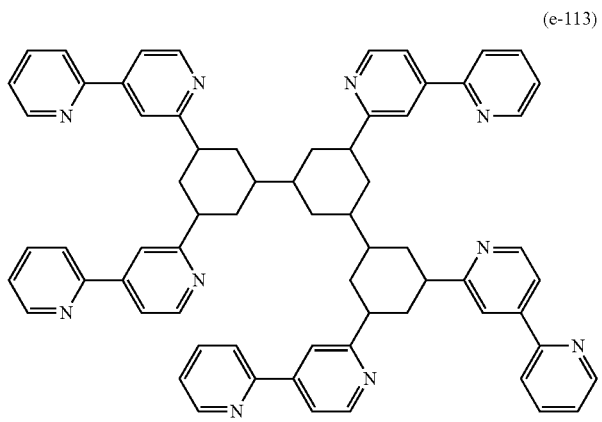

(e-114)
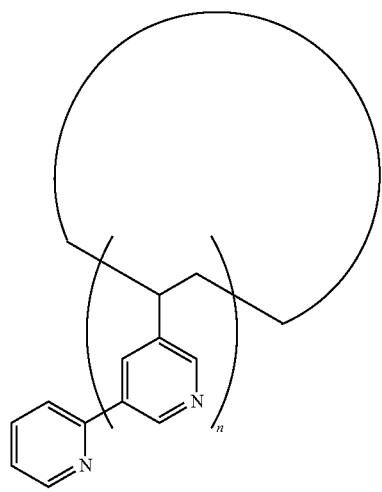
n = 7-20
Here, n represents the polymerization degree, and the heterocycle-containing compound represented by general formula (e-114) above is a compound wherein n is any number between 7-20.
(e-115)
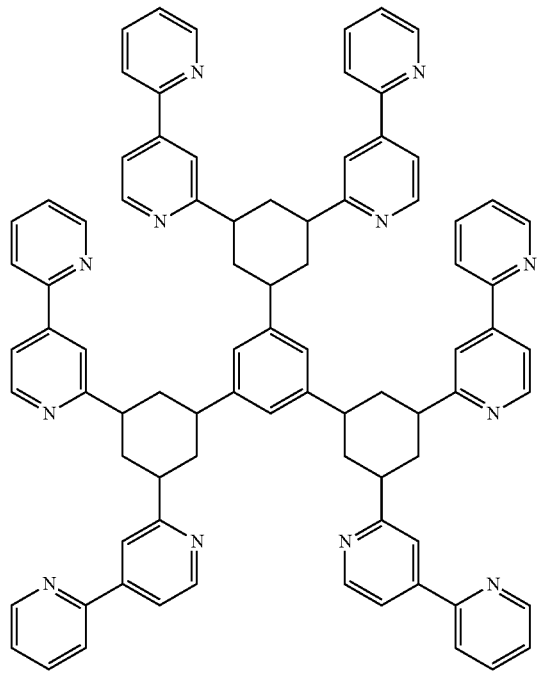
(e-116)
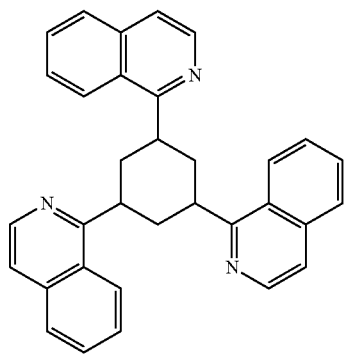
(e-117)
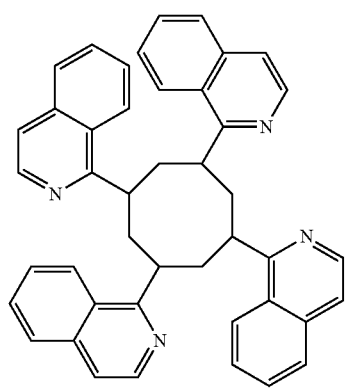
(e-118)
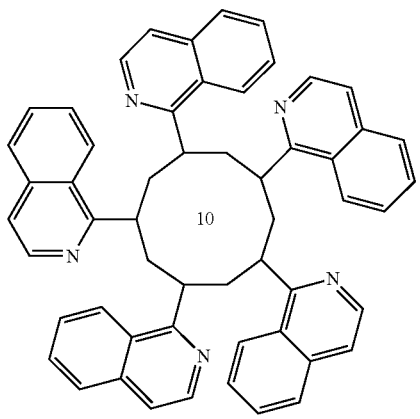
(e-119)
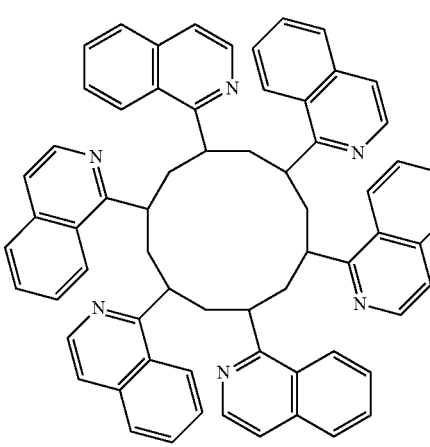

(e-120)
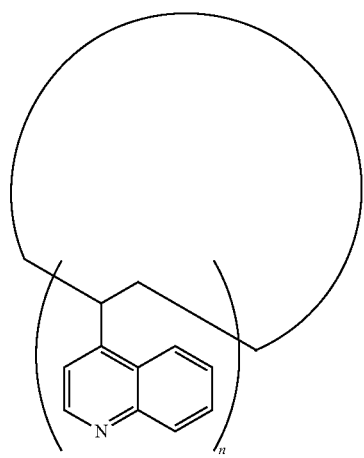
n = 4-15
(e-121)
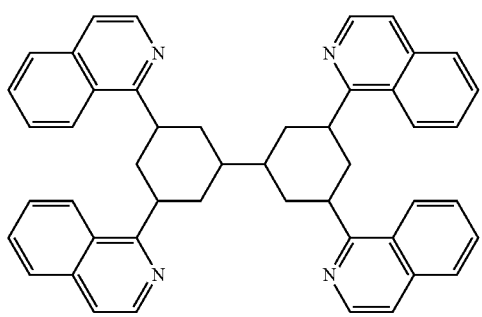
(e-122)
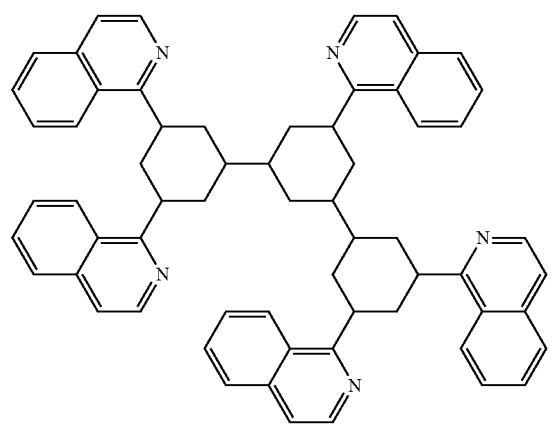
(e-123)
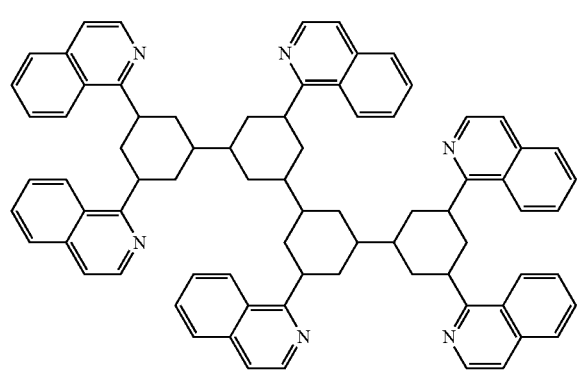
(e-124)
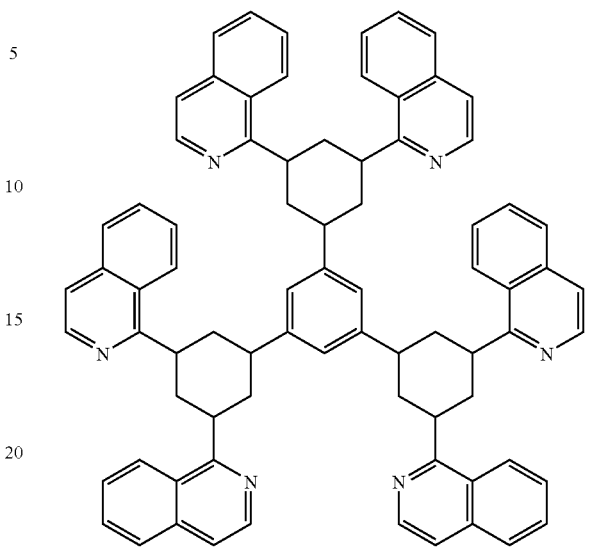
Here, n represents the polymerization degree, and the heterocycle-containing compound represented by general formula (e-120) above is a compound wherein n is any number between 4-15.
(e-125)
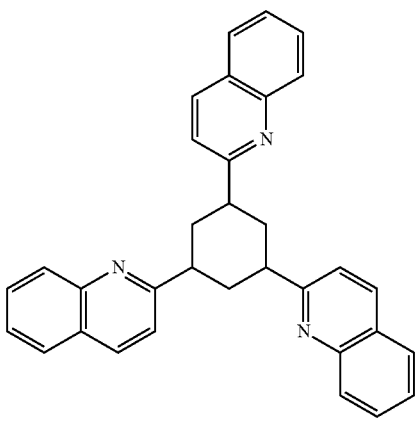
(e-126)
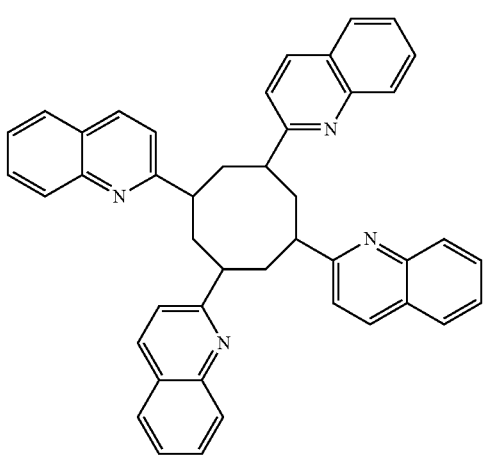

-continued
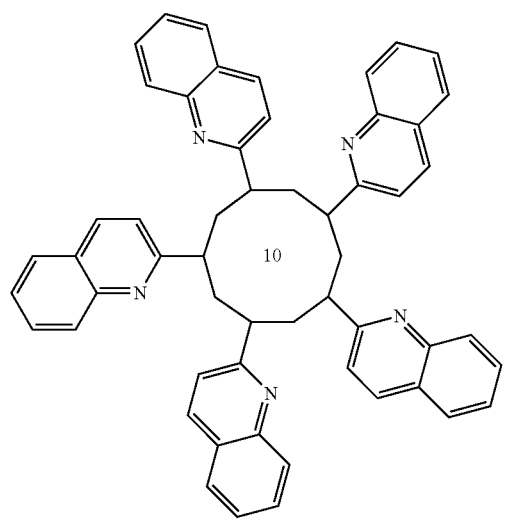
(e-127)
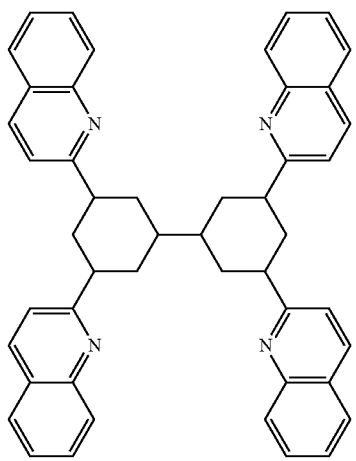
(e-130)
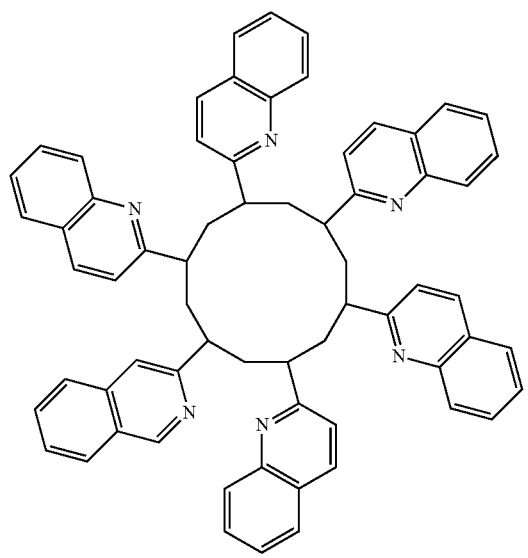
(e-128)
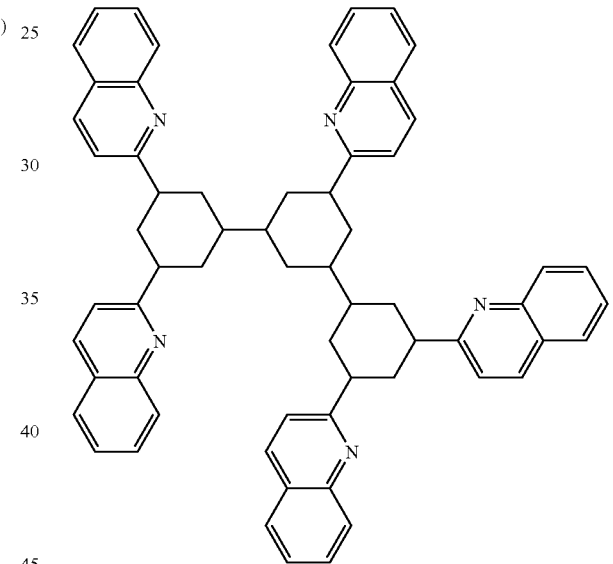
(e-131)
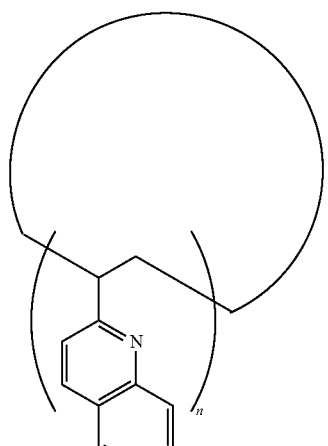
(e-129)
n = 4-20
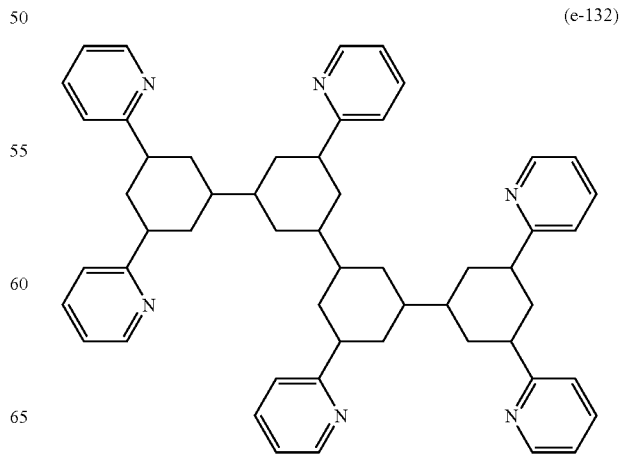
(e-132)

(e-133)
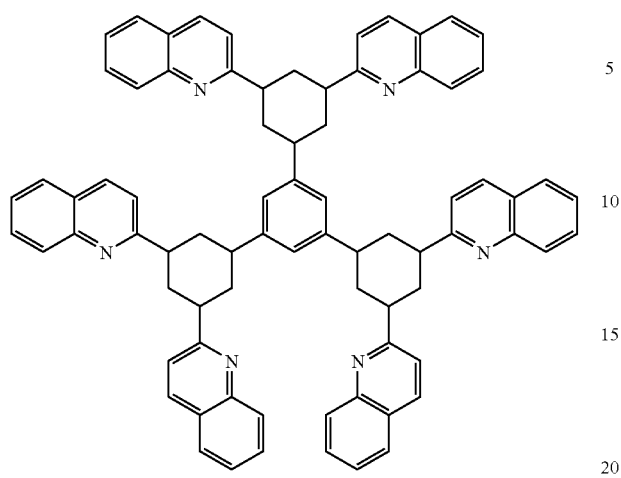
Here, n represents the polymerization degree, and the heterocycle-containing compound represented by general formula (e-129) above is a compound wherein n is any number between 4-20.
(e-134)
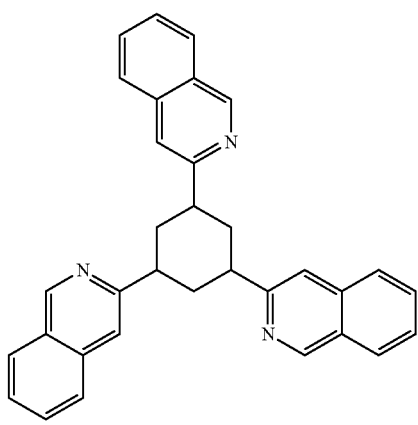
(e-135)
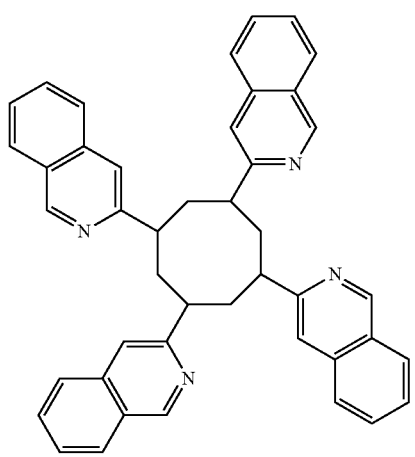
(e-136)
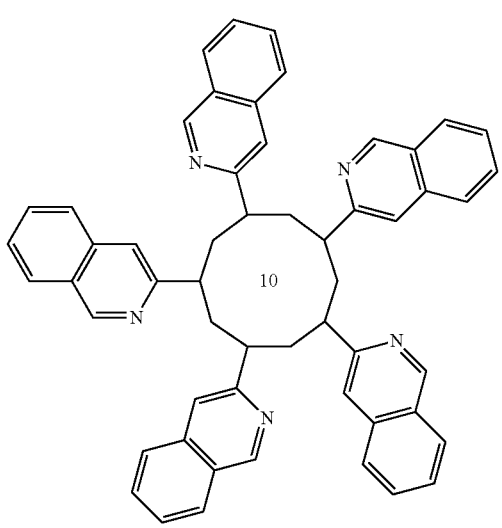
(e-137)
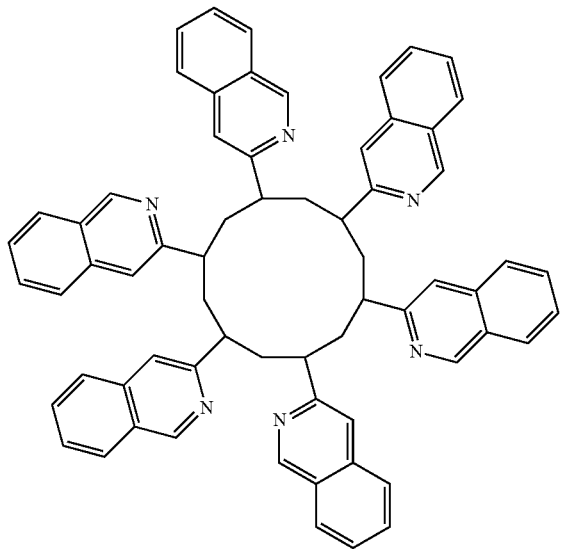
(e-138)
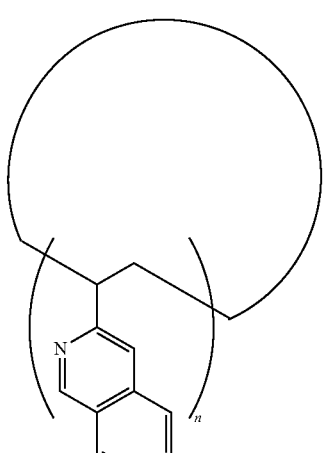
n = 4-20

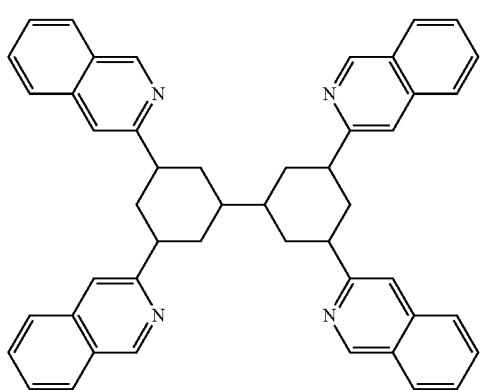
(e-139)
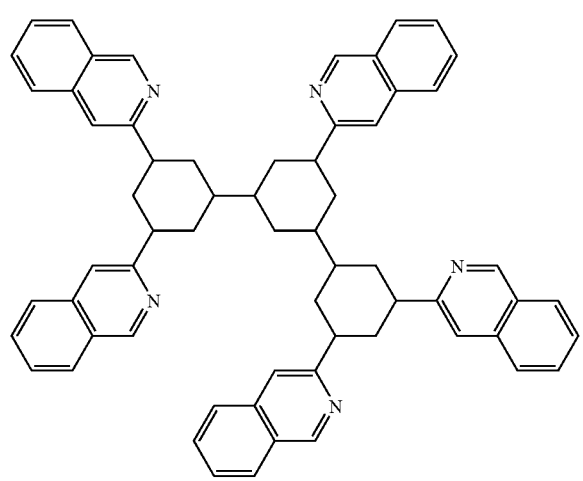
(e-140)
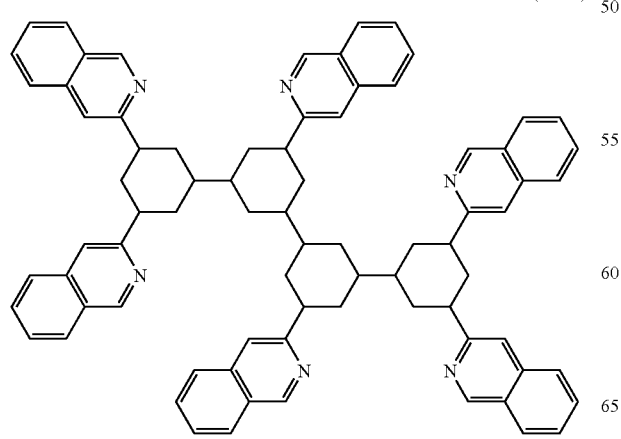
(e-141)
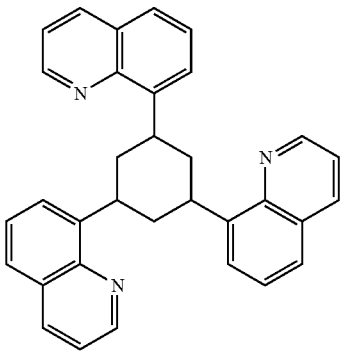
(e-142)
Here, n represents the polymerization degree, and the heterocycle-containing compound represented by general formula (e-138) above is a compound wherein n is any number between 4-20.
(e-143)
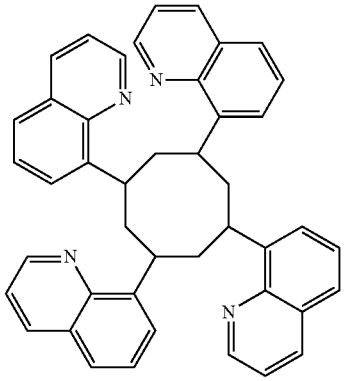
(e-144)

-continued
(e-145)
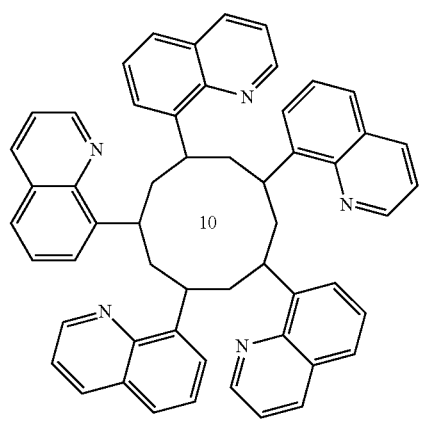
(e-146)
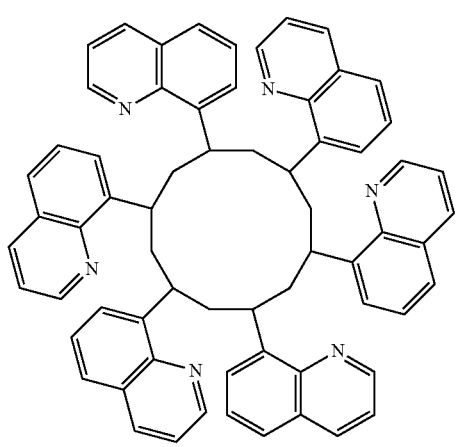
(e-147)
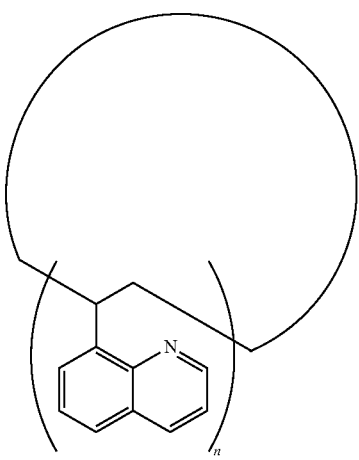
n = 5-20
-continued
(e-148)
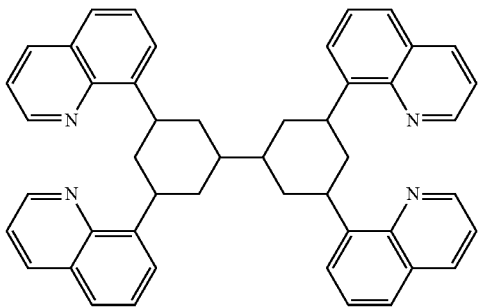
(e-149)
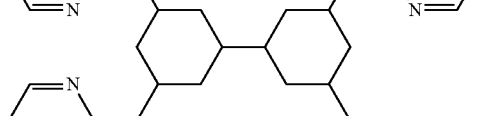
(e-150)
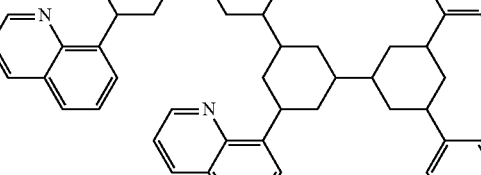
(e-151)
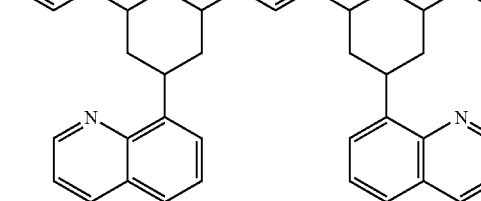

Here, n represents the polymerization degree, and the heterocycle-containing compound represented by general formula (e-147) above is a compound wherein n is any number between 5-20.
(e-152)
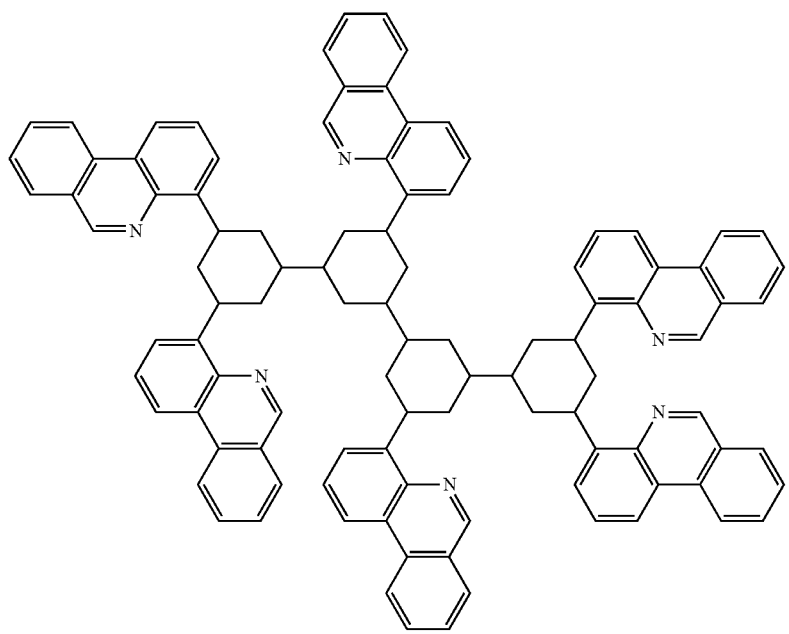
(e-153)
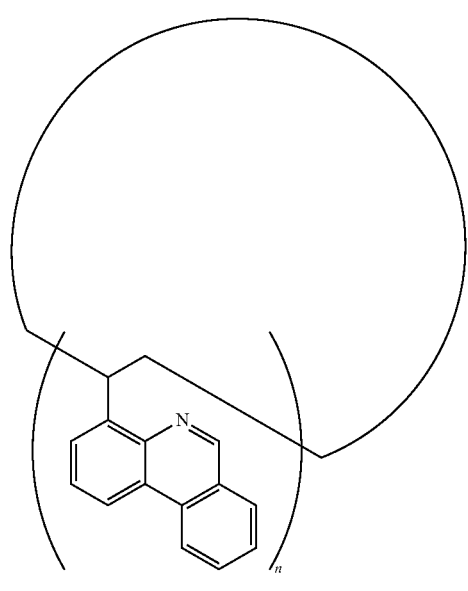
n = 4-15
(e-154)
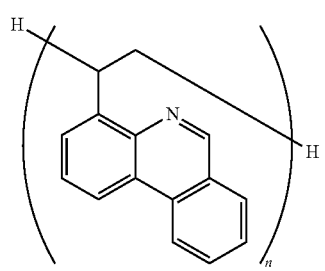
n = 4-15

-continued
(e-155)
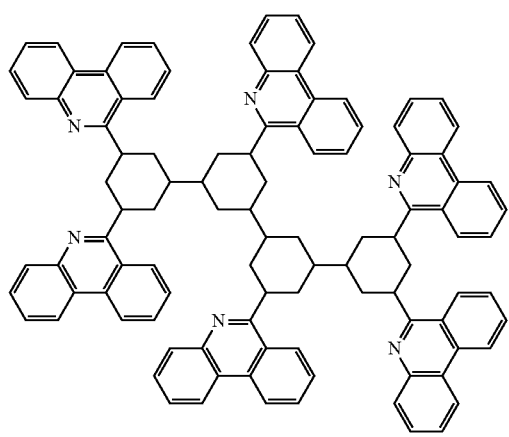
(e-156)
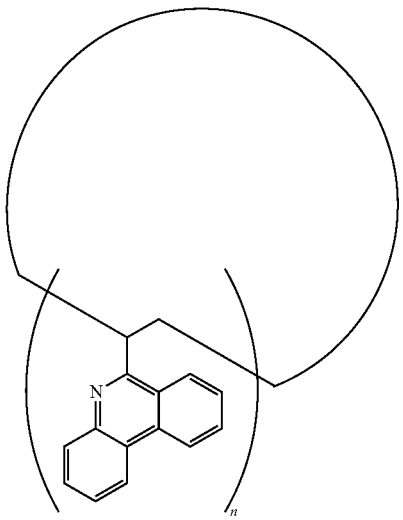
n = 4-15
(e-157)
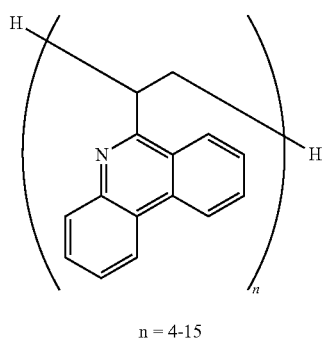
n = 4-15
(e-158)
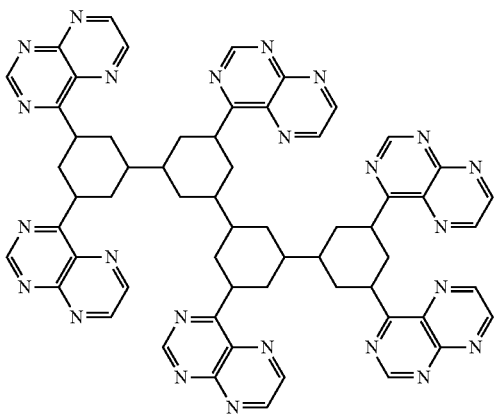
(e-159)
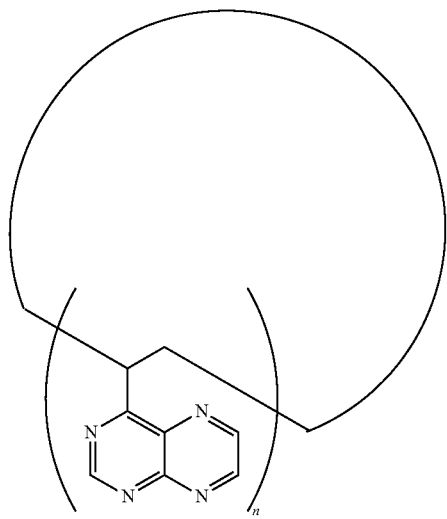
n = 4-15
(e-160)
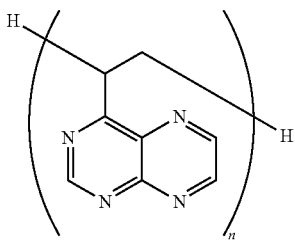
n = 4-15

(e-161)
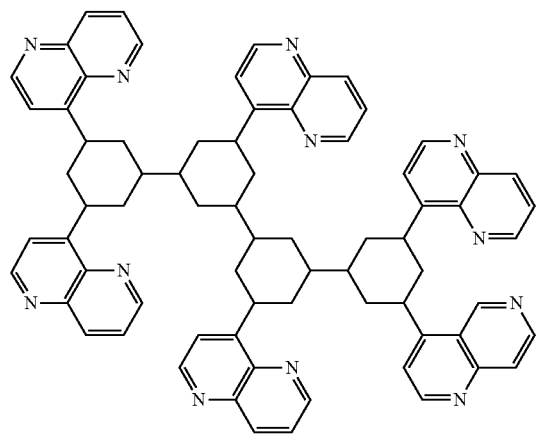
(e-162)
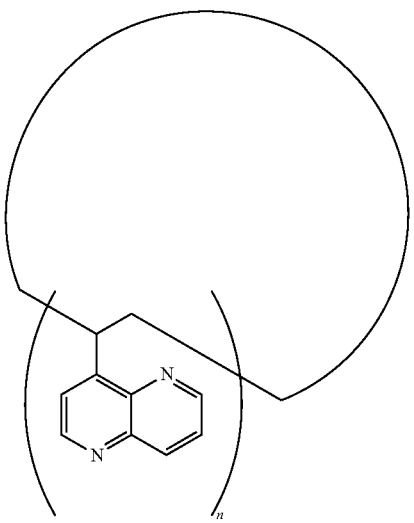
n = 4-15
(e-163)
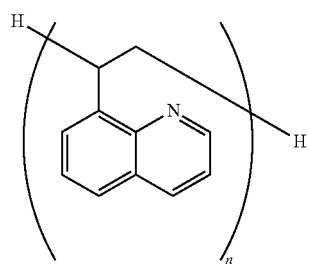
n = 4-15
Here, n represents the polymerization degree, and the heterocycle-containing compounds represented by general formulas (e-153), (e-154), (e-156), (e-157), (e-159), (e-160), (e-162) and (e-163) above are compounds wherein n is any number between 4-15.
(e-164)
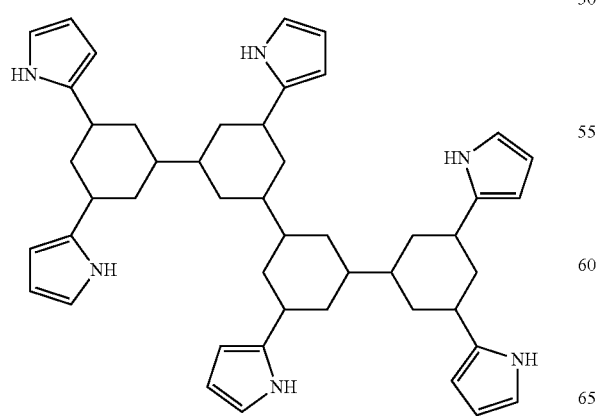
(e-165)
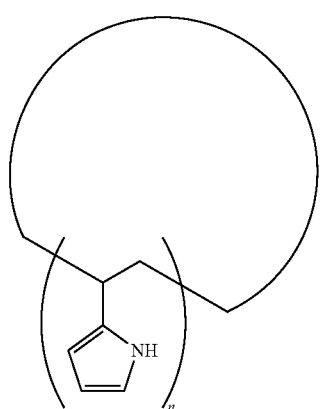
n = 4-20
(e-166)
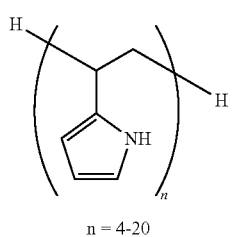
n = 4-20

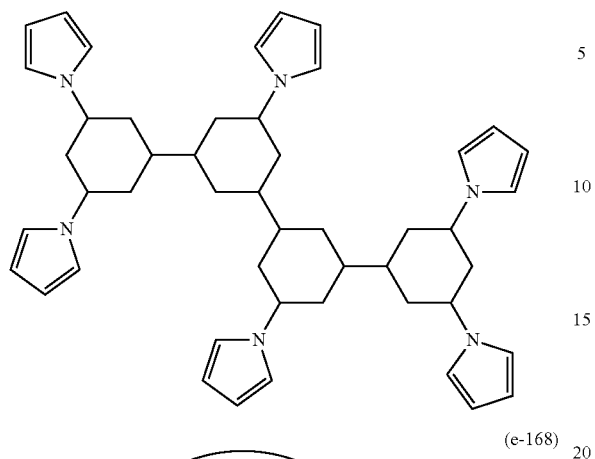
(e-167)
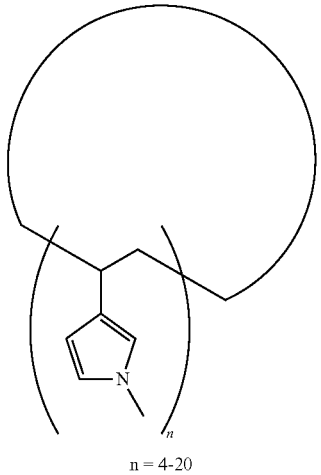
(e-171)
n = 4-20
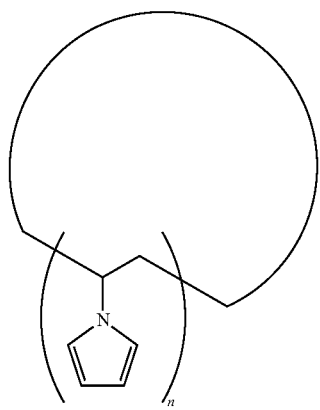
(e-168)
n = 4-20
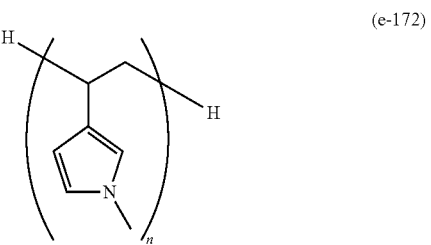
(e-172)
n = 4-20
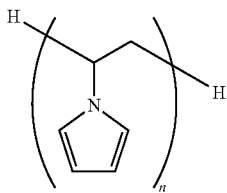
(e-169)
n = 4-20
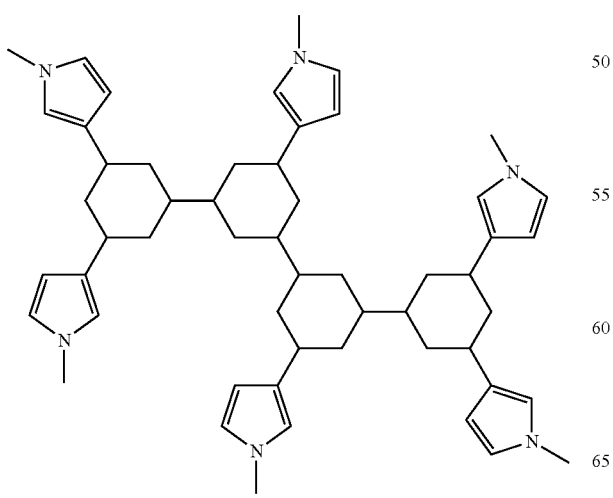
(e-170)
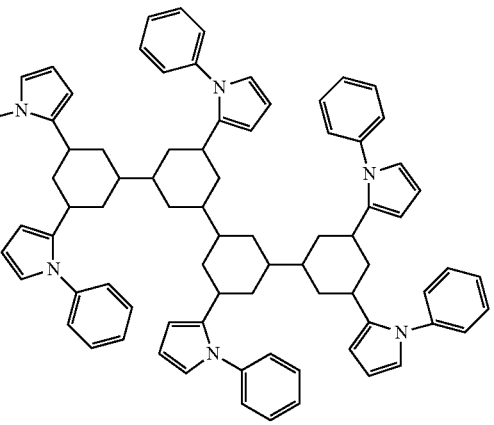
(e-173)

-continued
(e-174)
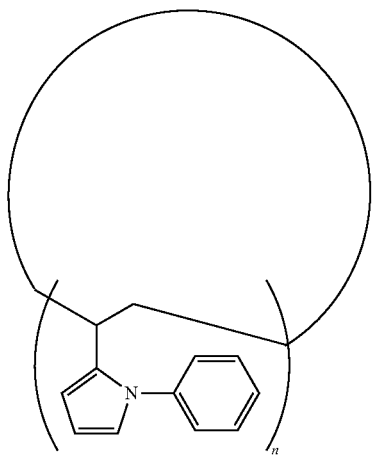
n = 4-20
(e-175)
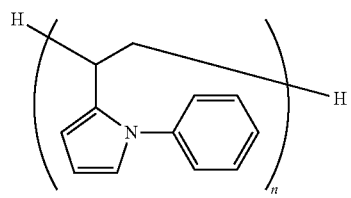
n = 4-20
Here, a represents the polymerization degree, and the heterocycle-containing compounds represented by general formulas (e-165), (e-166), (e-168), (e-169), (e-171), (e-172), (e-174) and (e-175) above are compounds wherein n is any number between 4-20.
(e-176)
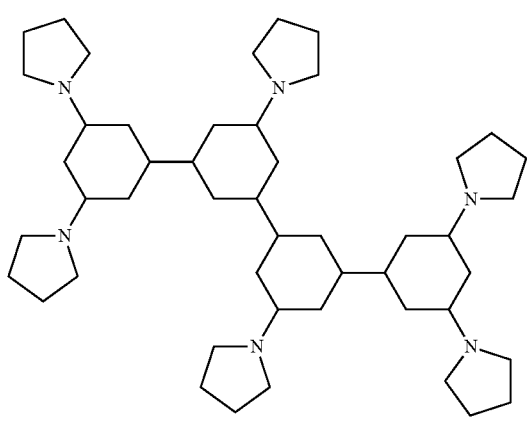
-continued
(e-177)
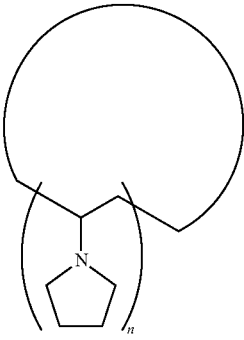
n = 4-20
(e-178)
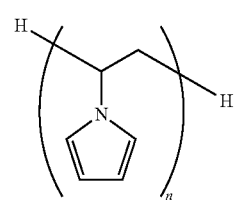
n = 4-20
(e-179)
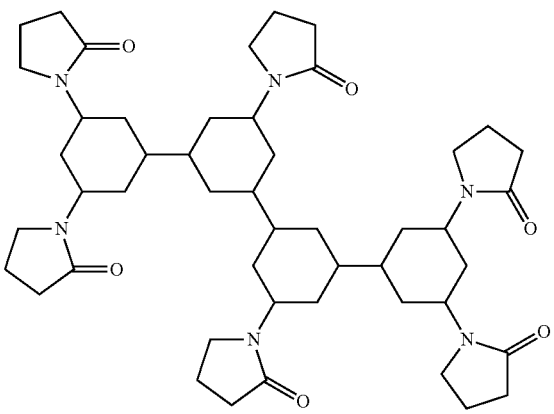
(e-180)
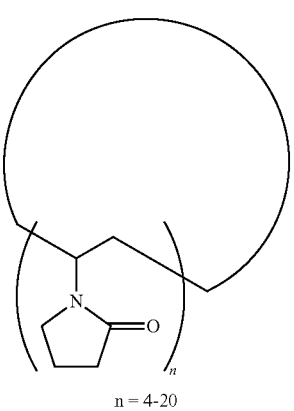
n = 4-20

(e-181)
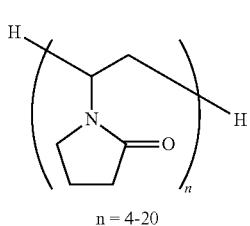
n = 4-20
(e-182)
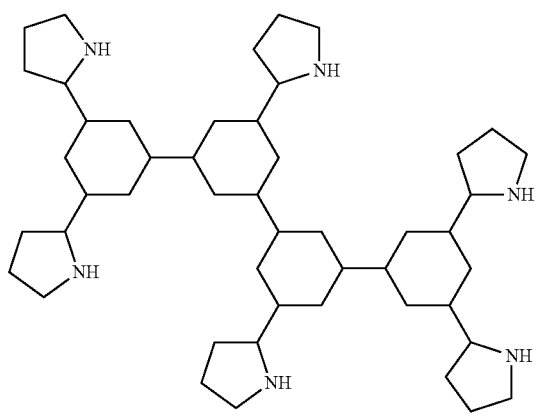
(e-183)
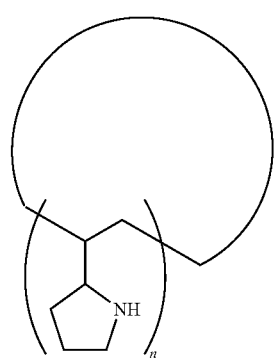
n = 4-20
(e-184)
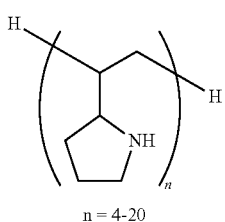
n = 4-20
(e-185)
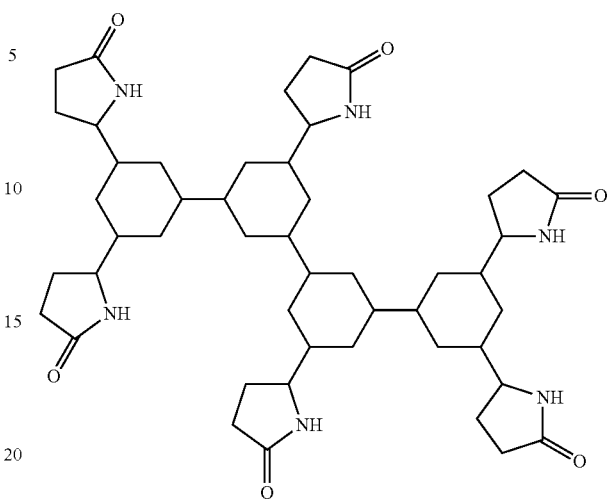
(e-186)
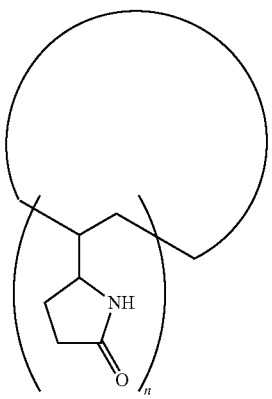
n = 4-20
(e-187)
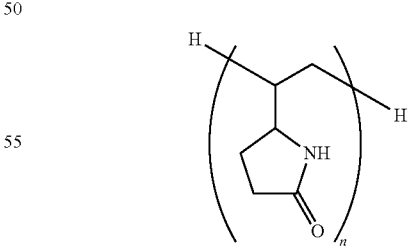
n = 4-20
Here, n represents the polymerization degree, and the heterocycle-containing compounds represented by general formulas (e-177), (e-178), (e-180), (e-181), (e-183), (e-184), (e-186) and (e-187) above are compounds wherein n is any number between 4-20.

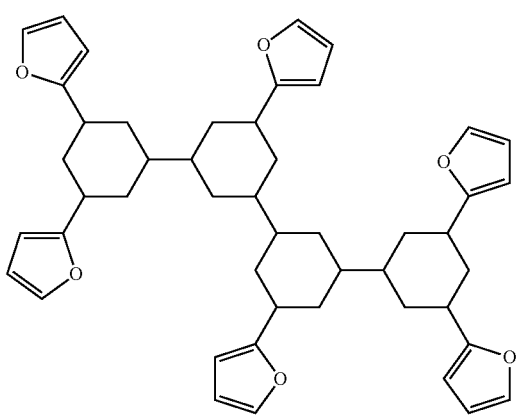
(e-188)
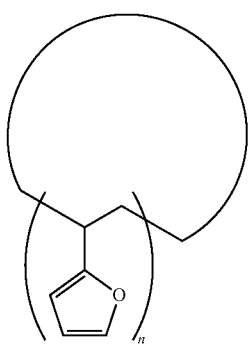
(e-189)
n = 4-20
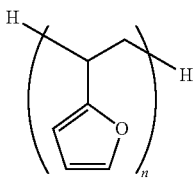
(e-190)
n = 4-20
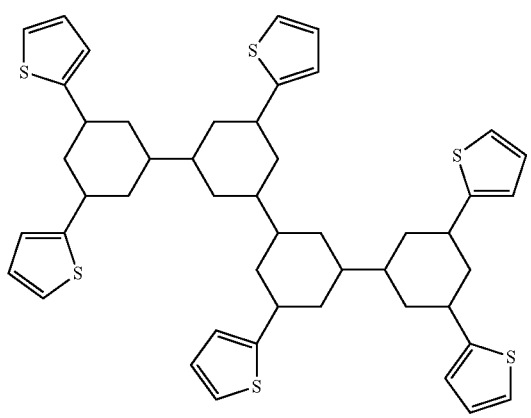
(e-191)
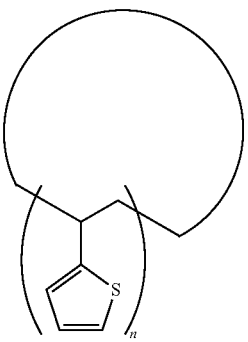
(e-192)
n = 4-20
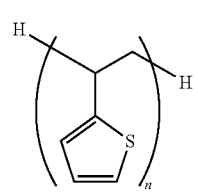
(e-193)
n = 4-20
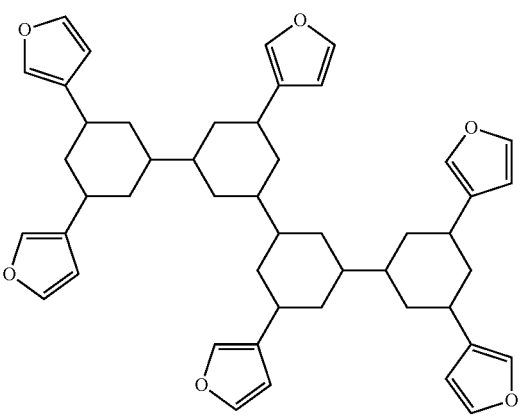
(e-194)
(e-195)
n = 4-20
(e-196)
n = 4-20

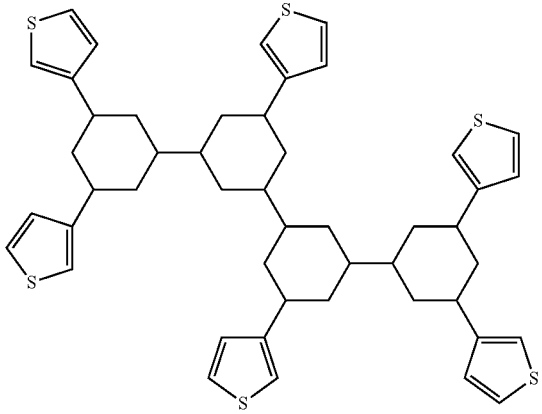
(e-197)
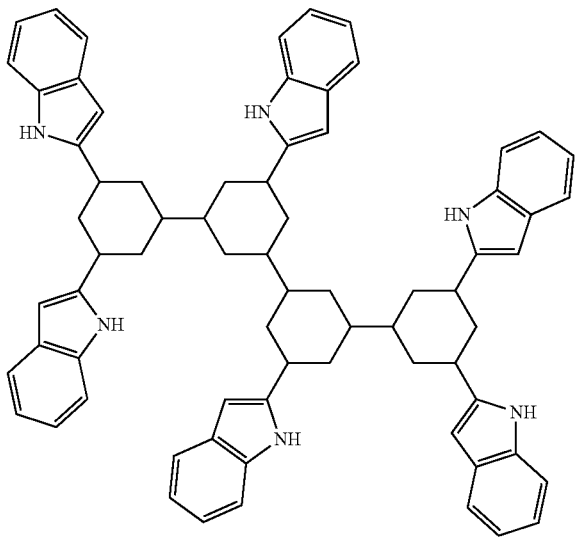
(e-200)
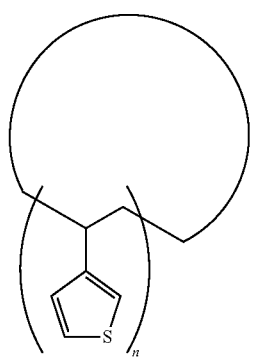
(e-198)
n = 4-20
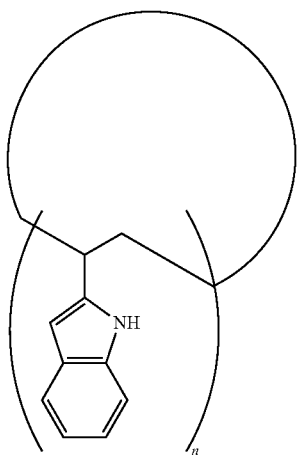
(e-201)
n = 4-20
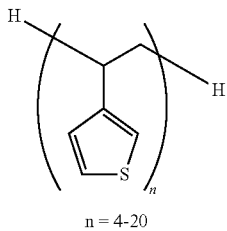
(e-199)
n = 4-20
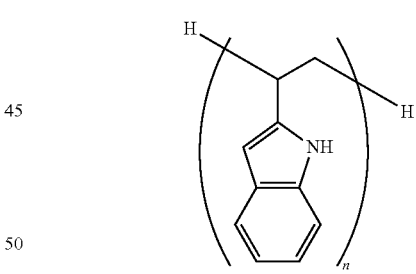
(e-202)
n = 4-20
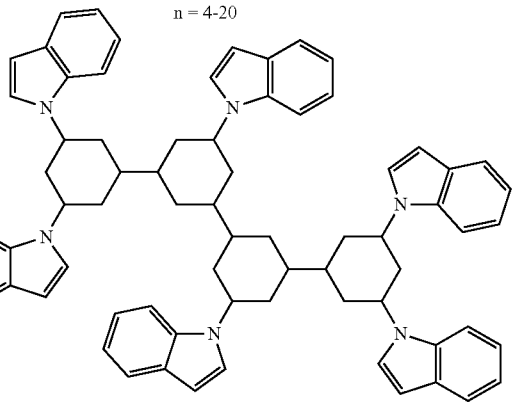
(e-203)
Here, n represents the polymerization degree, and the heterocycle-containing compounds represented by general formulas (e-189), (e-190), (e-192), (e-193), (e-195), (e-196), (e-198) and (e-199) above are compounds wherein n is any number between 4-20.

-continued
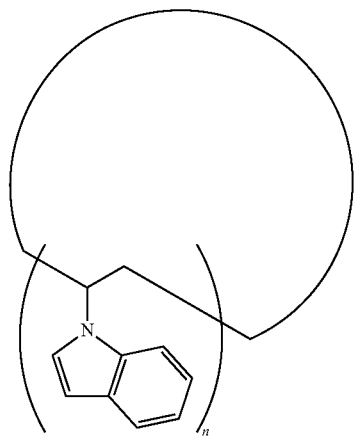
(e-204)
n = 4-20
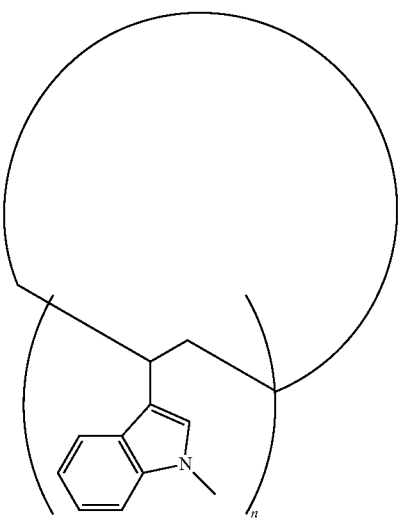
(e-207)
n = 4-20
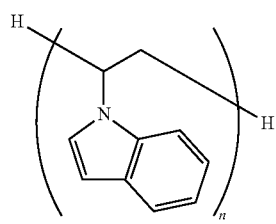
(e-205)
n = 4-20
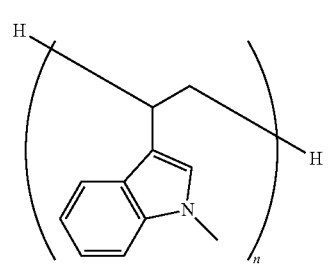
(e-208)
n = 4-20
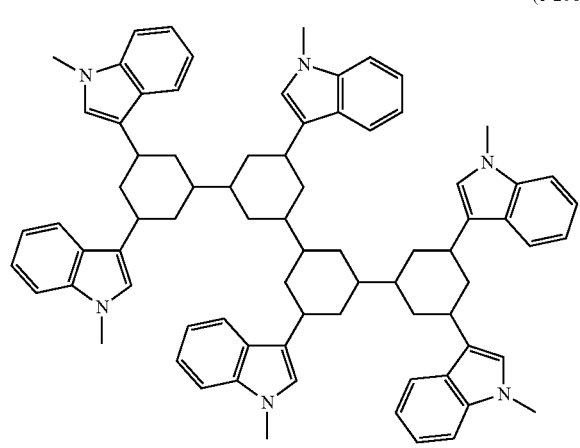
(e-206)
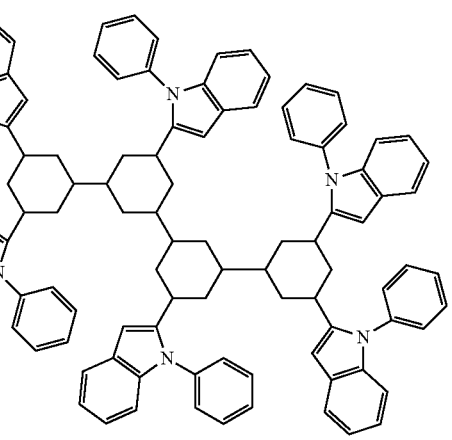
(e-209)

(e-210)
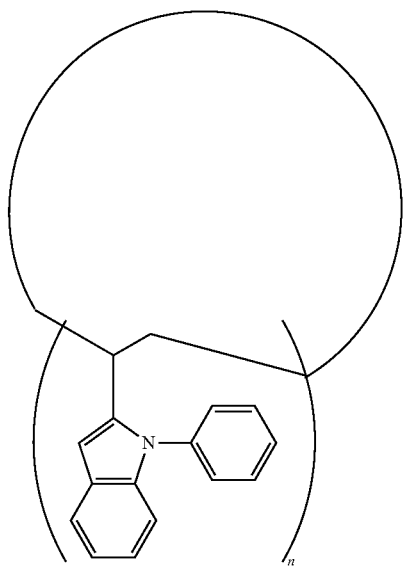
n = 4-20
(e-211)
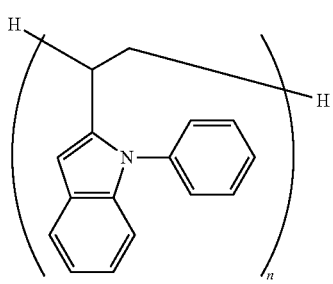
n = 4-20
Here, n represents the polymerization degree, and the heterocycle-containing compounds represented by general formulas (e-201), (e-202), (e-204), (e-205), (e-207), (e-208), (e-210) and (e-211) above are compounds wherein n is any number between 4-20.
(e-212)
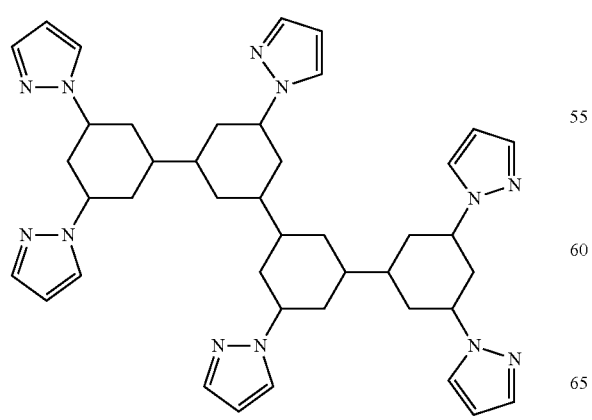
(e-213)
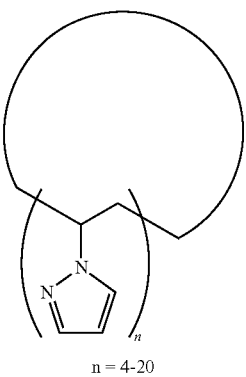
n = 4-20
(e-214)
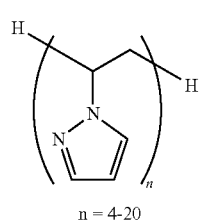
n = 4-20
(e-215)
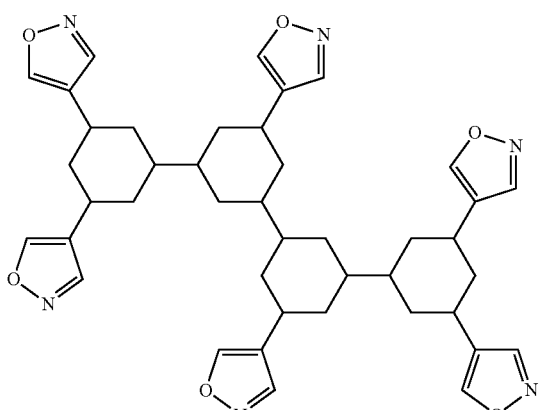
(e-216)
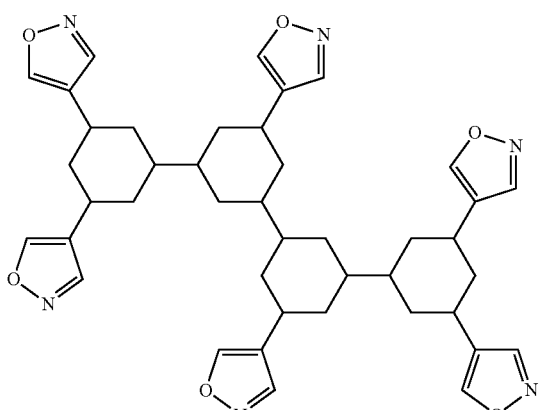
n = 4-20

(e-217)

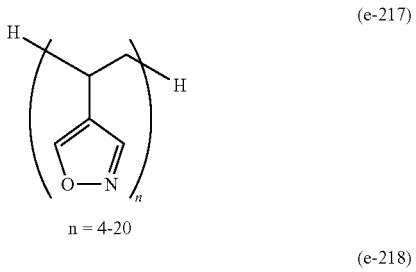

n = 4-20

(e-218)

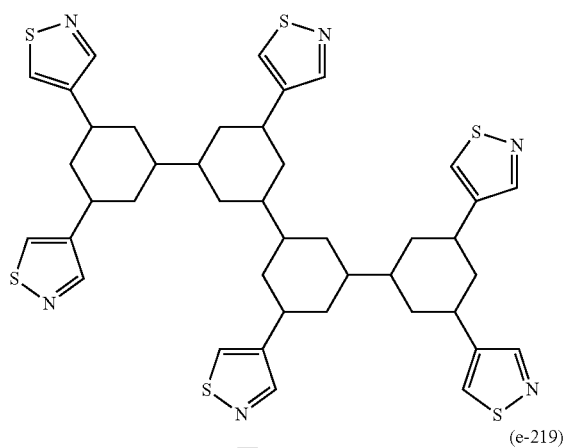

(e-219)

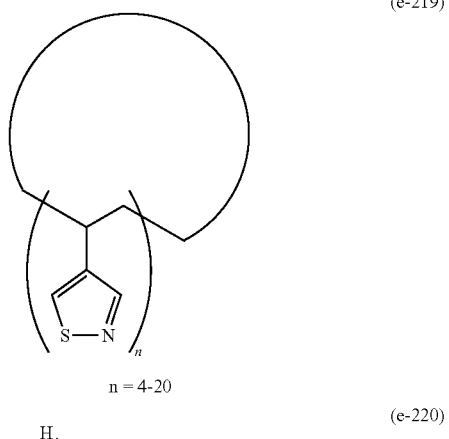

n = 4-20

(e-220)

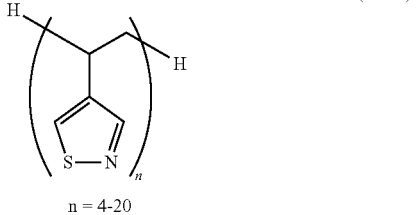

n = 4-20

Here, n represents the polymerization degree, and the heterocycle-containing compounds represented by general formulas (e-213), (e-214), (e-216), (e-217), (e-219) and (e-220) above are compounds wherein n is any number between 4-20.

According to this embodiment, the energy gap of the vapor depositable polar organic compound is preferably 3.5 eV-4.5 eV and most preferably 3.8 eV-4.5 eV.

Also according to this embodiment, the vapor depositable polar organic compound preferably has an aromatic skeleton or heterocycle skeleton. By providing an organic thin-film layer comprising such a polar organic compound, adhesion between the organic thin-film layer and the electron injection electrode layer is further enhanced, a stable thin-film is obtained, and the electron injection property is highly efficient and stable. Using a polar organic compound having such a skeleton inhibits decomposition of the material during vapor deposition and more reliably yields an element with stable characteristics.

A preferred embodiment of an organic EL element of the invention has been explained above with the understanding that the invention is in no way limited to this embodiment.

According to a different embodiment of the organic EL element of the invention, the first electrode layer may be an electron injection electrode (negative electrode) layer and the second electrode layer may be a hole injection electrode layer. When the electron injection electrode (negative electrode) layer is situated on the base, the electron injection electrode layer side may be the light emitting side. In this case, the electron injection electrode layer preferably satisfies the same optical conditions and film thickness conditions for cases where the hole injection electrode layer is the light emitting side.

According to yet another embodiment, as known in the prior art, the organic layer may be a plurality of laminated luminescent layers, and a hole injection layer, hole transport layer and/or electron transport layer may be laminated in addition to the luminescent layer. In this case, the hole injection layer is laminated adjacent to the luminescent layer side of the hole injection electrode layer, the hole transport layer is laminated between the hole injection layer and the luminescent layer, and the electron transport layer is laminated between the electron injection electrode layer and the organic thin-film layer.

These additional embodiments will now be explained with reference to the accompanying drawings. Identical or corresponding structural elements to the first embodiment will be indicated using like reference numerals, and will be explained only once.

Figure 2:
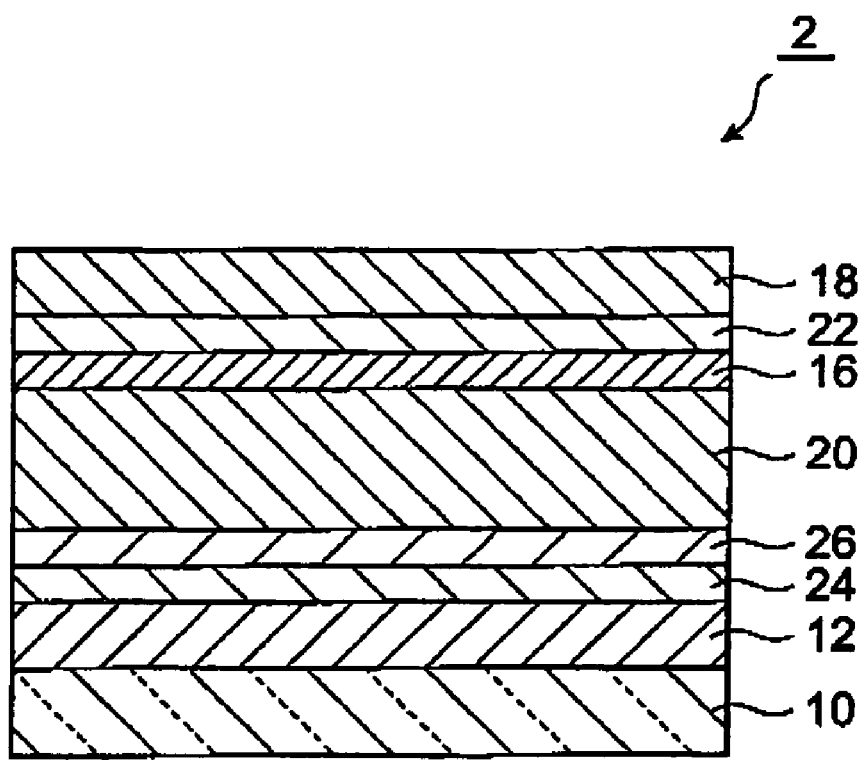
FIG. 2 is a schematic cross-sectional view showing a second embodiment of an organic EL element of the invention.

FIG. 2 is a schematic cross-sectional view showing a second embodiment of an organic EL element of the invention. The organic EL element 2 shown in FIG. 2 differs from the organic EL element 1 in that is provided with a hole injection layer 24 and a hole transport layer 26 between the hole injection electrode layer 12 and luminescent layer 20, from the hole injection electrode layer side, and in that it is provided with an electron transport layer 22 between the organic thin-film layer 16 and electron injection electrode layer 18.

The organic EL element 2 shown in FIG. 2, having this construction, can more easily and reliably provide a satisfactorily high level of luminescent brightness, luminescent efficiency and usable life.

As examples for the hole transport material used for the hole transport layer 26 and the electron transport material used for the electron transport layer 22, there may be mentioned organic metal chelates of oxadiazole derivatives, anthraquinodimethane or its derivatives, benzoquinone or its derivatives, naphthoquinone or its derivatives, anthraquinone or its derivatives, tetracyanoanthraquinodimethane or its derivatives, fluorene or its derivatives, diphenyldicyanoethylene or its derivatives, diphenoquinone derivatives, and 8-hydroxyquinoline or its derivatives.

The hole injection material used for the hole injection layer 24 may be a publicly known conductive polymer compound such as, for example, a pyrazoline derivative, arylamine derivative, stilbene derivative or triphenyldiamine derivative, or polythiophene, polyaniline or the like.

As specific examples of materials for formation of the hole injection layer or hole transport layer there may be mentioned triazole derivatives (U.S. Pat. No. 3,112,197), oxadiazole derivatives (U.S. Pat. No. 3,189,447), imidazole derivatives (Japanese Examined Patent Publication SHO No. 37-16096 and others), polyarylalkane derivatives (U.S. Pat. No. 3,615,402, No. 3,820,989, No. 3,542,544, Japanese Examined Patent Publication SHO No. 45-555, No. 51-10983, Japanese Unexamined Patent Publication SHO No. 51-93224, No. 55-17105, No. 56-4148, No. 55-108667, No. 55-156953, No. 56-36656 and others), pyrazoline derivatives and pyrazolone derivatives (U.S. Pat. No. 3,180,729, No. 4,278,746, Japanese Unexamined Patent Publication SHO No. 55-88064, No. 55-88065, No. 49-105537, No. 55-51086, No. 56-80051, No. 56-88141, No. 57-45545, No. 54-112637, No. 55-74546 and others), phenylenediamine derivatives (U.S. Pat. No. 3,615,404, Japanese Examined Patent Publication SHO No. 51-10105, No. 46-3712, No. 47-25336, Japanese Unexamined Patent Publication SHO No. 54-53435, No. 54-110536, No. 54-119925 and others), arylamine derivatives (U.S. Pat. No. 3,567,450, No. 3,180,703, No. 3,240,597, No. 3,658,520, No. 4,232,103, No. 4,175,961, No. 4,012,376, Japanese Examined Patent Publication SHO No. 49-35702, No. 39-27577, Japanese Unexamined Patent Publication SHO No. 55-144250, No. 56-119132, No. 56-22437, West German Patent No. 1,110,518 and others), amino-substituted chalcone derivatives (U.S. Pat. No. 3,526,501), oxazole derivatives (disclosed in U.S. Pat. No. 3,257,203 and other publications), styrylanthracene derivatives (Japanese Unexamined Patent Publication SHO No. 56-46234 and others), fluorenone derivatives (Japanese Unexamined Patent Publication SHO No. 54-110837 and others), hydrazone derivatives (U.S. Pat. No. 3,717,462, Japanese Unexamined Patent Publication SHO No. 54-59143, No. 55-52063, No. 55-52064, No. 55-46760, No. 55-85495, No. 57-11350, No. 57-148749, Japanese Unexamined Patent Publication HEI No. 2-311591 and others), stilbene derivatives (Japanese Unexamined Patent Publication SHO No. 61-210363, No. 61-228451, No. 61-14642, No. 61-72255, No. 62-47646, No. 62-36674, No. 62-10652, No. 62-30255, No. 60-93455, No. 60-94462, No. 60-174749, No. 60-175052 and others), silazane derivatives (U.S. Pat. No. 4,950,950), polysilane-based compounds (Japanese Unexamined Patent Publication HEI No. 2-204996), aniline-based copolymers (Japanese Unexamined Patent Publication HEI No. 2-282263), and the conductive high-molecular oligomers disclosed in Japanese Unexamined Patent Publication HEI No. 1-211399 (particularly thiophene oligomers).

As hole transport materials there may be used those mentioned above, but also porphyrin compounds (disclosed in Japanese Unexamined Patent Publication SHO No. 63-295695 and other publications), aromatic tertiary amine compounds and styrylamine compounds (U.S. Pat. No. 4,127,412, Japanese Unexamined Patent Publication SHO No. 53-27033, No. 54-58445, No. 54-149634, No. 54-64299, No. 55-79450, No. 55-144250, No. 56-119132, No. 61-295558, No. 61-98353, No. 63-295695 and others), and aromatic tertiary amine compounds. There may also be mentioned compounds having two fused aromatic rings in the molecule as described in U.S. Pat. No. 5,061,569, such as 4,4'-bis(N-(1-naphthyl)-N-phenylamino)biphenyl, or 4,4',4''-tris(N-(3-methylphenyl)-N-phenylamino)triphenylamine having three triphenylamine units linked in a starburst fashion, as described in Japanese Unexamined Patent Publication HEI No. 4-308688. There may also be used as hole transport materials the aromatic dimethylidene-based compounds mentioned above as materials for the luminescent layer, as well as inorganic compounds such as p-type Si and p-type SiC.

The hole injection layer or hole transport layer may be composed of a layer comprising one or more types of the materials mentioned above, and it may also be laminated with a hole injection layer or hole transport layer comprising a different type of compound than that of the hole injection layer or hole transport layer. The thickness of the hole injection layer or hole transport layer is not particularly restricted but is preferably 20-200 nm.

As the material for the electron transport layer 22 there may be used, for example, an organic metal chelate of an oxadiazole derivative, anthraquinodimethane or its derivative, benzoquinone or its derivative, naphthoquinone or its derivative, anthraquinone or its derivative, tetracyanoanthraquinodimethane or its derivative, fluorene or its derivative, diphenyldicyanoethylene or its derivative, a diphenoquinone derivative or 8-hydroxyquinoline or its derivative. According to this embodiment, the material used for the electron transport layer is preferably a metal chelate of 8-hydroxyquinoline or its derivative.

As specific examples of metal chelates of 8-hydroxyquinoline or its derivatives there may be mentioned metal chelate oxinoid compounds including chelates of oxines (generally 8-quinolinol or 8-hydroxyquinoline), and for example, tris(8-quinolinol)aluminum (Alq) mentioned for the luminescent material may be used.

As oxadiazole derivatives there may be mentioned electron carrier compounds represented by the following general formulas (C-1) to (C3).

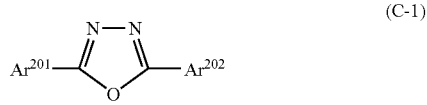

(C-1)

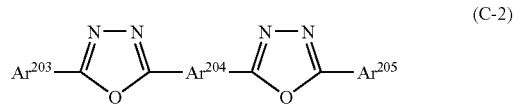

(C-2)

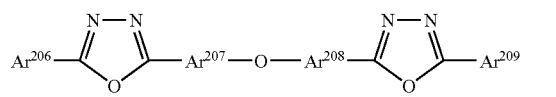

(C-3)

[wherein $Ar^{201}$, $Ar^{202}$, $A^{203}$, $Ar^{205}$, $Ar^{206}$ and $Ar^{209}$ each represent substituted or unsubstituted aryl groups, which may be the same or different. Also, $Ar^{204}$, $Ar^{207}$ and $Ar^{208}$ represent substituted or unsubstituted arylene groups, which may be the same or different.]

As specific examples of these electron carrier compounds there may be mentioned compounds represented by the following general formulas (C-4) to (C-9) and the nitrogen-containing heterocyclic derivatives represented by the following general formulas (C-10) and (C-11).

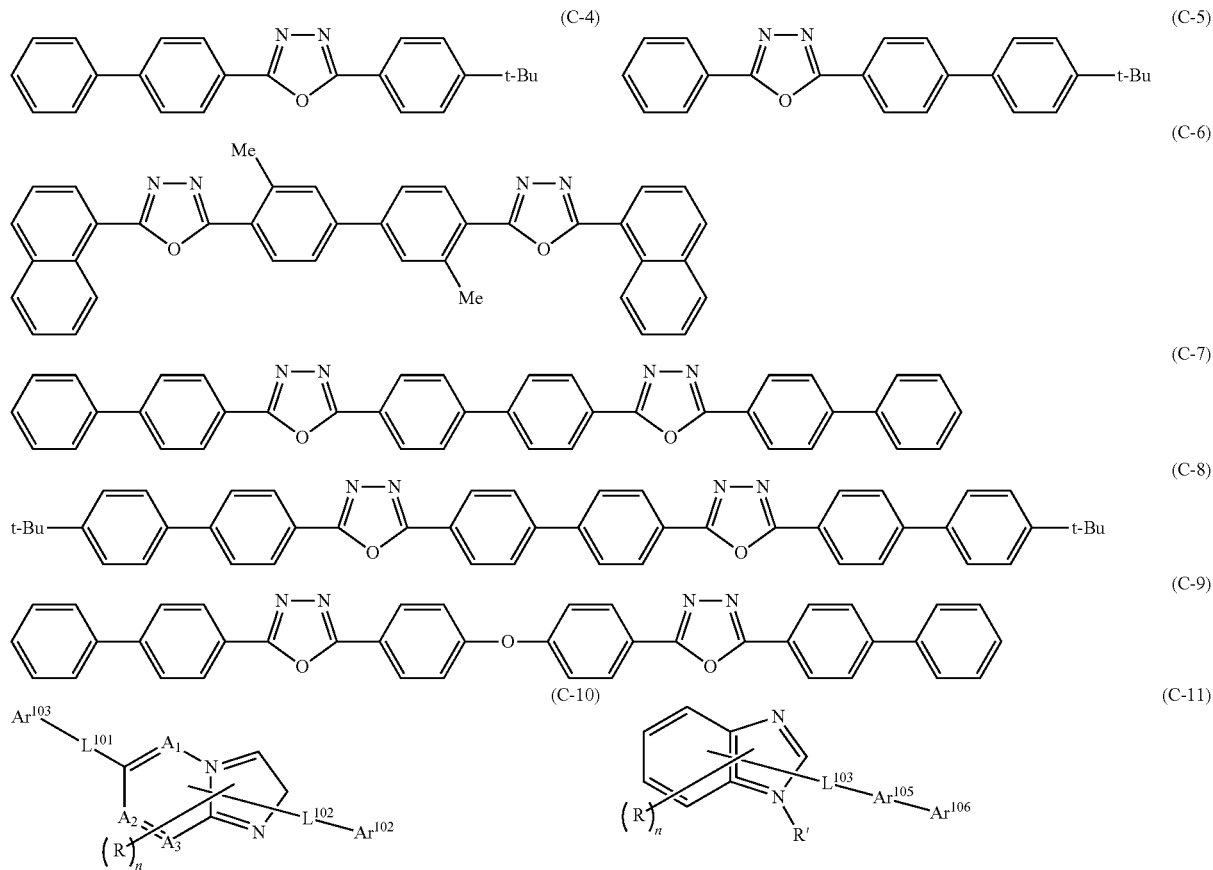

[wherein A1-A3 are nitrogen atoms or carbon atoms, and R and R' are optionally substituted C6-60 aryl groups, optionally substituted C3-60 heteroaryl groups, C1-20 alkyl groups, C1-20 haloalkyl groups or C1-20 alkoxy groups, n is an integer of 0-5, and when n is an integer of 2 or greater, the xnultiple R groups may be either the same or different. Also, adjacent R groups may be bonded together to form substituted or unsubstituted carbocyclic aliphatic rings or substituted or unsubstituted carbocyclic aromatic rings. $Ar^{103}$ is an optionally substituted C6-60 aryl group or an optionally substituted C3-60 heteroaryl group. $Ar^{104}$ is hydrogen, C1-20 alkyl C1-20 haloalkyl, C1-20 alkoxy, optionally substituted C6-60 aryl or optionally substituted C3-60 heteroaryl, with the proviso that one of $Ar^{103}$ and $Ar^{104}$ is an optionally substituted C10-60 fused cyclic group or an optionally substituted C3-60 hetero fused cyclic group. $L^{101}$, $L^{102}$ and $L^{103}$ are each a single bond, an optionally substituted C6-60 fused ring, an optionally substituted C3-60 hetero fused ring or an optionally substituted fluorenylene ring.]

As specific examples of these electron carrier compounds there may be mentioned nitrogen-containing heterocyclic derivatives represented by the following formula.

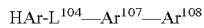

[wherein HAr is an optionally substituted C3-40 nitrogen-containing heterocycle, $L^{104}$ is a single bond, an optionally substituted C6-60 arylene group, an optionally substituted C3-60 heteroarylene group or an optionally substituted fluorenylene group, $Ar^{107}$ is an optionally substituted C6-60 divalent aromatic hydrocarbon group, and $Ar^{108}$ is an optionally substituted C6-60 aryl group or an optionally substituted C3-60 heteroaryl group.]

There may also be mentioned the silacyclopentadiene derivatives represented by the following general formula (C-12), indicated in Japanese Unexamined Patent Publication HEI No. 9-087616.

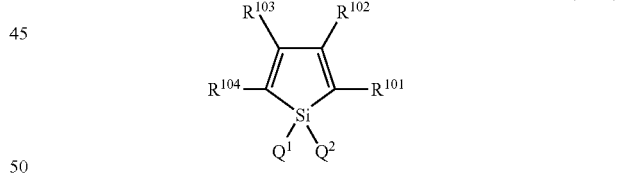

[wherein $Q^1$ and $Q^2$ each independently represent a C1-6 saturated or unsaturated hydrocarbon group, alkoxy, alkenyloxy, alkynyloxy, hydroxy, substituted or unsubstituted aryl or substituted or unsubstituted heterocycle, or $Q^1$ and $Q^2$ bond together to form a saturated or unsaturated ring structure, $R^{101}$-$R^{104}$ each independently represent hydrogen, a hydrogen, substituted or unsubstituted C1-6 alkyl, alkoxy, aryloxy, perfluoroalkyl, perfluoroalkoxy, amino, alkylcarbonyl, arylcarbonyl, alkoxycarbonyl, aryloxycarbonyl, azo, alkylcarbonyloxy, arylcarbonyloxy, alkoxycarbonyloxy, aryloxycarbonyloxy, sulfinyl, sulfonyl, sulfanyl, silyl, carbamoyl, aryl, heterocyclic group, alkenyl, alkynyl, nitro, formyl, nitroso, formyloxy, isocyano, cyanate, isocyanate, thiocyanate, isothiocyanate or cyano, or when adjacent they form a substituted or unsubstituted fused ring structure.]

There may also be mentioned silacyclopentadiene derivatives represented by the following general formula (C-13), as indicated in Japanese Unexamined Patent Publication HEI No. 9-194487.

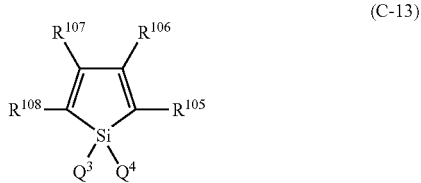

(C-13)

[wherein $Q^3$ and $Q^4$ each independently represent a C1-6 saturated or unsaturated hydrocarbon group, alkoxy, alkenyloxy, alkynyloxy, substituted or unsubstituted aryl or substituted or unsubstituted heterocycle, or $Q^3$ and $Q^4$ bond together to form a saturated or unsaturated ring structure, $R^{105}$-$R^{108}$ each independently represent hydrogen, a halogen, substituted or unsubstituted C1-6 alkyl, alkoxy, aryloxy, perfluoroalkyl, perfluoroalkoxy, amino, alkylcarbonyl, arylcarbonyl, alkoxycarbonyl, aryloxycarbonyl, azo, alkylcarbonyloxy, arylcarbonyloxy, alkoxycarbonyloxy, aryloxycarbonyloxy, sulfinyl, sulfonyl, sulfanyl, silyl, carbamoyl, aryl, heterocycle, alkenyl, alkynyl, nitro, formyl, nitroso, formyloxy, isocyano, cyanate, isocyanate, thiocyanate, isothiocyanate or cyano, or when adjacent they form a substituted or unsubstituted fused ring structure (with the proviso that when $R^{105}$ and $R^{108}$ are phenyl groups $Q^3$ and $Q^4$ are not alkyl or phenyl groups, when $R^{105}$ and $R^{108}$ are thienyl groups $Q^3$ and $Q^4$ are not simultaneously monovalent hydrocarbon groups and $R^{106}$ and $R^{107}$ are not simultaneously alkyl, aryl or alkenyl or $R^{106}$ and $R^{107}$ are not simultaneously aliphatic groups which bond together to form a ring, when $R^{105}$ and $R^{108}$ are silyl groups $R^{106}$, $R^{107}$, $Q^3$ and $Q^4$ each independently are not C1-6 monovalent hydrocarbon groups or hydrogen, and when $R^{105}$ and $R^{106}$ form a fused benzene ring, $Q^3$ and $Q^4$ are not alkyl or phenyl groups.)]

There may also be mentioned borane derivatives represented by the following general formula (C-14), as indicated in Reissue Patent No. 2000-040586.

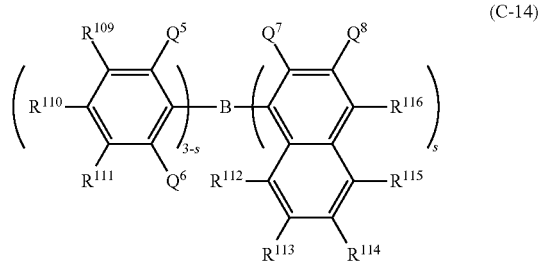

(C-14)

[wherein $R^{109}$-$R^{116}$ ad $Q^8$ each independently represent hydrogen, a saturated or unsaturated hydrocarbon group, aromatic group, heterocyclic group, substituted amino group, substituted boryl group, alkoxy group or aryloxy group, $Q^5$, $Q^6$ and $Q^7$ each independently represent a saturated or unsaturated hydrocarbon group, aromatic group, heterocyclic group, substituted amino group, alkoxy group or aryloxy group, wherein the substituents $Q^7$ and $Q^8$ may bond together to form a fused ring, s represents an integer of 1-3 and when s is 2 or greater the $Q^7$ groups may be different, with the proviso that compounds wherein s is 1, $Q^5$, $Q^6$ and $R^{110}$ are methyl groups and $R^{116}$ is hydrogen or a substituted boryl group, and compounds wherein s is 3 and $Q^7$ is methyl, are excluded.]

There may also be mentioned compounds represented by the following general formula (C-15), as indicated in Japanese Unexamined Patent Publication HEI No. 10-088121.

(C-15)

[wherein $Q^9$ and $Q^{10}$ each independently represent a ligand of the following general formula (G-16), and $L^{109}$ is a halogen atom, substituted or unsubstituted alkyl, substituted or unsubstituted cycloalkyl, substituted or unsubstituted aryl, a substituted or unsubstituted heterocyclic group, —$OR^{117}$ (where $R^{117}$ is hydrogen, substituted or unsubstituted alkyl, substituted or unsubstituted cycloalkyl, substituted or unsubstituted aryl, or a substituted or unsubstituted heterocyclic group) or a ligand of the formula —O—Ga-$Q^{11}(Q^{12})$ (where $Q^{11}$ and $Q^{12}$ represent the same groups as $Q^9$ and $Q^{10}$).]

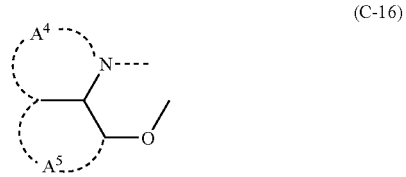

(C-16)

[wherein rings $A^4$ and $A^5$ re fused 6-membered aryl ring structures which may be optionally substituted.]

This metal chelate has powerful characteristics as an n-type semiconductor, and a large electron injection capacity. In addition, because of the low production energy during chelate formation, strong bonds are formed between the metal and ligand of the metal chelate, and the fluorescent photon efficiency as a luminescent material is also increased. As specific examples of substituents on the ligand-forming rings $A^4$ and $A^5$ of general formula (C-16) above there may be mentioned halogen atoms such as chlorine, bromine, iodine and fluorine, substituted or unsubstituted alkyl groups such as methyl, ethyl, propyl, butyl sec-butyl, tert-butyl pentyl hexyl, heptyl, octyl, stearyl and trichloromethyl, substituted or unsubstituted aryl groups such as phenyl, naphthyl, 3-methylphenyl, 3-methoxyphenyl, 3-fluorophenyl, 3-trichloromethylphenyl, 3-trifluoromethylphenyl and 3-nitrophenyl, substituted or unsubstituted alkoxy groups such as methoxy, n-butoxy, tert-butoxy, trichloromethoxy, trifluoroethoxy, pentafluoropropoxy, 2,2,3,3-tetrafluoropropoxy and 1,1,1,3,3,3-hexafluoro-2-propoxy, 6-(perfluoroethyl)hexyloxy, substituted or unsubstituted aryloxy groups such as phenoxy, p-nitrophenoxy, p-tert-butylphenoxy, 3-fluorophenoxy, pentafluorophenyl and 3-trifluoromethylphenoxy, substituted or unsubstituted alkylthio groups such as methylthio, ethylthio, tert-butylthio, hexylthio, octylthio and trifluoromethylthio, substituted or unsubstituted arylthio groups such as phenylthio, p-nitrophenylthio, p-tert-butylphenylthio, 3-fluorophenylthio, pentafluorophenylthio and 3-trifluoromethylphenylthio, mono- or disubstituted amino groups such as cyano, nitro, amino, methylamino, dimethylamino, ethylamino, diethylamino, dipropylamino, dibutylamino and diphenylamino, acylamino groups such as bis(acetoxymethyl)amino, bis(acetoxyethyl)amino, bis(acetoxypropyl)amino and bis(acetoxybutyl)amino, hydroxyl, siloxy, carbamoyl groups such as acyl, methylcarbamoyl, dimethylcarbamoyl, ethylcarbamoyl, diethylcarbamoyl, propylcarbamoyl, butylcarbamoyl and phenylcarbamoyl, carboxylic acid groups, sulfonic acid groups, imides, cycloalkyl groups such as cyclopentyl and cyclohexyl, aryl groups such as phenyl, naphthyl, biphenyl, anthranyl, phenanthryl, fluorenyl and pyrenyl, and heterocyclic groups such as pyridinyl, pyrazinyl, pyrimidinyl, pyridazinyl, triazinyl, indolinyl, quinolinyl, acridinyl, pyrrolidinyl, dioxanyl, piperidinyl, morpholidinyl, piperazinyl, triathinyl, carbazolyl, furanyl, thiophenyl, oxazolyl, oxadiazolyl, benzooxazolyl, thiazolyl, thiadiazolyl, benzothiazolyl, triazolyl, imidazolyl, benzoimidazolyl and puranyl. These substituents may also bond together to further form 6-membered aryl rings or heterocycles.

Figure 3:
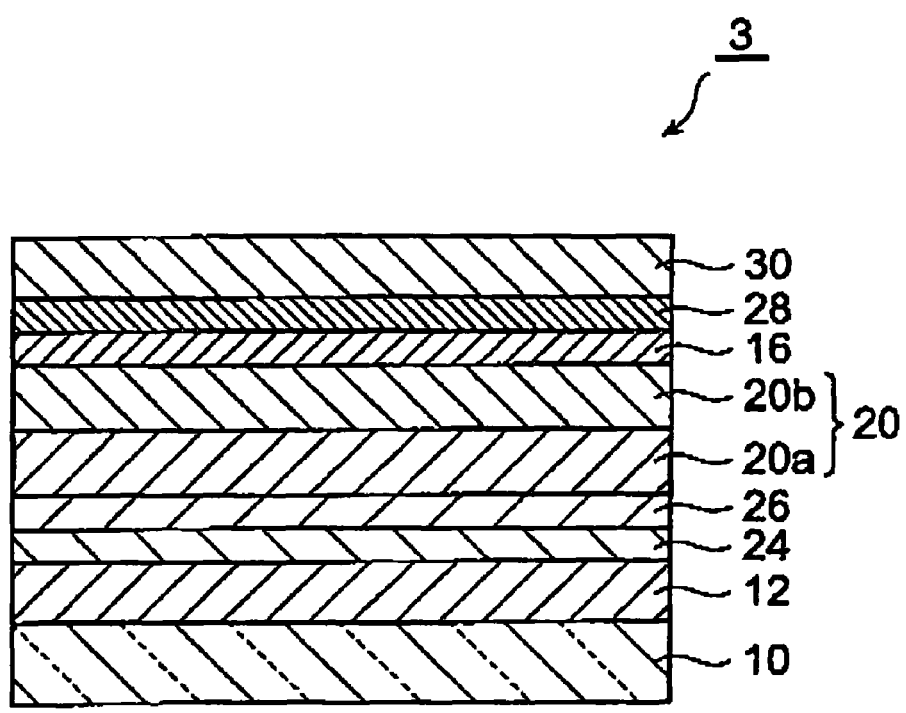
FIG. 3 is a schematic cross-sectional view showing a third embodiment of an organic EL element of the invention.

FIG. 3 is a schematic cross-sectional view showing a third embodiment of an organic EL element of the invention. The organic EL element 3 shown in FIG. 3 differs from the organic EL element 1 in that it has a laminated structure in the order of hole injection layer 24, hole transport layer 26, first luminescent layer 20a, second luminescent layer 20b, organic thin-film layer 16, first electron injection electrode layer 28 and second electron injection electrode layer 30 (protective electrode layer) on the base 10, in that the luminescent layer 20 has a bilayer structure comprising the first luminescent layer 20a and second luminescent layer 20b, in that the electron injection electrode layer 18 has a bilayer structure comprising the electron injection electrode layer 28 and second electron injection electrode layer 30, and in that it is provided with a hole injection layer 24 and hole transport layer 26.

According to this organic EL element 3, the bilayer structure of the luminescent layer further facilitates adjustment of color emission. The structure luminescent layer/organic thin-film layer/first electron injection electrode layer/second electron injection electrode layer improves the adhesion of each layer and can drastically reduce the driving voltage as explained above, while also further improving the luminescent brightness, luminescent efficiency and usable life.

A preferred mode of a process for manufacture of an organic EL element of the invention will now be explained in detail. The manufacturing process will be explained for an organic EL element having the construction shown in FIG. 1.

First, a hole injection electrode layer 12 made of ITO, for example, is formed on the prepared base 10. The forming method employed may be a method used in the prior art, such as sputtering or vapor deposition.

Next, the luminescent layer 20 is formed on the hole injection electrode layer 12. When the luminescent layer comprises a high molecular luminescent material, the forming method used may be a coating method such as spin coating, spray coating, dip coating, ink jetting or printing if the luminescent material allows formation from a solution. Spin coating is preferred among these methods, and coating over the entire surface of the base 10 will greatly facilitate the step of forming the luminescent layer 20, while simplifying and lower the cost of the manufacturing apparatus.

When the luminescent layer is a low molecular luminescent material, sputtering or vapor deposition may be employed instead of the aforementioned coating methods.

Next, the organic thin-film layer 16 is formed on the luminescent layer 20. The forming method may be any method which allows formation of a film to a thickness of 0.1 nm-4 nm using the aforementioned polar organic compound, and for example it may be a sputtering method, vapor deposition method such as vacuum vapor deposition, or a coating method such as spin coating, spray coating, dip coating, ink jetting or printing.

Of the methods described above, the organic thin-film layer 16 is preferably formed by vacuum vapor deposition. Vacuum vapor deposition allows more excellent control of the film thickness and results in inclusion of fewer impurities, thereby permitting easier and more reliable formation of a high-purity organic thin-film layer with a uniform film thickness. This can further improve the luminescent brightness, luminescent efficiency and usable life of the organic EL element of the invention.

The electron injection electrode layer 18 is then formed on the organic thin-film layer 16 to complete the organic EL element 1. The forming method employed may be one commonly used in the prior art, such as vapor deposition or sputtering.

A preferred mode of a manufacturing process for an organic EL element of the invention was explained above, but the invention is not limited to this mode.

For example, for an organic EL element 1 wherein the first electrode layer is the electron injection electrode (negative electrode) layer and the second electrode layer is the hole injection electrode layer, the electron injection electrode (negative electrode) layer is situated on the base. For manufacture of this type of organic EL element, it is sufficient to reverse the order of formation of each layer described above.

EXAMPLES

The present invention will now be explained in greater detail through examples, with the understanding that the invention is not limited to these examples.

Example 1

First, a glass panel was prepared having an ITO transparent electrode (positive electrode) layer formed to a thickness of 100 nm, ultrasonically cleaned using a neutral detergent and purified water, and dried. Next, the surface of the ITO transparent electrode layer was cleaned by UV/O$_3$, and then the glass panel was anchored in the base holder of a "VPC-410" vacuum vapor deposition apparatus (trade name of Shinku Kiko Co., Ltd.) and the pressure in the apparatus was reduced to below $1 \times 10^{-4}$ Pa. The compound represented by general formula (I) below was then vapor deposited onto the ITO transparent electrode layer at a vapor deposition rate of 0.1 nm/sec while maintaining a reduced pressure state, to form a hole injection layer with a thickness of 80 nm.

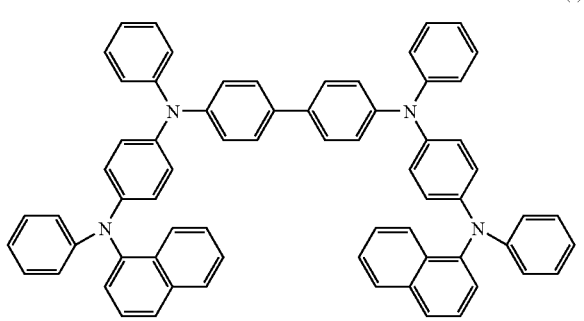

(I)

Next, the compound represented by general formula (II) below was vapor deposited onto the previously formed hole injection layer at a vapor deposition rate of 0.1 m/sec, to form a hole transport layer with a thickness of 15 nm.

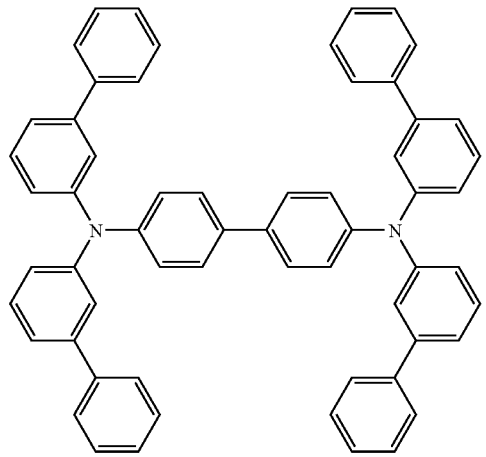

(II)

Next a mixture of the compound represented by general formula (III) below, the compound represented by general formula (II) above and the compound represented by general formula (IV) below in a weight proportion of 80:20:3 was vapor deposited onto the previously formed hole transport layer at a total vapor deposition rate of 0.1 nm/sec, to form a first luminescent layer with a thickness of 40 nm.

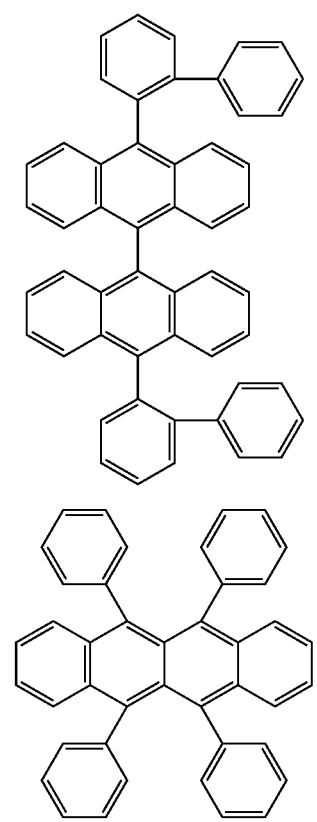

(III)

(IV)

Next, a mixture of the compound represented by general formula (III) above, the compound represented by general formula (II) above and the compound represented by general formula (V) below in a weight proportion of 80:20:3 was vapor deposited onto the previously formed first luminescent layer at a total vapor deposition rate of 0.1 nm/sec, to form a second luminescent layer with a thickness of 40 nm.

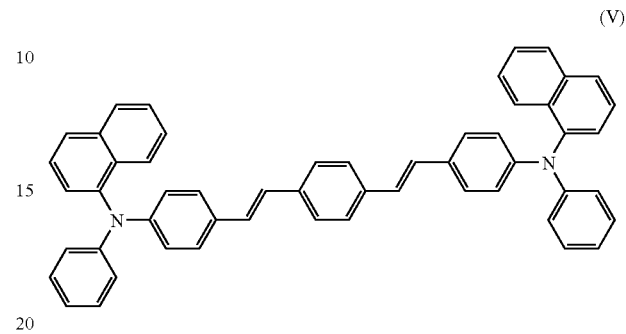

(V)

Next, poly(2-vinylpyridine) (weight-average molecular weight: 1000, energy gap: 4.4 eV) represented by general formula (A) below was vapor deposited onto the previously formed luminescent layer at a vapor deposition rate of 0.1 nm/sec, to form an organic thin-film layer with a thickness of 2 nm.

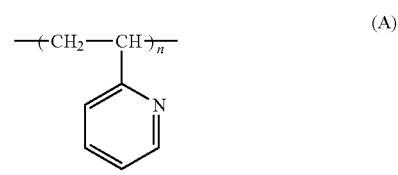

(A)

In this formula, n represents the polymerization degree.

Next LiF was vapor deposited onto the previously formed organic thin-film layer at a vapor deposition rate of 0.01 nm/sec to form an electron injection negative electrode layer with a thickness of 0.2 nm. Aluminum was then vapor deposited onto the electron injection negative electrode layer at a vapor deposition rate of 2 nm/sec to form a protective electrode layer with a thickness of 150 nm, in order to obtain an organic EL element for Example 1 having the same con on shown in FIG. 3.

Upon application of a direct-current voltage to the organic EL element for constant-current driving at a current density of 10 mA/cm$^2$, luminescence with a brightness of 625 cd/cm$^2$ at a driving voltage of 4.0 V was measured, and a uniform emission surface without dark spots or bright spots was confirmed. When the organic EL element was subjected to constant-current driving at a current density of 50 mA/cm$^2$ for evaluation of the usable life, the initial brightness was 3200 cd/cm$^2$ and the time to brightness reduction to half of the initial brightness ("half-brightness time", same hereunder) was 3000 hours. The results are shown in Table 1.

TABLE 1

| | Luminescent characteristics (Current density: 10 mA/cm²) | | Usable life characteristics (Current density: 50 mA/cm²) | |
|---|---|---|---|---|
| | Driving voltage (V) | Brightness (cd/cm²) | Initial brightness (cd/cm²) | Half-brightness time (h) |
| Example 1 | 4.0 | 625 | 3200 | 3000 |
| Example 2 | 4.3 | 600 | 3000 | 2500 |
| Example 3 | 4.0 | 610 | 3300 | 2500 |
| Example 4 | 5.0 | 650 | 3500 | 1500 |
| Example 5 | 10 | 300 | 1500 | 2000 |
| Example 6 | 4.2 | 650 | 2500 | 3000 |
| Comp. Ex. 1 | 7.0 | 650 | 3500 | 3 |
| Comp. Ex. 2 | 6.7 | 450 | 2500 | 1000 |
| Comp. Ex. 3 | 13 | 0 | 3 | 2 |
| Comp. Ex. 4 | 8 | 400 | 2000 | 3 |
| Comp. Ex. 5 | 10 | 0 | 20 | 0.5 |
| Comp. Ex. 6 | 10 | 30 | 25 | 1 |
| Comp. Ex. 7 | — | — | — | — |

Example 2

An organic EL element for Example 2 was obtained in the same manner as Example 1, except that the film thickness of the organic thin-film layer was 1 nm.

Upon application of a direct-current voltage to the organic EL element for constant-current driving at a current density of 10 mA/cm², luminescence with a brightness of 600 cd/cm² at a driving voltage of 4.3 V was measured, and a uniform emission surface without dark spots or bright spots was confirmed. When the organic EL element was subjected to constant-current driving at a current density of 50 mA/cm² for evaluation of the usable life, the initial brightness was 3000 cd/cm² and the half-brightness time was 2500 hours. The results are shown in Table 1.

Example 3

An organic EL element for Example 3 was obtained in the same manner as Example 1, except that the film thickness of the organic thin-film layer was 3 nm.

Upon application of a direct-current voltage to the organic EL element for constant-current driving at a current density of 10 mA/cm², luminescence with a brightness of 610 cd/cm² at a driving voltage of 4.0 V was measured, and a uniform emission surface without dark spots or bright spots was confirmed. When the organic EL element was subjected to constant-current driving at a current density of 50 mA/cm² for evaluation of the usable life, the initial brightness was 3300 cd/cm² and the half-brightness time was 2500 hours. The results are shown in Table 1.

Example 4

An organic EL element for Example 4 was obtained in the same manner as Example 1, except that the film thickness of the organic thin-film layer was 4 nm.

Upon application of a direct-current voltage to the organic EL element for constant-current driving at a current density of 10 mA/cm², luminescence with a brightness of 650 cd/cm² at a driving voltage of 5.0 V was measured, and a uniform emission surface without dark spots or bright spots was confirmed. When the organic EL element was subjected to constant-current driving at a current density of 50 mA/cm² for evaluation of the usable life, the initial brightness was 3500 cd/cm² and the half-brightness time was 1500 hours. The results awe shown in Table 1.

Example 5

An organic EL element for Example 5 was obtained in the same manner as Example 1, except that an electron injection negative electrode layer made of LiF was not formed on the organic thin-film layer.

Upon application of a direct-current voltage to the organic EL element for constant-current driving at a current density of 10 mA/cm², luminescence with a brightness of 300 cd/cm² at a driving voltage of 10 V was measured, and a uniform emission surface without dark spots or bright spots was confirmed. When the organic EL element was subjected to constant-current driving at a current density of 50 mA/cm² for evaluation of the usable life, the initial brightness was 1500 cd/cm² and the half-brightness time was 2000 hours. The results are shown in Table 1.

Example 6

An organic EL element for Example 6 was obtained in the same manner as Example 1, except that a crown ether compound represented by general formula (B) below (dibenzo-30-crown 10-ether) (energy gap: 4.2 eV) was used instead of the poly(2-vinylpyridine) represented by general formula (A).

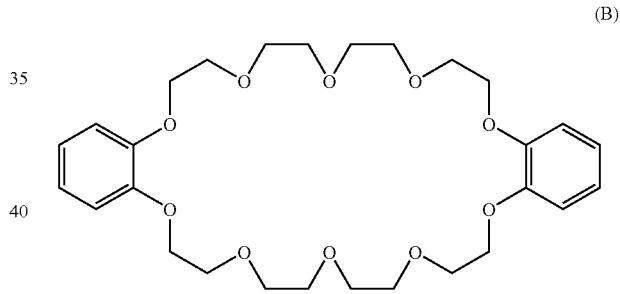

(B)

Upon application of a direct-current voltage to the organic EL element for constant-current driving at a current density of 10 mA/cm², luminescence with a brightness of 650 cd/cm² at a driving voltage of 4.2 V was measured, and a uniform emission surface without dark spots or bright spots was confirmed. When the organic EL element was subjected to constant-current driving at a current density of 50 mA/cm² for evaluation of the usable life, the initial brightness was 2500 cd/cm² and the half-brightness time was 3000 hours. The results are shown in Table 1.

Comparative Example 1

An organic EL element for Comparative Example 1 was obtained in the same manner as Example 1, except that the film thickness of the organic thin-film layer was 5 nm.

Upon application of a direct-current voltage to the organic EL element for constant-current driving at a current density of 10 mA/cm², luminescence with a brightness of 650 cd/cm² at a driving voltage of 7.0 V was measured. When the organic EL element was subjected to constant-current driving at a current density of 50 mA/cm² for evaluation of the usable life, the initial brightness was 3500 cd/cm² and the half-brightness time was 3 hours, and therefore the usable life was unsatisfactory. The results are shown in Table 1.

Comparative Example 2

An organic EL element for Comparative Example 2 was obtained in the same manner as Example 1, except that Alq3 (Tris(8-hydroxyquinolinato)aluminum(III)) (molecular weight: 459, energy gap: 2.6 eV) was used instead of the organic thin-film layer composed of poly(2-vinylpyridine) represented by general formula (A) above, for vapor deposition onto the luminescent layer at a vapor deposition rate of 0.1 nm/sec to form an Alq3 layer with a thickness of 30 nm.

Upon application of a direct-current voltage to the organic EL element for constant-current driving at a current density of 10 mA/cm$^2$, luminescence with a brightness of 450 cd/cm$^2$ at a driving voltage of 6.7 V was measured. When the organic EL element was subjected to constant-current driving at a current density of 50 mA/cm$^2$ for evaluation of the usable life, the initial brightness was 2500 cd/cm$^2$ and the half-brightness time was 1000 hours, and therefore the usable life was unsatisfactory. The results are shown in Table 1.

Comparative Example 3

An organic EL element for Comparative Example 3 was obtained in the same manner as Example 1, except that no organic thin-film layer composed of poly(2-vinylpyridine) represented by general formula (A) above was used.

Upon application of a direct-current voltage to the organic EL element for constant-current driving at a current density of 10 mA/cm$^2$, no light emission was confirmed even at a driving voltage of 13.0 V. When the organic EL element was subjected to constant-current driving at a current density of 50 mA/cm$^2$ for evaluation of the usable life, the initial brightness was 3 cd/cm$^2$ and the half-brightness time was 2 hours, and therefore the usable life was unsatisfactory. The results are shown in Table 1.

Comparative Example 4

An organic EL element for Comparative Example 4 was obtained in the same manner as Example 1, except that no organic thin-film layer composed of poly(2-vinylpyridine) represented by general formula (A) above was used, and the film thickness of the electron injection negative electrode layer made of LiF was 5 nm.

Upon application of a direct-current voltage to the organic EL element for constant-current driving at a current density of 10 mA/cm$^2$, luminescence with a brightness of 400 cd/cm$^2$ at a driving voltage of 8.0 V was measure& When the organic EL element was subjected to constant current driving at a current density of 50 mA/cm$^2$ for evaluation of the usable life, the initial brightness was 2000 cd/cm$^2$ and the half-brightness time was 3 hours, and therefore the usable life was unsatisfactory. The results are shown in Table 1.

Comparative Example 5

An organic EL element for Comparative Example 5 was obtained in the same manner as Example 1, except that polystyrene represented by general formula (C) below (molecular weight: 1000, energy gap: 4.6 eV) was used instead of the poly(2-vinylpyridine) represented by general formula (A) above.

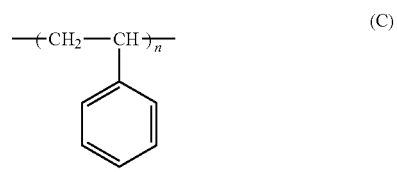

In this formula, n represents the polymerization degree.

Upon application of a direct-current voltage to the organic EL element for constant-current driving at a current density of 10 mA/cm$^2$, no light emission was confirmed even at a driving voltage of 10.0 V. When the organic EL element was subjected to constant-current driving at a current density of 50 mA/cm$^2$ for evaluation of the usable life, the initial brightness was 20 cd/cm$^2$ and the half-brightness time was 0.5 hours, and therefore the usable life was unsatisfactory. The results are shown in Table 1.

Comparative Example 6

An organic EL element for Comparative Example 6 was obtained in the same manner as Example 1, except that the compound represented by general formula (II) above (molecular weight: 792, energy gap: 3.2 eV) was used instead of the poly(2-vinylpyridine) represented by general formula (A) above.

Upon application of a direct-current voltage to the organic EL element for constant-current driving at a current density of 10 mA/cm$^2$, no light emission was confirmed even at a driving voltage of 10.0 V. When the organic EL element was subjected to constant-current driving at a current density of 50 mA/cm$^2$ for evaluation of the usable life, the initial brightness was 25 cd/cm$^2$ and the half-brightness time was 1 hour, and therefore the usable life was unsatisfactory. The results are shown in Table 1.

Comparative Example 7

It was attempted to form the organic thin-film layer using polymethyl methacrylate represented by general formula (D) below (weight-average molecular weight: 1000, energy gap: 4.6 eV) instead of the poly(2-vinylpyridine) represented by general formula (A) above, but the polymethyl methacrylate decomposed during vapor deposition so that no organic thin-film layer could be formed.

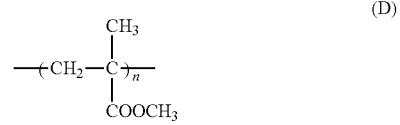

In this formula, n represents the polymerization degree.

As shown in Table 1, the organic EL elements of Examples 1-6, each of which had an organic thin-film layer made of a vapor depositable polar organic compound with an energy gap of 3.5 eV or greater and an organic thin-film layer thickness in the range of 0.1 nm-4 nm, exhibited sufficiently excellent luminescent brightness and luminescent efficiency, and were confirmed to be long-usable-life organic EL elements capable of maintaining a high level of these element characteristics for prolonged periods. Also, the organic EL elements of Examples 1-4 and 6 were confirmed to produce adequate luminescent brightness at lower driving voltage.

What is claimed is:

1. An organic EL element provided with a base, first and second electrode layers situated facing each other on one side of said base, and a luminescent layer situated between the electrode layers, wherein one of said first electrode layer and said second electrode layer is a hole injection electrode layer while the other is an electron injection electrode layer, an organic thin-film layer made by vapor deposition of a polar organic compound with an energy gap of 3.5 eV or greater is provided between said luminescent layer and said electron injection electrode layer, said organic thin-film layer has a thickness of 0.1 nm-4 nm, said polar organic compound has a molecular weight or weight average molecular weight no greater than 1000, said polar organic compound is a heterocyclic ring-containing compound having a heterocyclic ring comprising nitrogen as the hetero atom, and said electron injection electrode layer includes a layer composed of at least one type of substance selected from the group consisting of alkali metals, alkaline earth metals, rare earth metals and compounds of these metals, formed on the side nearest said organic thin-film layer, wherein a layer composed of at least one type of substance from the group consisting of alkali metals, alkaline earth metals, rare earth metals, rare earth metals and compounds of these metals is further provided between said organic thin-film layer and said electron injection electrode layer.

2. An organic EL element provided with a base, first and second electrode layers situated facing each other on one side of said base, and a luminescent layer situated between the electrode layers, wherein one of said first electrode layer and said second electrode layer is a hole injection electrode layer while the other is an electron injection electrode layer, an organic thin-film layer made by vapor deposition of a polar organic compound with an energy gap of 3.5 eV or greater is provided between said luminescent layer and said electron injection electrode layer, said organic thin-film layer has a thickness of 0.1 nm-4 nm, said polar organic compound has a molecular weight or weight average molecular weight no greater than 1000, said polar organic compound is a heterocyclic ring-containing compound having a heterocyclic ring comprising nitrogen as the hetero atom, and said electron injection electrode layer includes a layer composed of at least one type of substance selected from the group consisting of alkali metals, alkaline earth metals, rare earth metals and compounds of these metals, formed on the side nearest said organic thin-film layer, wherein said electron injection electrode layer comprises a first electron injection electrode layer formed on the side nearest said organic thin-film layer and a second electron injection electrode layer formed on the side furthest from said organic thin-film layer, said first electron injection electrode layer being composed of at least one type of substance selected from the group consisting of alkali metals, alkaline earth metals, rare earth metals and compounds of these metals, and said second electron injection electrode layer comprising Al, Ag, In, Ti, Cu, Au, Mo, W, Pt, Pd, Ni or an alloy of these metals.

3. An organic EL element according to claim 2, wherein the film thickness of said first electron injection electrode layer is 0.01 nm-2 nm.

4. An Organic EL element according to claim 1, wherein the energy gap of said polar organic compound is 3.8 eV or greater.

5. An Organic EL element according to claim 1, wherein said polar organic compound has an energy gap of 3.8 eV-4.5 eV.

6. An Organic EL element according to claim 1, wherein said polar organic compound possesses an aromatic skeleton or heterocycle skeleton.

7. A process for manufacture of an organic EL element provided with a base, first and second electrode layers situated facing each other on one side of said base, an electron transport layer, a hole transport layer, a hole injection layer, and a luminescent layer situated between the electrode layers, wherein one of said first electrode layer and said second electrode layer is a hole injection electrode layer while the other is an electron injection electrode layer, and an organic thin-film layer is provided between said luminescent layer and said electron injection electrode layer, the process comprising an organic thin-film layer-forming step in which said organic thin-film layer is formed by vapor deposition of a polar organic compound with an energy gap of 3.5 eV or greater to a film-thickness of 0.1 nm-4 nm, said polar organic compound has a molecular weight or weight average molecular weight no greater than 1000, said polar organic compound is a heterocyclic ring-containing compound having a heterocyclic ring comprising nitrogen as the hetero atom, and said electron injection electrode layer includes a layer composed of at least one type of substance selected from the group consisting of alkali metals, alkaline earth metals, rare earth metals and compounds of these metals, formed on the side nearest said organic thin-film layer, wherein a layer composed of at least one type of substance from the group consisting of alkali metals, alkaline earth metals, rare earth metals, rare earth metals and compounds of these metals is further provided between said organic thin-film layer and said electron injection electrode layer.

8. A process for manufacture of an organic EL element according to claim 7, wherein said organic thin-film layer is formed by vacuum vapor deposition of said polar organic compound on said luminescent layer or on said electron injection electrode layer in said organic thin-film layer-forming step.

9. The organic EL element of claim 1, further comprising an electron transport layer, a hole transport layer and a hole injection layer.

10. The organic EL element according to claim 2, wherein the energy gap of said polar organic compound is 3.8 eV or greater.

11. The organic EL element according to claim 2, wherein said polar organic compound has an energy gap of 3.8 eV-4.5 eV.

12. The organic EL element according to claim 2, wherein said polar organic compound possesses an aromatic skeleton or heterocycle skeleton.

13. The organic EL element of claim 2, further comprising an electron transport layer, a hole transport layer and a hole injection layer.

* * * * *